United States Patent [19]

Yamanobe et al.

[11] Patent Number: 5,155,351

[45] Date of Patent: Oct. 13, 1992

[54] PHOTOELECTRIC TRANSFER DEVICE

[75] Inventors: Masato Yamanobe, Machida; Shigetoshi Sugawa, Atsugi, both of Japan

[73] Assignee: Canon Kabushiki Kaisha, Tokyo, Japan

[21] Appl. No.: 664,625

[22] Filed: Mar. 4, 1991

[30] Foreign Application Priority Data

| Mar. 2, 1990 | [JP] | Japan | 2-49596 |
| Mar. 2, 1990 | [JP] | Japan | 2-49597 |
| Mar. 2, 1990 | [JP] | Japan | 2-49598 |
| Mar. 2, 1990 | [JP] | Japan | 2-49599 |
| Mar. 2, 1990 | [JP] | Japan | 2-49600 |
| Mar. 2, 1990 | [JP] | Japan | 2-49601 |

[51] Int. Cl.$^5$ .................................. H01J 40/14
[52] U.S. Cl. ......................... 250/211 R; 357/30
[58] Field of Search ............ 250/211 R, 211 J; 357/30, 4 SL

[56] References Cited

U.S. PATENT DOCUMENTS

| 3,300,644 | 1/1967 | Zemel et al. | 250/211 R |
| 3,601,610 | 8/1971 | Nakamura | 250/211 R |
| 4,476,477 | 10/1984 | Capasso et al. | 357/30 A |
| 4,565,928 | 1/1986 | Yamamoto et al. | 250/208.3 |
| 4,714,824 | 12/1987 | Terazono | 250/211 R |
| 4,840,916 | 6/1989 | Yasuda et al. | 357/30 A |
| 4,949,144 | 8/1990 | Kuroda et al. | 357/30 |

FOREIGN PATENT DOCUMENTS 63-278269 11/1988 Japan .

OTHER PUBLICATIONS

McIntyre, "Multiplication Noise in Uniform Avalanche Diodes," ED-13. IEEE: Transactions on Electron Devices, (Jan. 1966), pp. 164-168.
Williams, "The Graded Bandgap Multilayer Avalanche Photodiode: A New Low-Noise Detector," EDL-3, IEEE: Electron Device Letters (Mar. 1992) pp. 71-73.
Pearsall, "Zap! Introducing The Zero-Bias Avalanche Photodiode," IEEE: Electron Device Letters (Jun. 1982), pp. 512-514.
Jwo et al., "Amorphous Silicon/Silicon Carbide Superlattice Avalanche Photodiodes", IEEE Trans. on Elec. Dev., vol. 35, No. 8, Aug. 1988 pp. 1279-1283.
Patent Abstracts of Japan, vol. 12, No. 500 (E-699), Dec. 27, 1988 of JPA 63-211686.
Patent Abstracts of Japan, vol. 11, No. 275 (E-537) (2722), Sep. 5, 1987 of JPA 62-73666.

Primary Examiner—Constantine Hannaher
Assistant Examiner—Kiet T. Nguyen
Attorney, Agent, or Firm—Fitzpatrick, Cella, Harper & Scinto

[57] ABSTRACT

A photoelectric transfer device comprises a light-absorbing layer which absorbs incident light to generate carriers a multiplying layer which multiplies the carriers and a light-shielding layer provided between the photoabsorbing layer and the multiplying layer.

31 Claims, 23 Drawing Sheets

ONE PICTURE ELEMENT

PHOTOELECTRIC TRANSFER DEVICE

BACKGROUND OF THE INVENTION

1. Field of the invention

The present invention relates to a photoelectric transfer device, particularly a photoelectric transfer device utilizing the avalanche effect which multiplies photogenerated carriers by collision ionization.

The present invention also pertains to a photoelectric transfer device with low noise which can be preferably employed for sensors for photometry of cameras, image sensors for image reading devices of facsimiles, copying machines, etc., or light receiving sensors of optical communication devices, etc.

2. Related Background Art

In the art of information transmission which uses light as the medium for information signals, for example, image information system, optical communication, other industries, civillian life, etc., a semiconductor light receiving device which transfers an optical signal into an electric signal is one of the constituent elements which is most important and basic, and a large number of devices have been practically applied. Generally speaking, semiconductor light receiving devices are required to have high signal-to-noise ratio for their photoelectric transfer characteristics.

Among them, avalanche photodiode (hereinafter called APD) utilizing the avalanche effect is high in gain and also rapid in response speed, and therefore it is a promising candidate for a semiconductor light receiving device satisfying such demands.

A large number of such APD, presently, have been already frequently applied as the semiconductor light receiving device in optical communication system, with a compound semiconductor such as InGaAs, etc. as the material. Further, progress has been made for improvement of basic performances such as low noise, high speed response, high gain, etc., and application to other fields such as visible light receiving device, etc. has been also desired.

FIG. 1 is a longitudinal sectional view showing the structure of a conventional APD for optical communication.

In the same FIG., 101 is an n+-type InP layer, 102 an n-type InGaAs layer, 103 an n-type InP layer, 104 a p+ InP layer. Here, the n-type InGaAs layer 102, the n-type InP layer 103, the p+-type InP layer 104 are formed in the mesa-form. On the upper surface of the p+-type InP layer 104 is formed a p-electrode 106 with the window 105 being left, and on the back surface of the n+-type InP layer 101 is formed an n-type electrode 107. 108 is a passivation film. Here, when photoirradiation is effected from the window 105 with the p-electrode 106 and the n-electrode 107 being biased in the opposite directions, light is absorbed at the n-type InGaAs layer 102 (which becomes the light-absorbing layer), light-electricity conversion is effected. More specifically, the electron-positive hole pairs formed at the n-type InGaAs layer 102 will each run toward the n-electrode 107 and the p-electrode 106. Since the n-type InP layer 103 (which becomes the multiplying layer) has a strong electrical field, there occurs the avalanche phenomenon of forming a large number of electron-positive hole pairs in the running process of positive holes, thereby creating the multiplying action of forming a plurality of electron-positive hole pairs per one photon. As a result, a signal can be detected even at weak incident light. However, in the structure of the prior art, practical multiplication ratio is small as about 2, and also due to fluctuation inherent in the multiplication process, there have been the two drawbacks that excessive multiplication noise is generated and that the signal-to-noise ratio (S/N ratio) is lowered.

The noise generated in the avalanche multiplication process has been known to be strongly dependent on the ratio $k=\beta/\alpha$ wherein $\alpha$ is the ionization ratio of an electron and $\beta$ is the ionization ratio of a positive hole, as described in the assay of R. J. McIntyre in IEEE Transactions on Electron Devices, 13th Ed. (January, 1966), pp. 164–168.

Here, the ionization ratio of electron refers to a ratio of electron-positive hole pairs formed by collision ionization when electrons are accelerated by an electrical field. The ionization ratio of positive hole refers to a ratio of collision ionization with positive holes. Further, according to this essay, for obtaining an APD with low noise, it has been clarified that k may be small when effecting electron multiplication, while large when effecting positive hole multiplication. More specifically, it is important for obtaining high signal-to-noise ratio in APD to effect avalanche multiplication only of the carriers with a larger ionization ratio with materials with large difference in ionization ratio of the carriers (electrons or positive holes). Also, according to this essay, it is said that the excess noise index F becomes 2 as the limit of noise reduction achieved when only one of the carriers are subjected to avalanche multiplication. In the ideal case where no noise is generated at all, F shall be 1, and therefore the limit of F=2 suggests that there exists still some mechanism which will generate noise. As such mechanism, a conceivable mechanism may be that the places where ionization (reverse Auger generation) which is the elementary process of avalanche multiplication is effected in carrying out avalanche multiplication fluctuate individually, which are in turn integrated to cause fluctuation of the multiplying ratio to occur as a whole.

In view of comprehensive considerations of the facts as mentioned above, for performing avalanche multipilication of generating no noise, it is required that (1) the places for causing ionization which is the elementary process to occur should be specified in the device, and (2) the probability of the ionization at the places where the above-mentioned ionization occurs should be specified. Further, in order to effect avalanche multipilication of a high gain, it is important to approximate the probability of ionization infinitely to 1.

In view of the two drawbacks of small extent of multipilication and lowering in signal-to-noise ratio (SN ratio), for example, F. Capasso et al has proposed a low noise APD available for optical communication system prepared by using primarily a compound semiconductor belonging to the group III-V according to molecular beam epitaxy (MBE), etc. as the APD for optical communication, as disclosed in Japanese Laid-open Patent Application No. 58-157179 or IEEE Electron Device Letters, EDL3 ed. (1982), pp. 71–73.

The device has a specific feature such that, by varying the composition ratio of the constituent materials (e.g. when a compound semiconductor belonging to the III-V group is the constituent material, the composition ratio of the semiconductor of the group III to the semiconductor of the group V), multiple semiconductor layers in which the band gap is continuously varied from the narrower side to the broader side, thereby forming a multi-layer hetero-junction structure which promotes ionization by utilizing the stepwise transition portions of the energy band formed thereby (hereinafter abbreviated as step-back structure). The schematic structure of the device proposed there is described below by referring to FIG. 2 to FIG. 4.

FIG. 2 is a longitudinal sectional view of the device, having step-back structural layers 201, 203, 205, 207 and 209 including 5 layers which become the multiplying layers sandwiched between the p-type semiconductor layer 211 and the n-type semiconductor layer 215 which become light-absorbing layers, with the electrode 213 being in ohmic contact with the p-type semiconductor layer 211, and the electrode 214 with the n-type semiconductor layer 215, respectively.

FIG. 3 is a structural view of the energy band of the band gap inclined layers during no biasing of the device where three band gap inclined layers are shown. Each layer has a composition in which the band gap is varied linearly from the narrow band gap Eg2 to the wide band gap Eg3.

The sizes of step-backs of the conduction band and the valence electron band are shown by $\Delta Ec$ and $\Delta Ev$, respectively. As described below, $\Delta Ec$ is taken greater than $\Delta Ev$ primarily for the reason of making ionization of electrons easier.

FIG. 4 is a structural view of the energy band when a reverse bias voltage is applied on the device. The reaverse bias voltage is not required to be a stronger electrical field as compared with APD shown in FIG. 1 as described above.

Here, when light enters through the p-type semiconductor layer 211, the light absorbed in the p-type semiconductor layer and the respective step-back structural layers is photoelectrically converted similarly as in APD as described above, and the electron-positive hole pairs formed will run toward the n-type semiconductor layer 215 and the p-type semiconductor layer 211. However, the difference from the APD shown in FIG. 1 is that when the energy step difference $\Delta Ec$ of each step-back structure (in the case of electrons, while $\Delta Ev$ in the case of holes) becomes greater than the ionization energy, electrons are ionized to generate electron-positive hole pairs, thereby giving rise to multiplying action. Of course, for each of the step-back structural layers to have the same action, multiplification occurs at $2^n$ for its layer number n. For example, ideally, by making $\Delta Ec \gg \Delta Ev \approx 0$, the ionization ratio of positive holes is suppressed to be much smaller when compared with the ionization ratio of electrons, whereby low noise can be attained as compared with APD as described above.

To describe in more detail, the bias voltage is applied so that at least the step-back structural layers (band-gap inclined layers) 201, 203, 205, 207 and 209 are depleted and an electrical field of such extent that drifting of carriers occurs within the band gap inclined layers but no ionization occurs is generated (drift electric field). The light hv is absorbed in the depleted region next to the p-type semiconductor layer 211, namely the band gap inclined layer 201 to generate electrons in the conduction band and positive holes in the valence electron band, respectively. The electrons generated will be drifted through the layer 201 toward the step-back of the first conduction band. In the step-back, there is already an energy step difference of $\Delta Ec$, and the electrons can compensate the energy necessary for causing ionization to occur with the energy step difference $\Delta Ec$, and therefore the probability of ionization by electrons becomes higher immediately after the step-back. Here, when the energy step difference $\Delta Ec$ is equal to or larger than the ionization energy of electrons, or even if smaller than the ionization energy of electrons, when the energy which is required can be supplied from the drift electric field, the probability of causing ionization to occur immediately after the step-back can be approximated to 1. When ionization occurs, one electron becomes two electrons and one positive hole. Two electrons will be drifted through the band gap inclined layer 203 toward the second step-back, and the same phenomenon is caused to occur in the second step-back. On the other hand, the positive holes generated ahead of within the band gap inclined layer 203 by ionization will be drifted ahead opposite to the electrons until they reach the first step-back. If there were previously present the energy step difference $\Delta Ev$ in the valence electron band of the first step-back to the extent such that the positive holes will not cause ionization to occur, the positive holes drifted will further proceed ideally ahead. If there is a positive energy step difference ahead as seen from the positive holes as shown in FIG. 4, the positive holes will be scattered or accumulated at the step-back, but never cause ionization to occur. Thus, drifting and ionization of electrons, drifting of positive holes occur repeatedly at the respective band gap inclined layers and the step-backs, whereby the number of carriers will be multiplied. Finally, the electrons multiplied by ionization reach the N-type semiconductor layer and are taken out as the electron current from the layer in ohmic contact with the N-type semiconductor layer, while, the positive holes reach the P-type semiconductor layer, and are taken out as the positive hole current from the layer in ohmic contact with the P-type semiconductor layer.

By superposing a large number of semiconductor layers wherein the band gap is continuously varied from the narrower side to the broader side by varying the composition ratio of the constituent materials as described above, and utilizing the step-back formed thereby to form a multi-layer hetero-junction structure for promoting ionization, to specify the places where ionization occurs and approximate the probability of ionization infinitely to 1, whereby an APD with a lower noise can be constituted.

The device structure as described above is a means for realizing an APD with a lower noise, but preparation of the device having such structure will practically encounter various restrictions.

First, for obtaining the device having the step-back structure which can promote ionization only by varying the compositional ratio of the constituent materials, the constituent materials and preparation methods are limited. For example, as the material capable of constituting the device having such structure, there may be included GaSb which is a group III–V compound semiconductor substrate having AlGaAsSb/GaSb grown thereon, an InP substrate having InGaAlAs/InGaAs grown thereon, a GaSb substrate having InGaAsSb-/GaSb grown thereon, and a lattice matched substrate having HgCdTe as a II–VI group compound semiconductor grown thereon, etc.

However, Ga, As, Hg, Cd, etc. used here are strongly toxic, and also rare and expensive elements, thus posing many problems in industrial handling.

All of these have been prepared by the molecular beam epitaxy method (MBE method), but the MBE method requires ultra-vacuum, and also the growth speed of a semiconductor is slow, unsuitable for enlargement of area, whereby bulk production can be done with difficulty. Further, in the MBE method, the growth temperature of a semiconductor is typically as high as 500° C. to 650° C., and preparation of such a light receiving device by lamination on a semiconductor device having already an integrated circuit prepared thereon also has the problem that some damages may be given to the already existing semiconductor device.

Further, for preparation of such an APD with a lower noise, the compositional ratio of these materials must be varied so that ionization is necessarily effected at the step-back, and for that purpose, it becomes necessary to determine the compositional ratio of the materials in view of the electron affinity so as to have a step-back energy step difference $\Delta E$ of about the ionization energy or higher and a lattice matching which will not give rise to a trap level of the hetero-junction interface. As the result, the band gap of the APD which can be practically prepared will be restricted.

For example, first, when the materials initially mentioned are used, according to experiments, in the case of the lattice matched structure, the band gap of the material with the narrowest band gap (GaSb) is 0.73 eV, while the band gap of the material with the broadest band gap ($Al_{1.0}Ga_{0.0}As_{0.08}Sb_{0.92}$) is 1.58 eV, with the maximum band gap difference being 0.72 eV at the conduction band side, 0.13 eV at the valence electron band side, and it has been confirmed that the electron ionization energy is 0.80 eV (GaSb). The deficiency 0.08 eV relative to the ionization energy of electrons at the step-back will be supplied from the drift electrical field of electrons. Whereas, in such a device, leak current (dark current) signal generated when no light is irradiated is liable to occur, which will increase noise components, thus having a great problem that a lower noise can not be ultimately effected. As the causes for generating dark current, there may be included carriers injected from the layer in ohmic contact (external electrode), carriers thermally generated through defective levels, hetero interface levels within the device, etc. In such a device, first, the effect of preventing the injected carriers is consequently drawn out by setting of a P-type semiconductor layer and an N-type semiconductor layer, but neither conscious nor sufficient care has been fully paid on this point, and therefore such effect cannot be said to be satisfactory. The amount of the carriers thermally generated depends on defective level density, interface level density, etc., but it depends essentially on the size of the band gap, and generally speaking, it has been known that the amount of carriers becomes small as the band gap is larger. However, in such a device, there is also the drawback that the minimum band gap is too narrow to inhibit thermally generated carriers. The semiconductor light receiving device having such a band gap may be suitable for receiving a light in the wavelength region from 1.0 $\mu$m to 1.6 $\mu$m, but it can hardly be said to be suitable for devices for receiving light of other wavelength, for example, a visible light receiving device, and its application field is limited.

Next, for example, in the combination of the materials mentioned secondly, in spite of large ionization energy of about 1 eV, the conduction band energy step difference in the step-back is as small as about 0.6 eV, and therefore it is not promising at all.

Other materials as mentioned above also have the same drawbacks as the first material. Particularly, in the combination of materials finally mentioned, for example, according to the essay by T. P. Pearsall described in Electronics Letters, 18th ed., No. 12 (June, 1982), pp. 512–514, a device has been proposed having the minimum band gap of 0.5 eV and the maximum band gap of 1.3 eV by varying the compositional ratio of Hg and Cd, but in such a device, the minimum band gap is very narrow and therefore the device has become susceptible to the dark current thermally generated.

Therefore for effective practical application of an APD with a lower noise having a structure for enlarging the ionization ratio of carriers, it is necessary to consider degree of freedom of choice of materials and preparation method, inhibition of dark current, a band structure having a broad light-receiving wavelength region, etc.

Also, by incidence of light on the above-mentioned step-back structure, carriers may be sometimes generated also within the above-mentioned step-back structure, whereby the multiplying ratio may be sometimes changed depending on the wavelength of the incident light.

Thus, to summarize the technical tasks to be solved for the APD as described above, there may be included the technical tasks in performance and preparation as shown below.

The technical tasks in performance of the device are as follows.

(1) Because the incident light is absorbed in the p-type semiconductor layer and the multiplying layer, the multiplying ratio changes depending on the wavelength of the incident light and the device is therefore not suitable as a reading device.

(2) Because the band gaps of the light-absorbing layer, the multiplying layer are small, dark current during actuation is high and noise is great.

(3) Because the device is intended to be used for optical communication, the material is limited, and the light to which it can correspond is about 800 to 1600 nm, and it cannot correspond to other wavelength light such as visible light.

The technical tasks in preparation of the device are as follows.

(1) For preparation of a step-back structure with a compound semiconductor, the composition modulation is difficult, and the magnitudes of the energy step differences $\Delta Ec$ and $\Delta Ev$ are limited, whereby a lower noise can be effected only limitedly.

(2) Because compound semiconductors belonging to the groups III-V, II-VI, etc., the problems are involved as the industrial material with respect to toxicity, cost, etc. of the materials.

(3) The formation process of the compound semiconductor involves such problems as requiring ultra-high vacuum and film formation at a high temperature (about 500° to 650° C.), difficulty in enlargement of area, etc., thus being unsuitable as the preparation process of a reading device.

SUMMARY OF THE INVENTION

An object of the present invention is to solve the technical tasks of the prior art as described above and also provide a photoelectric transfer device of a novel constitution which is excellent in high speed response characteristic without change in multiplying ratio due to the wavelength of incident light; is stable in multiplying characteristic, has a low noise and a high sensitivity for visible light; and can be easily enlarged in area.

Another object of the present invention is to provide a semiconductor light-receiving device which is a photoelectric transfer device having excellent characteristics over a wide light-receiving wavelength region, particularly the visible light wavelength region, which is suppressed in dark current, particularly an avalanche photodiode with a low noise.

Still another object of the present invention is to provide a photoelectric transfer device with little change in multiplying ratio by penetration of incident light into the multiplying layer which was the cause for characteristic instabilization of the photoelectric transfer device of the prior art by providing a light-absorbing layer independent of the multiplying layer through a light-shielding layer on the multiplying layer.

Still another object of the present invention is to provide a photoelectric transfer device having a multiplying layer capable of multiplying electrons with a step-back structure layer having a great $\Delta Ec$ which is the conduction band energy step difference between the maximum band gap $Eg3$ and the minimum band gap $Eg2$, with a low noise, and also capable of taking a sufficient multiplying ratio.

Still another object of the present invention is to provide a photoelectric transfer device, which can alleviate the problems in lamination of multiplying layers such that not only the multiplying layer with a step-back structure can be formed relatively easily; but also thermal diffusion of atoms with heat, etc can be inhibited to form a relatively sure step-back structure, etc.; because it can be prepared easily according to a film forming method capable of forming a film at a relatively lower temperature, for example, the plasma CVD method, etc. at a low temperature (e.g. 200° to 300° C.) and on a large area substrate, and also the band gap can be controlled easily by composition modulation, etc.

In addition, still another object of the present invention is to provide a photoelectric transfer device increased in degree of freedom of choice of the materials for forming the respective layers, because of having independently a light-absorbing layer for absorbing light to generate photocarriers and a multiplying for multiplying the carriers.

It is also another object of the present invention is to provide a photoelectric transfer device having a high sensitivity to an incident light with desired wavelength, with low noise, which can be easily enlarged in area and can be made thinner.

Still another object of the present invention is to provide a photoelectric transfer device which can respond at a high speed without change of the multiplying ratio due to the wavelength of the incident light even when a thin light-absorbing layer may be employed.

According to the first aspect of the present invention, there is provided a photoelectric transfer device comprising a light-absorbing layer which absorbs incident light to generate carriers and a multiplying layer which multiplies the carriers, characterized by having a light-shielding layer provided between the light-absorbing layer and the multiplying layer.

According to the second aspect of the present invention, there is provided a photoelectric transfer device comprising a light-absorbing layer which absorbs incident light to generate carriers and a multiplying layer which multiplies the carriers, characterized by having a first electrode; a first charge injection preventing layer for preventing injection of unnecessary carriers from the first electrode into the photoelectric transfer device; the multiplying layer; a light-shielding layer for preventing occurrence of change in multiplying ratio by penetration of light into the multiplying layer; the light-absorbing layer; a second charge injection preventing layer for preventing injection of unnecessary carriers from a second electrode into the photoelectric transfer device; and the second electrode which is light-transmissive, in the above mentioned order.

According to the third aspect of the present invention, there is provided a photoelectric transfer device for outputting an electrical signal generated at a plurality of photoelectric transfer portions comprising a plurality of photoelectric transfer portions, each having a light-shielding layer between a light-absorbing layer which absorbs incident light to generate carriers and a multiplying layer which multiplies the carriers, a signal output portion having at least one means selected from accumulation means for accumulating an electrical signal generated at the plurality of photoelectric transfer portions, scanning means for scanning an electrical signal generated at the plurality of photoelectric transfer portions and reading means for reading an electrical signal generated at the plurality of photoelectric transfer portions, wherein the plurality of photoelectric transfer portions are electrically connected to the signal output portion.

DESCRIPTION OF THE PREFERRED EMBODIMENT

Figure 5:
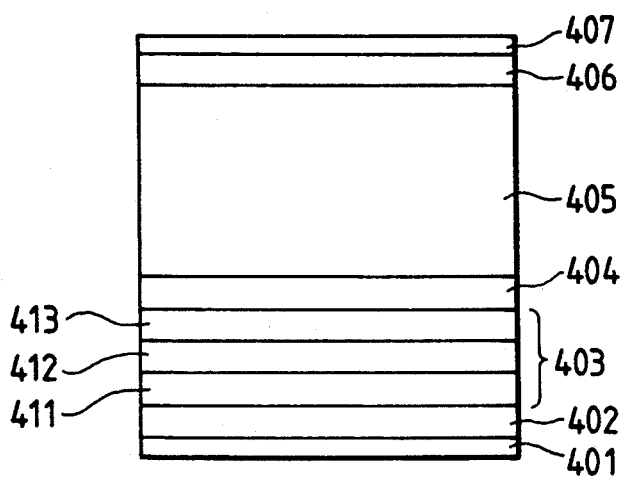
FIG. 5 is a schematic longitudinal sectional view of the photoelectric transfer device of the present invention.
Figure 6:
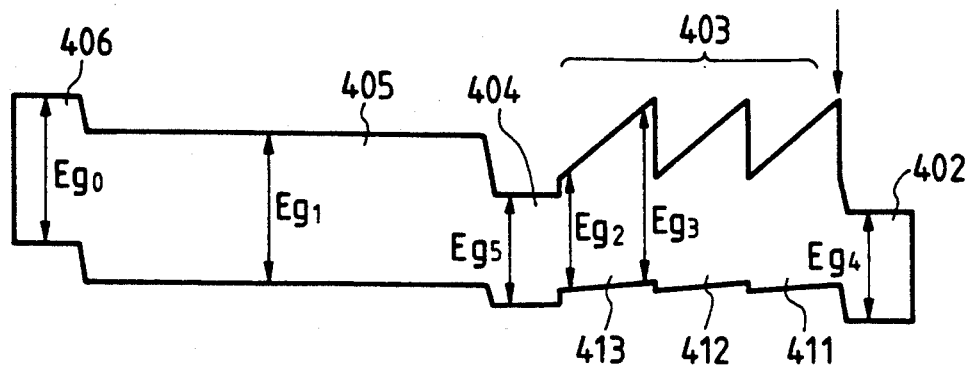
FIG. 6 is a structural illustration of the energy band during no biasing of the photoelectric transfer device of the present invention.
Figure 7:
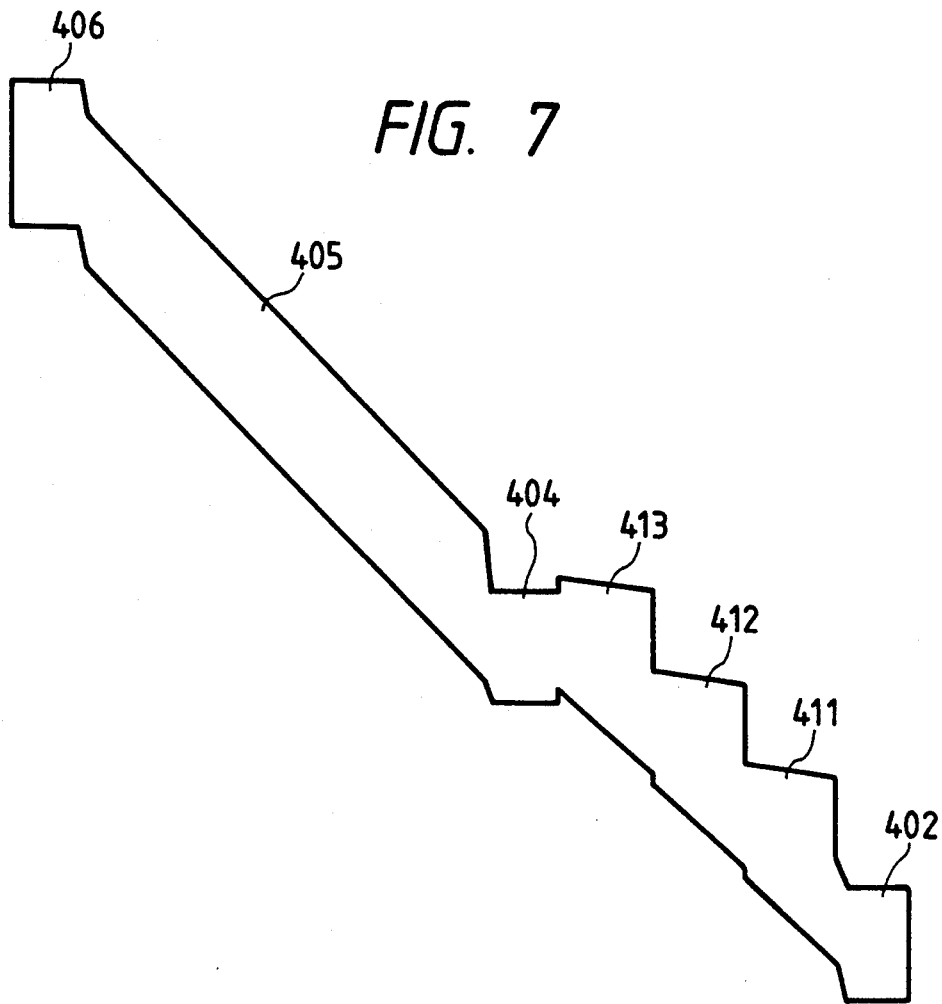
FIG. 7 is a structual illustration of the energy band during bias application of the photoelectric transfer device of the present invention.

Referring now to FIG. 5 to FIG. 7, the structure of the photoconverting device of the present invention and the structure of the energy band are described along with the mode of operation of the present invention.

FIG. 5 is a schematic sectional structural view showing the structure of the photoelectric transfer device of the present invention, where a light-absorbing layer 405 independent of the multiplying layer, a light-shielding layer 404 for preventing incidence of the light transmitted through the light-absorbing layer 405 into the multiplying layer 403, and a plurality of step-back structured layers 411, 412, 413 which become a multiplying layer 403 sandwiched between a p-type semiconductor layer 406 and an n-type semiconductor layer 402 which become the charge injection preventing layer, with the p-type semiconductor layer 406 being electrically connected to the electrode 407, and the n-type semiconductor layer 402 to the electrode 401. The p-type semiconductor layer 406 may be, as a matter of course, a metal which forms a Schottky junction with the adjoining semiconductor layer which can be expected to give the same effect. The step-back structure is shown for three layers, but this is not limitative, but one layer and two or more layers may be available.

FIG. 6 is a schematic illustration of the energy band during no biasing of the above photoelectric transfer device.

FIG. 7 is a schematic illustration of the energy band during reverse bias application of the above photoelectric transfer device.

The actuation principle of the multiplying mechanism called as the avalanche effect is the same as the prior art example proposed by Capasso et al, but the photoelectric transfer device of the present invention has particularly the following actions.

(1) Since a light-shielding layer 404 is provided between the light-absorbing layer 405 independent of the multplying layer 403 and the step-back layers 411 to 413 (multiplying layers 403), there is substantially no light penetration into the multiplying layer provided more remote from the light-absorbing layer as observed from the light incident side, whereby change in multiplying ratio due to light penetration into the multiplying layer is extremely small.

(2) The multiplying layer 403 comprises a non-monocrystalline material, and therefore a step-back structure layer with ΔEc approximate to or greater than the ionization threshold value energy (with great ΔEv in the case of electron multiplying, hole multiplying) can be formed with ease to specify the places where ionization occurs, and also the probability of the ionization can be approximated to 1, whereby low noise and sufficient multiplying ratio can be attained.

(3) As the constituent materials for the light-absorbing layer 405 and the multiplying layer 403 of the photoelectric transfer device to which the present application is applied, a non-monocrystalline material can be used, which is desirable with respect to formation at low temperature and enlargement of area. Here, non-monocrystalline materials are polycrystalline materials or amorphous materials, and as amorphous materials, those of the so-called microcrystalline structure are also included within that category.

Specifically, there may be included amorphous silicon compensated with hydrogen and/or halogen element (hereinafter called a-Si(H,X)), amorphous silicon germanium (hereinafter called a-SiGe(H,X)), amorphous silicon carbide (hereinafter called a-SiC(H,X)) or a polycrystalline silicon, etc. Also, as the amorphous silicon, there may be included amorphous silicons having crystallinity such that the X-ray diffraction image has peaks specified by the respective Miller indices of Si [111] [220] [311] in addition to the halo-pattern.

Thus, since the constituent material of the device is a non-monocrystalline material, it can be easily prepared according to the plasma CVD method, etc. at a low temperature (e.g. 200°–300° C.) and on a large area substate, and since the band gap can be controlled easily by composition change, etc., not only the multiplying layer with a step-back structure can be easily formed, but also diffusion of atoms, by heat, etc. can be inhibited, whereby a relatively sure step-back structure can be made with ease. Thus, the problems in lamination to multiple layers can be diminished.

Particularly, in the charge injection preventing layer, since it can be constituted of a material with relatively broader band gap, and non-monocrystalline material with high doping effect such as amorphous silicon having crystallinity, etc., dark current can be reduced.

(4) Since the degree of freedom of choice of the material forming the light-absorbing layer is great, materials with a large photoabsorption coefficient (e.g. hydrogenated amorphous silicon "a-Si:H") can be used, whereby the thickness of the light-absorbing layer can be made thinner to make the whole device thinner.

(5) Since the degree of freedom of the band gap of the light-absorbing layer is increased for the same reason as in (3), photoelectric transfer devices with a high sensitivity to incident lights with various wavelengths can be constituted. Particularly, by making the band gap $Eg1$ of the light-absorbing layer 405 the band gap corresponding to the visible light, high sensitivity to the visible light can be endowed.

In the following, embodiments of the present invention are described.

LIGHT-ABSORBING LAYER

The light-absorbing layer in the present invention is provided on the side nearer to the light incident side than the multiplying layer and the light-shielding layer and is a layer which generates photocarriers by asorption of incident light.

As the material for the light-absorbing layer, there can be employed non-monocrystalline semiconductor materials, for example, amorphous semiconductor materials such as a-Si (H,X), a-SiGe(H,X), a-SiC(H,X), a-SiGeC(H,X), etc., microcrystalline semiconductor materials such as $\mu c$-Si(H,X), $\mu c$-SiGe(H,X), $\mu c$-SiC(H,X), etc. or polycrystalline semiconductor materials such as poly-Si, poly-SiGe, poly-SiC, etc.

The band gap $Eg1$ of the light-absorbing layer of the present invention, for providing a photoelectric transfer device with high sensitivity to visible light, should preferably be 1.1 eV to 1.8 eV, more preferably 1.2 eV to 1.8 eV. For obtaining also high sensitivity to IR-light in addition to visible light, the band gap $Eg1$ of the light-absorbing layer should be preferably made 0.6 eV to 1.8 eV, more preferably 0.8 eV to 1.2 eV. For obtaining also high sensitivity to UV-light in addition to visible light, the band gap $Eg1$ of the light-absorbing layer 405 should preferably be 1.1 eV to 3.2 eV, more preferably 1.2 eV to 3.0 eV.

In the following, the characteristics demanded for the light-absorbing layer and the findings are described in detail.

The light-absorbing layer 405 should preferably have a band gap and a thickness for photoelectric conversion of the incident light in the wavelength region for photoelectric conversion by absorbing the light incident on the photoelectric transfer device at all or a part of the light-absorbing layer, in order to generate signals faithful to the intensity of the incident light.

Generally, for absorbing a light with a wavelength $\lambda$ or shorter, the semiconductor light-receiving device must have a band gap $Eg$ such that $Eg \leq hc/\lambda = 1240$ nm·eV/$\lambda$[nm] where h is Planck's constant and c is speed of light. On the other hand, generally, the ratio of the light absorbed to the depth t of the light-receiving layer from the light-receiving layer surface (depth 0) to the incident light, namely light absorbance, has been known to be expressed by $1 - \exp(-\alpha t)$ where light absorption coefficient is defined as $\alpha$. From these, generally speaking, for example, when light receiving is to be done for the visible light wavelength region (wavelength about 400 to 700 nm), in order that these lights, particularly almost all of the longer wavelength lights of about 700 nm penetrating to the inner portion of the device may be converted absorbed in the light-receiving region to be photoelectrically converted, the band gap of the light-receiving region of the semiconductor light-receiving device which is the semiconductor light-receiving device is required to be about 1.77 eV or less, and the thickness of the light-receiving region should be desirably $-1/\alpha \cdot \ln(1-p)$ where p is light absorbance desired to be obtained. For example, specifically, in the case when employing a crystalline silicon for the photoabsorbing layer (light-receiving region) of a semiconductor light-receiving element, for absorbing 90% of the incident light with a wavelength of 700 nm at the light-receiving region for photoelectric conversion, it can be found that a thickness of the light-absorbing layer of about 1.15 $\mu$m is necessary when calculating by use of about $2 \times 10^3$ cm$^{-1}$ which is a typical value of the light absorption coefficient experimentally obtained. It is also desirable that a drift electrical field or a diffusion electrical field is generated in the light-absorbing layer, such that the carriers having a larger ionization ratio of the photocarriers (electrons and positive holes) as generated by photoelectric transfer in the light-absorbing layer are transported to the multiplying layer to initiate avalanche multiplying.

The light-absorbing layer which can be used in the present invention may also have the band gap Eg1 thereof varied nonuniformly in the layer thickness direction in order to have a high sensitivity to a light with a desired wavelength and also correspond efficiently to a broader range of wavelength.

For example, for forming a light-absorbing layer having a high sensitivity to the wavelength region from visible light to IR light, for the band gap Eg1 of the light-absorbing layer, a region with Eg1' preferable for obtaining a high sensitivity to visible light and a region with varied band gap from the band gap Eg1" for obtaining a high sensitivity to IR light (Eg1'>Eg1") to the above-mentioned Eg1' may be provided. For forming a light-absorbing layer having a high sensitivity to a wavelength region from visible light to UV light, similarly a region with varied band gap as Eg1'-Eg1''' (Eg1'<Eg1''') may be provided.

Here, the region with varying band gap is desired to be arranged at the edge portion of the above-mentioned light-absorbing layer, and it is preferable that the band gap should be varied continuously within the above-mentioned light-absorbing layer with respect to good running of the carriers.

For absorbing efficiently the incident light to generate carriers, in view of the relationship of the band gap relative to transmittance and absorption of the light, it is desirable that the band gap should be larger on the incident side and smaller on the side opposite to the incident side.

The thickness of the light-absorbing layer may be preferably 200 Å to 10 μm, more preferably 2000 Å to 2 μm for efficiently generating photocarriers by incident light.

LIGHT-SHIELDING LAYER

The light-shielding layer 404 in the present invention is provided as sandwiched between the photoabsorbing layer 405 and the multiplying layer 403, and even if a part of the incident light may be transmitted through the light-absorbing layer 405, it will prevent incidence of the light into the multiplying layer.

By prevention of incidence of the light into the multiplying layer 403, generation of photocarriers in the multiplying layer 403 can be prevented. Particularly, of the wavelength components of the incident light, longer wavelength light with large tansmission depth such as IR light, etc. can be absorbed in the vicinity of the minimum band gap portion of the step-back layer to prevent variance in multiplying ratio. Further, without limitation of the causes for generation of the variance in multiplying ratio, materials with narrow band gap are applicable for the material of the multiplying layer, whereby the degree of freedom of material choice can be expanded.

As the material which can be used for the light-shielding layer 404 of the present invention, any material may be employed which does not interfere with movement of the photocarriers generated in the light-absorbing layer 405 and prevents penetration of the light into the multiplying layer. As such material, there may be included materials which are electrically conductive or semiconductive, and have light-reflecting characteristic (a high light reflectance) or light absorbing characteristic (a high light absorbance).

As the material constituting the light-shielding layer, for example, there may be preferably employed metallic materials having such work function as to smoothly perform transportation of electrons from the light-absorbing layer to the multiplying layer and transportation of positive holes from the multiplying layer to the light-absorbing layer, such as Cr, Mg, Al, Ti, Mn, Fe, Cu, Zn, Mo, Ag, Cd, In, Sn, W and alloys thereof.

Figure 1:
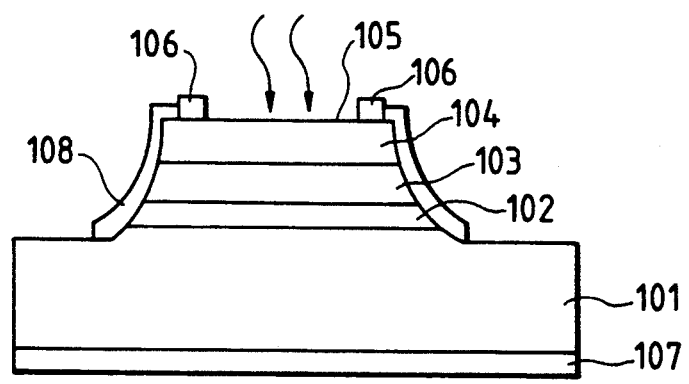
FIG. 1 is a schematic sectional view showing the structure of an avalanche photodiode (APD) for optical communication of the prior art.
Figure 2:
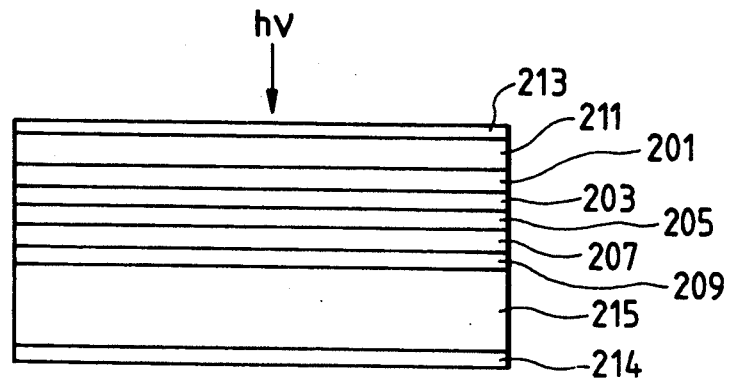
FIG. 2 is a schematic sectional view showing the structure of APD having a step-back structure of the prior art.
Figure 3:
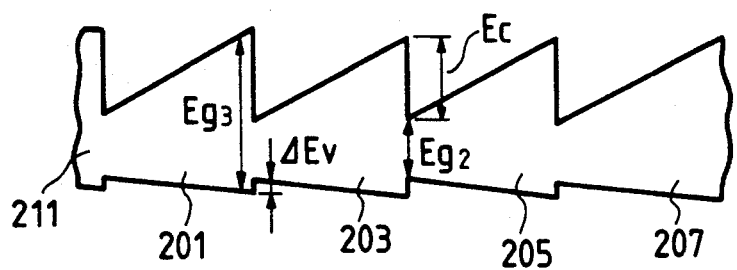
FIG. 3 is a structural illustration of the energy band of the band gap inclined layer during no biasing of APD of the prior art.
Figure 4:
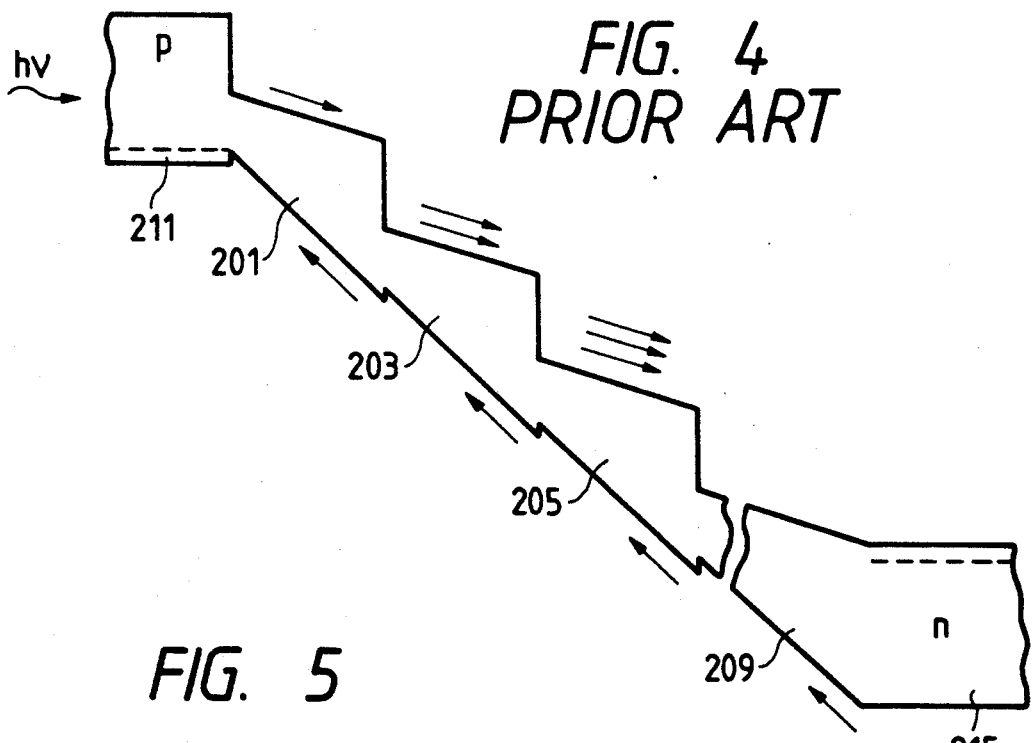
FIG. 4 is a structural illustration of the energy band of the band gap inclined layer during application of reverse bias of APD of the prior art.
Figure 8:
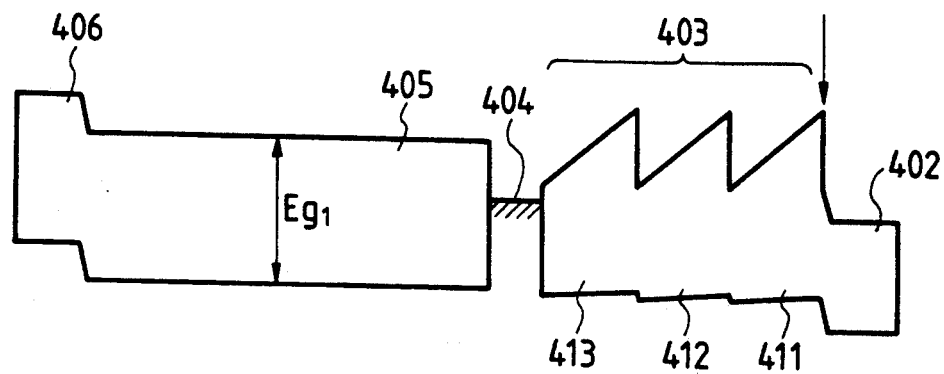
FIG. 8 is a structural illustration of the energy band during no biasing of the photoelectric transfer device of the present invention.
Figure 9:
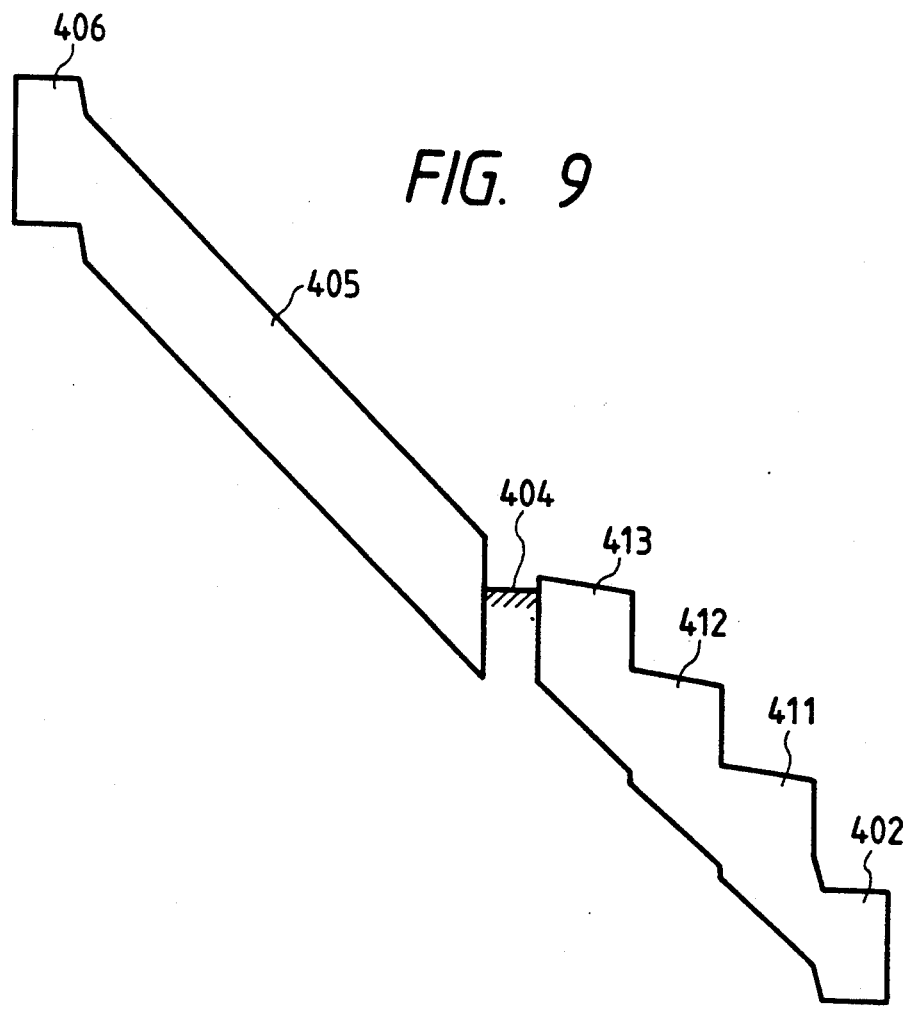
FIG. 9 is a structual illustration of the energy band during bias application of the photoelectric transfer device of the present invention.

The energy band when forming the light-shielding layer with the above-mentioned metallic material will be as shown in FIG. 8 (no biasing) and FIG. 9 (reverse bias application), as different from the types shown in FIG. 3 and FIG. 4.

As examples of other materials which can be used for the light-shielding layer, there may be included semiconductor materials with energy of the energy gap (band gap) narrower than incident light energy. Such semiconductor materials may be either P-type or N-type. Examples of such material may include Si type semiconductors doped with an impurity (amorphous or crystalline Si, SiN, SiC, SiGe, SiSn, etc.) and the group III-V, the group II-VI compound semiconductors (InP, GaAs), etc.

As the impurity to be doped in the semiconductor layer used as the light-shielding layer, there may be preferably employed the group III atoms such as B, Al, In, Tl, etc., the group V atoms such as P, As, Sb, Bi, etc., the group I atoms such as Li, Na, K, etc., the group II atoms such as Mg, Ca, etc. and the group IV atoms such as Si, Ge, etc.

When doping the semiconductor to be used as the light-shielding layer with impurities, it is desirable for prevention of penetration of the light transmitting through the light absorbing layer into the multiplying layer to make the impurity concentration $1.0 \times 10^{15}$ atoms/cm$^3$ to $1.0 \times 10^{21}$ atoms/cm$^3$, preferably $1.0 \times 10^{16}$ atoms/cm$^3$ to $1.0 \times 10^{17}$ atoms/cm$^3$.

Other materials which can preferably be employed as the light-shielding material include electroconductive ceramic materials and electroconductive organic compounds such as high temperature super conducting materials graphite, etc.

The light-shielding layer may be also formed by further laminating a reflecting layer for reflecting the light transmitting through the light-absorbing layer to the photoabsorbing layer side on the layer comprising the material as exemplified above as useful materials for the light-shielding layer. As the material of the reflecting layer, there may be employed desirably materials with high mobility of carriers, high refractive index, for example, materials with greater refractive index than the light-absorbing layer, etc. as preferable materials.

The thickness of the light-shielding layer is demanded to be enough to prevent generation of the carriers causing change in multiplying ratio by absorption of the light transmitted through the light-absorbing layer in the multiplying layer, but if the light-shielding layer is too thick, running of the carriers (mobility) will be lowered. The light-shielding layer of the present invention should preferably have a thickness of 50 Å to 10 μm, more preferably 1 μm or less.

When the above-mentioned reflecting layer is provided, the apparent optical pathway length of the light transmitting the light-absorbing layer becomes long, and therefore thinner light-absorbing layer can be employed to reduce further the thickness of the photoelectric transfer device.

MULTIPLYING LAYER

The multiplying layer in the present invention is a layer provided on the side more remote than the above-described light-absorbing layer and the light-shielding layer as seen from the light incident side, and it is a layer for multiplying the photocarriers by the so called avalanche effect when the carriers generated in the light-absorbing layer are transported thereinto.

The multiplying layer in the present invention has a region for drifting the carriers and a region for effecting ionization. For example, it may have a structure having a layer with a higher dielectric constant and a layer with a lower dielectric constant laminated, or a step-back structure with the band gap being continuously varied from the minimum band gap Eg2 to the maximum band gap Eg3.

In either case, the place for effecting ionization in the multiplying layer can be specified, generation of noise due to fluctuation of the place where ionization occurs can be suppressed.

First, the multiplying layer formed by lamination of layers with different dielectric constants is described.

The constitution of the above multiplying layer formed by lamination of the layers with different dielectric constant may have basically the material with a larger dielectric constant and the material with a smaller dielectric constant arranged alternately, and as an example, with the use of an alloy material which is one of multi-component type materials, by varying its composition ratio, a layer with a larger dielectric constant and a layer with a lower dielectric constant may be formed.

For example, by use of an amorphous silicon nitride $Si_zN_{1-z}$ (z is composition ratio), by arranging alternately an $Si_xN_{1-x}$ (x is larger than 0.5) as the layer with a larger dielectric constant and an $Si_yN_{1-y}$ layer (y is smaller than 0.5), an avalanche region may be constituted.

Such an avalanche region, other than the above-mentioned amorphous silicon nitride, can be also constituted of, for example, amorphous silicon carbide $Si_zC_{1-z}$, amorphous silicon germanium $Si_zGe_{1-z}$, etc.

As the method for preparing the photoelectric transfer device of the present invention, generally the deposition methods are easy, and the deposition methods by gas phase growth such as vapor deposition, chemical vapor deposition (CVD), gas phase epitaxy, sputtering, molecular beam epitaxy, etc. can be utilized. Other than such deposition methods, the ion injection method, etc. may be used. Shortly speaking, for formation of a layer with a small dielectric constant, ion injection such as implantation of hydrogen, carbon, nitrogen into silicon, hydrogen implantation into gallium-arsenic, etc. is also useful.

As the material which can easily form a layer with varied dielectric constants and band gaps by varying its composition, amorphous materials, the group III-V compound semiconductor materials, etc. may be employed.

Particularly, concerning amorphous materials, it is preferable to prepare the device according to the glow discharge method. However, in preparing the device having the structure of the present invention, there are such specific features that the preparation temperature is low, that it can be prepared by also laminating on a semiconductor device having an integrated circuit, etc. formed thereon, that materials can be widely chosen without so much regard to lattice matching to have high degree of freedom, that the composition varied layer can be easily formed only by varying the flow rate of starting gases, that the device has a high sensitivity to the light in the visible light region, that materials causing no pollution and also industrially inexpensive can be utilized, that film formation with large area can be easily done, etc., and therefore, by utilizing this, all of the problems of the prior art can be solved.

In amorphous materials, as further specific examples, silicon of the tetrahedral type, selenium of the chalcogenide type can be utilized as the base material, and silicon oxides, silicon nitrides, silicon oxide nitride, silicon carbide, etc. as the material for the layers with different dielectric constants or the layer having varied band gap. In this case, for forming a bang gap varied layer with reduced localized level within the band gap, the band gap varying atom which acts as band gap controller may be contained generally in an amount of 0.01% or more, preferably 1 atomic % to 60 atomic %, more preferably 5 atomic % to 35 atomic %.

Particularly, when the glow discharge method is utilized for the preparation with the use of silicon atoms as the base material, useful gaseous starting substances are chain silane compounds such as $SiH_4$, $SiF_4$, $Si_2H_6$, $Si_2F_6$, $Si_3H_8$, $SiH_3F$, $Si_2F_2$, etc. or cyclic silane compounds such as $Si_5H_{10}$, $Si_6H_{12}$, $Si_4H_8$, etc., while useful starting gases for preparation of layers with different dielectric constants or a layer with varied band gap are carbon compounds such as $CH_4$, $CH_2F_2$, $C_2H_6$, $C_2H_4$, $C_2H_2$, $Si(CH_3)_4$, $SiH(CH_3)_3$, etc., nitrogen compounds such as $N_2$, $NH_3$, $H_2NNH_2$, $HN_3NH_4N_3$, $F_3N$, $F_4N$, etc., oxygen compounds such as $O_2$, $CO_2$, NO, $NO_2$, $N_2O$, $O_3$, $N_2O_3$, $N_2O_4$, $NO_3$, etc., germanium compounds such as $GeH_4$, $GeF_4$, etc., tin compounds such as $SnH_4$, etc.

As the film forming conditions, the range of the conditions well known in the art in performing film formation of the a-Si type can be used. For example, the substrate temperature may be 50° to 600° C., preferably 150° to 400° C., the discharge pressure 0.01 to 10 Torr, preferably 0.1 to 1 Torr, the high frequency power 0.01 to 10 W/cm$^2$, preferably 0.1 to 1 W/cm$^2$. As the discharge frequency, DC, AC, particularly frequently used microwave of 13.56 MHz or 2.45 GHz, can be used.

Further, the atom to be used as the doping material of the avalanche region (multiplying layer) and the blocking layer (charge injection preventing layer), the atoms of the group III and the group V are useful for silicon. Specifically, there can be included, as the group III atom, boron (B), aluminum (Al), gallium (Ga), indium (In), thallium (Tl), etc., particularly preferably B and Ga. As the group V, phosphorus (P), arsenic (As), antimony (Sb), bismuth (Bi), etc. can be included, particularly preferably P, As and Sb. The content of such atoms may be preferably 5% or less, more preferably 1% or less.

Figure 10:
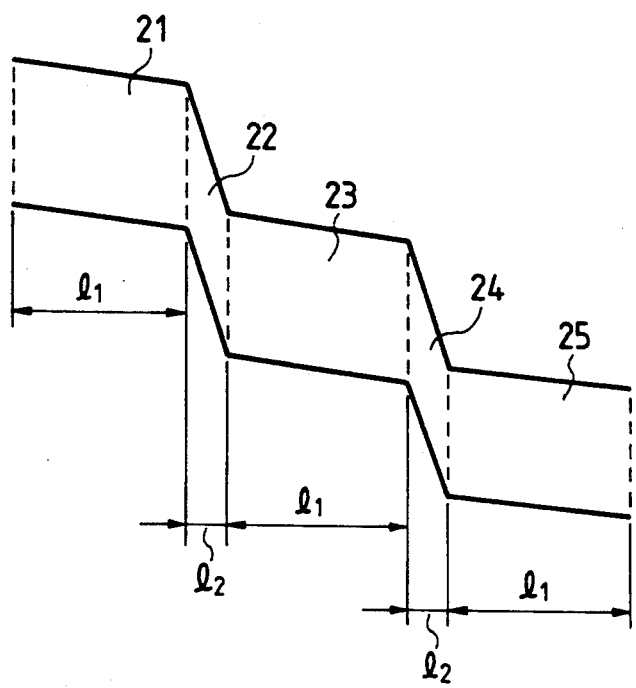
FIG. 10 is a diagram for illustration of the energy state of the multiplying layer.

As described above, by the first layers 21, 23, 25 with lower dielectric constants where an electric field is generated so as not to effect ionization of carriers with a multiplying layer having the energy band as shown in FIG. 10 during application of a bias voltage, and the second layers 22, 24 with higher dielectric constants where an electric field is generated so as to promote ionization of carriers, the places where ionization occurs can be specified. Therefore, an APD with low noise which can approximate the probability of ionization unlimitedly to 1 can be realized.

Figure 11:
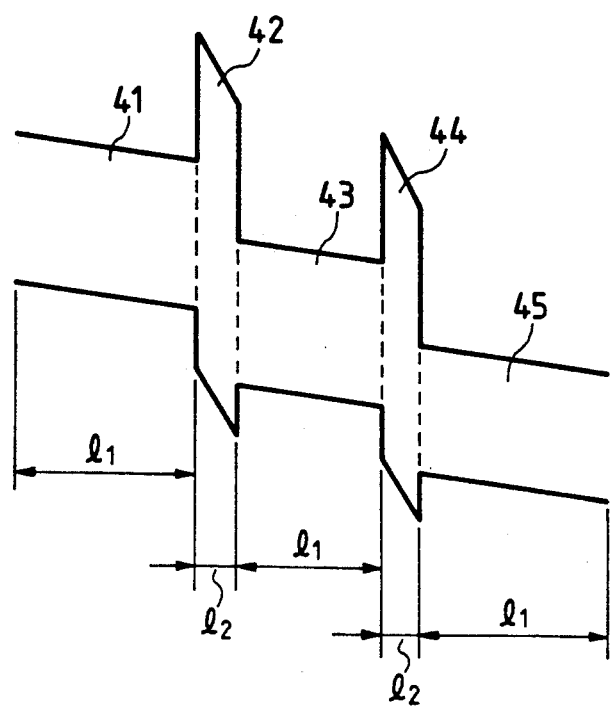
FIG. 11 is a diagram for illustration of the energy state of the multiplying layer.

Also, the multiplying layer having the energy band during bias application as shown in FIG. 11 is also included as the multiplying layer of the photoelectric transfer device of the present invention. More specifically, a multiplying layer having the first layers 41, 43, 45 having lower dielectric constants and the second layers having higher dielectric constants alternately laminated, with the first layer and the second layer having different band gaps can be also preferably employed.

Here, the layer thickness $l_1$ of the first layer with a smaller dielectric constant should be made preferably 20 Å to 2000 Å, more preferably 50 Å to 200 Å.

On the other hand, the layer thickness $l_2$ of the second layer with a large dielectric constant should be made preferably 30 Å to 3000 Å, more preferably 75 Å to 300 Å. The ratio of the thicknesses of the first layer and the second layer should be preferably 1.5-fold or more, more preferably 2-fold or more.

Subsequently, description is made about the multiplying layer with a step-back structure in which the band gap is continuously varied between the minimum band gap Eg2 and the maximum band gap Eg3.

The multiplying layer has at least one step-back structure in which the band gap as mentioned above is continuously varied. Here, the number of the step-back structures may be determined depending on the desired multiplying ratio.

For formation of a layer with a step-back structure in which the band gap is continuously varied (step-back layer), the composition of the main atoms for forming the step-back layer may be varied.

For example, by varying the contents of the atoms of the group III and the group V in a III–V group compound semiconductor, the band gaps can be varied.

As another example, in the case of an amorphous silicon alloy type material, for example, atoms functioning as band gap controller such as germanium atoms or carbon atoms, etc. may be incorporated and their contents may be varied.

For specifying the place where ionization occurs, the difference between the maximum band gap Eg3 and the minimum band gap Eg2 should be desirably large enough to effect ionization such that the step-back shown by the energy band chart have a steeply changed structure. However, even if the step-back may be somewhat gentle, it can be used as the multiplying layer of the present application. When the above-mentioned step-back is gentle, the width of the layer region in which such gentle change occurs (layer thickness) should be desirably within the mean free path of electrons in the material of the layer region. Specifically, it should be preferably 100 Å or less, more preferably 50 Å or less.

The layer thickness of the above step-back layer may be within the range where the carriers can run without recombination, preferably 50 Å to 1 μm, more preferably 200 Å to 1000 Å.

In the present invention, for making higher the freedom of degree of choice of the material for forming the multiplying layer, the Fermi level may be also shifted by providing a high concentration impurity layer containing an impurity for controlling the conductivity at a high concentration sandwiched between the step-back layers (inclined band gap layers) having step-back structures.

The high concentration impurity layer may be either of a single layer constitution or a multi-layer constitution, or alternatively contain an impurity nonuniformly in the layer thickness direction.

When the impurity is to be contained nonuniformly in the layer, by varying continuously the impurity concentration within the inclined band gap layer from the high concentration impurity layer side toward the center, in the step-back portion obtained by junction between the inclined band gap layers, the energy step difference of the band, even when it may be insufficient for the ionization energy of carriers, will supply the shortage of energy, thereby insuring ionization of the carriers at the step-back portion to inhibit fluctuation at the place where ionization occurs to enable lower noise.

If more bias than is necessary for drifting of the carriers is applied in the sloped band gap layer, ionization is surely effected at the step-back portion, whereby there is no change in multiplying ratio to bias change, temperature change. For this reason, accumulation actuation of carriers to read the optical signal carriers by accumulation on one end side of the photoelectric transfer device is possible as the driving method of the photoelectric transfer device. There is also no need of temperature compensation of the multiplying ratio.

Also, since the photoelectric transfer device with low noise can be prepared by use of a material which cannot obtain the energy necessary for ionization of carries only by the energy of the band step difference formed by the electron affinity difference, the degree of freedom of choice of material can be broadened.

The material to be used in the present invention should be desirably a material which can be varied in its composition to form a inclined band gap layer. The material for the high concentration impurity layer must be a material in which impurities can be added, because the effect of band profile which varies the energy in shortage to the ionization energy of the carriers of the energy step difference of the band obtained by junction between the inclined band gap layers by addition of impurities is utilized. As the material satisfying such conditions, non-monocrystalline semiconductor materials such as amorphous or polycrystalline materials are preferred, as exemplified by hydrogenated amorphous silicon (a-Si:H) type alloys, and the III–V group or II–VI group compound semiconductor materials. In amorphous silicon type alloys, there are a-SiGe:H, a-SiC:H, a-SiN:H, a-SiSn:H, a-SiO:H, and a-GeC:H, etc., while in the group III–V, Al.Ga.As.Sb, In.As.Sb, In.-Ga.As.Sb, In.Ga.Al.As, In.As.P.Sb, In.Ga.As.Sb or Al.Ga.P, and in the group II–VI, Zn.S.Se, Zn.Cd.S, Hg.Cd.Te, etc. are utilized.

In the above-mentioned amorphous silicon type alloy material, in addition to hydrogen, halogen atoms such as F, Cl, Br, I, etc. may be also contained.

As the impurities in the high concentration impurity layer or the inclined band gap layer, there may be included those as shown below. For the amorphous silicon type alloy, the group III atoms of the periodic table may be employed for the P-type control, and the group V atoms of the periodic table for the N-type control.

Specifically, as the group III atoms, there can be included B (boron), Al (aluminum), Ga (gallium), In (indium), Tl (thallium), etc., particularly preferably B and Ga. As the group V atoms, P (phosphorus), As (arsenic), Sb (antimony), Bi (bismuh), etc. can be included, particularly preferably P and Sb.

As the high concentration impurity layer, in the case of effecting ionization of electrons as in the amorphous silicon type alloy, the wide band gap side is made the p-type and the narrow band gap side n-type, while in the case of effecting ionization of positive holes, the wide band gap side is made the n-type and the narrow band gap side the p-type.

The composition of the high concentration impurity layer, when existing on the wide gap side of the inclined band gap layer, is required to be determined so that the band gap may not be smaller than the band gap at the wide band gap end of the inclined band gap layer, while when existing on the narrow gap side of the inclined band gap layer, must be determined so that the band gap may not be greater than the narrow band gap end of the inclined band gap layer.

As for the distribution of the composition of the high concentration impurity layer, when the band gap becomes smaller from the step-back portion toward the wide gap end of the inclined band gap layer on the wide band gap wide, the inclination of the energy band becomes gentle, while when it becomes greater, in the step-back portion, the electron affinity difference on the conduction band side, and the sum of the electron affinity difference and the band gap difference on the valence electron band side cannot be utilized at the maximum value. On the other hand, on the narrow band gap side, when the band gap becomes greater from the step-back portion toward the narrow band gap end of the inclined band gap layer, the inclination of energy band becomes gently, while when it becomes smaller, in the step-back portion, the electron affinity difference on the conduction band side, and the sum of the electron affinity difference and the band gap difference on the valence electron band side cannot be utilized at the maximum value. For this reason, it is preferable that the high concentration impurity layer should have a uniform composition so as to make the band gap uniform.

As for the impurity concentration distribution in the high concentration impurity layer, in the case when it is distributed nonuniformly as compared with the case when having a uniform concentration distribution, the maximum impurity concentration necessary for obtaining equal effect becomes greater. Thus, in view of the addition limit of the impurities, the degree of freedom of choice of the material may be sometimes narrowed, and therefore substantially uniform distribution is desirable.

The layer thickness of the high concentration impurity layer, when having high concentration impurity containing layers on the both ends of the inclined band gap layer, is determined so that the sum $d_1+d_2$ of the layer thicknesses of the high concentration impurity containing layers, or when having a high concentration impurity layer only on one end, its layer thickness $d$ may be the mean free path of the carriers or less.

The impurity concentration of the high concentration impurity layer is determined so that voltage applied when the high concentration impurity layer is completely depleted may be greater than the energy corresponding to the shortage relative to the ionization energy of the carriers at the step-back portion. That is, depending on the case of providing multiple layers of high concentration impurity layers between the inclined band gap layers and the case of providing a single layer, they are determined as follows:

(1) When two of high concentration impurity layers are provided between inclined band gap layers, the combination of $N_1$, $N_2$ becomes so as to satisfy the following formulae:

$$\frac{q(\epsilon_1 N_1 + \epsilon_2 N_2)}{2\epsilon_1\epsilon_2}\left(\frac{N_1}{N_2}d_1^2 + \frac{N_2}{N_1}d_2^2\right) > V_D$$

$$V_D = \frac{E_{ion} - (\chi_2 - \chi_1)}{q}$$

In the above formulae, the suffixes 1 and 2 correspond respectively to the wide band gap, the narrow band gap, and $\epsilon_1$ and $\epsilon_2$ are dielectric constants of high concentration impurity layers, $N_1$ and $N_2$ impurity concentrations of the high concentration impurity layers, $\chi_1$ and $\chi_2$ are electron affinities of the high concentration impurity layers, $E_{ion}$ is the ionization energy of carriers, $d_1$ and $d_2$ are film thicknesses of the high concentration impurity layers as determined above. However, the above formula is in the case of electron current, and in the case of positive hole current, the following formula is applied:

$$V_D = \frac{E_{ion} - (\chi_2 - \chi_1) - (E_{g1} - E_{g2})}{q}$$

$E_{g1}$ and $E_{g2}$ are band gaps of the high concentration impurity layers.

(2) In the case when the high concentration impurity layer is provided as a single layer between the inclined band gap layers, it is determined by the following formulae:

$$N > \frac{2\epsilon V_D}{q \cdot d^2} \quad V_D = \frac{E_{ion} - (\chi_2 - \chi_1)}{q}$$

In the above formulae, $\epsilon$ is the dielectric constant of the high concentration impurity layer, $N$ the impurity concentration of the high concentration impurity layer, $d$ the film thickness of the high concentration impurity layer as determined above. However, the above formula is in the case of electron current, and in the case of positive hole current, the following formula is applied:

$$V_D = \frac{E_{ion} - (\chi_2 - \chi_1) - (E_{g1} - E_{g2})}{q}$$

Here, the impurity concentration distribution within the high concentration impurity layer is made uniform.

As for the profile of the impurity concentration within the inclined band gap layer, when having different types of high concentration impurity layers on the both ends of the inclined band gap layers, the impurity concentration is continuously decreased from the both ends toward the center, while when having a high concentration impurity layer at only one end, the impurity concentration is reduced continuously from the one end toward the center. The function of change in impurity concentration is not particularly limited, but it is desirable that the change should be gentle on the high concentration side and steep on the low concentration side.

Here, by referring to an example of the amorphous silicon type alloy, specific materials and numerical values are described.

As the material, for example, by varying the composition in an alloy of Si, Ge and C, the band gap can be varied from 1.1 eV to about 2.5 eV. However, as the region without practical problem, the inclined band gap layer can be considered to be formed within the range from 1.2 eV to 2.2 eV. These materials have band gaps equal to or greater than 1.1 eV of the crystalline silicon, and the composition ratios for obtaining the minimum band gap for effecting dark current reduction of 1.2 eV, and the maximum of 2.2 eV are respectively Ge/Si≈9, C/Si≈1.5, and the flow rate ratio of preparation gases will be substantially the same value.

When a-SiGe:H having a band gap of 1.2 eV and a-SiC:H having a band gap of 2.2 eV are compared under the state with no addition of impurity, the step difference $\Delta Ec$ ($|\chi_1/-|\chi_2$) of the band on the conduction band side is 0.9 eV, and the energy step difference $\Delta Ev$ on the valence electron band side 0.1 eV. The band step difference on the conduction band side where electrons with large ionization coefficient are transported is insufficient for causing surely ionization to occur at the step-back portion even if a repeated structure of inclined band gap layers may be prepared, because about 0.3 eV is deficient to 1.2 eV of the ionization energy, and therefore it can be well expected that fluctuation of the place for ionization will occur when a high electrical field is applied.

For this reason, for insuring ionization at the step-back portion, it is desirable to arrange a high concentration impurity containing layer at one end of the inclined band gap layer. The distribution of impurity in the impurity containing layer should be desirably such that the impurity concentration is decreased toward the center of the inclined band gap layer. For example, if the high concentration impurity layer is on the a-SiC:H side which is a wide gap material of the inclined band gap, B of the P-type impurity is added for shifting the energy band toward the high energy side.

In the amorphous silicon type alloy, the mean free path $\lambda$ of electrons within the impurity layer is typically 50 Å to 100 Å, and therefore the film thickness of the high concentration impurity layer is made, for example, 50 Å which is not greater than the value of $\lambda$.

The insufficiency of energy necessary for ionization $E_{ion}-(\chi_2-\chi_1)$ is 0.3 eV in this example, and therefore the width of the depletion layer as expanded when a voltage of 0.3 eV is applied may be not greater than the mean free path. Practically, the voltage applied when the high concentration impurity layer is completely depleted may be 0.3 V or more. Specific dielectric constant is about 6, but may be as follows:

$$N > \frac{2\epsilon V_D}{q \cdot d^2} = 8.0 \times 10^{18} (cm^{-3})$$

For realizing an impurity concentration of $8.0 \times 10^{18}$, 0.3 to 0.4% of $B_2H_6$ may be added based on the starting gases of $SiH_4$ and $CH_4$.

On the other hand, when a high concentration impurity layer is arranged on the a-SiGe:H side, an N-type impurity P is added.

The layer thickness of the high concentration impurity layer is made 50 Å. Specific dielectric constant is about 16.

The impurity concentration may be as follows:

$$N > 2.1 \times 10^{19} (cm^{-3}).$$

For realizing an impurity concentration of $2.1 \times 10^{19}$, 0.8 to 1.0% of $PH_3$ may be added based on $SiH_4$ and $GeH_4$.

Next, the case when a p-type high concentration impurity layer exists on the a-SiC:H side and a n-type high concentration impurity layer on the a-SiGe:H side is considered.

The film thickness of the high concentration impurity layer is each made 25 Å. When impurities of the same concentration are to be added, $$V_{D1} = \frac{q \cdot N(\epsilon_1 N + \epsilon_2 N)}{2\epsilon_1 \cdot \epsilon_2 N} d_1^2$$
$$= 1.3 \times 10^{-20} \times N$$

$$V_{D2} = \frac{q \cdot N(\epsilon_1 N + \epsilon_2 N)}{2\epsilon_1 \cdot \epsilon_2 N} d_2^2$$
$$= 1.3 \times 10^{-20} \times N$$

That is, $V_D = V_{D1} + V_{D2} = 2.6 \times 10^{-20} \times N > 0.3$ V and the impurity concentration may be $1.2 \times 10^{19}$ or higher. For realizing the impurity concentration, 0.5 to 0.6% or more of $B_2H_6$ and $PH_3$ may be added to $SiH_4$ and $CH_4$, and $SiH_4$ and $GeH_4$, respectively, in introducing the gases during film formation.

Having described about the high concentration impurity layer which can be preferably used in the present invention by referring to the amorphous silicon type alloy as an example, the high concentration impurity layer which can be used in the present invention is not limited to the example as described above.

In the following, the action and the effect when a high concentration impurity layer is provided between band gap inclined layers is described in more detail by referring to the drawings.

Figure 12:
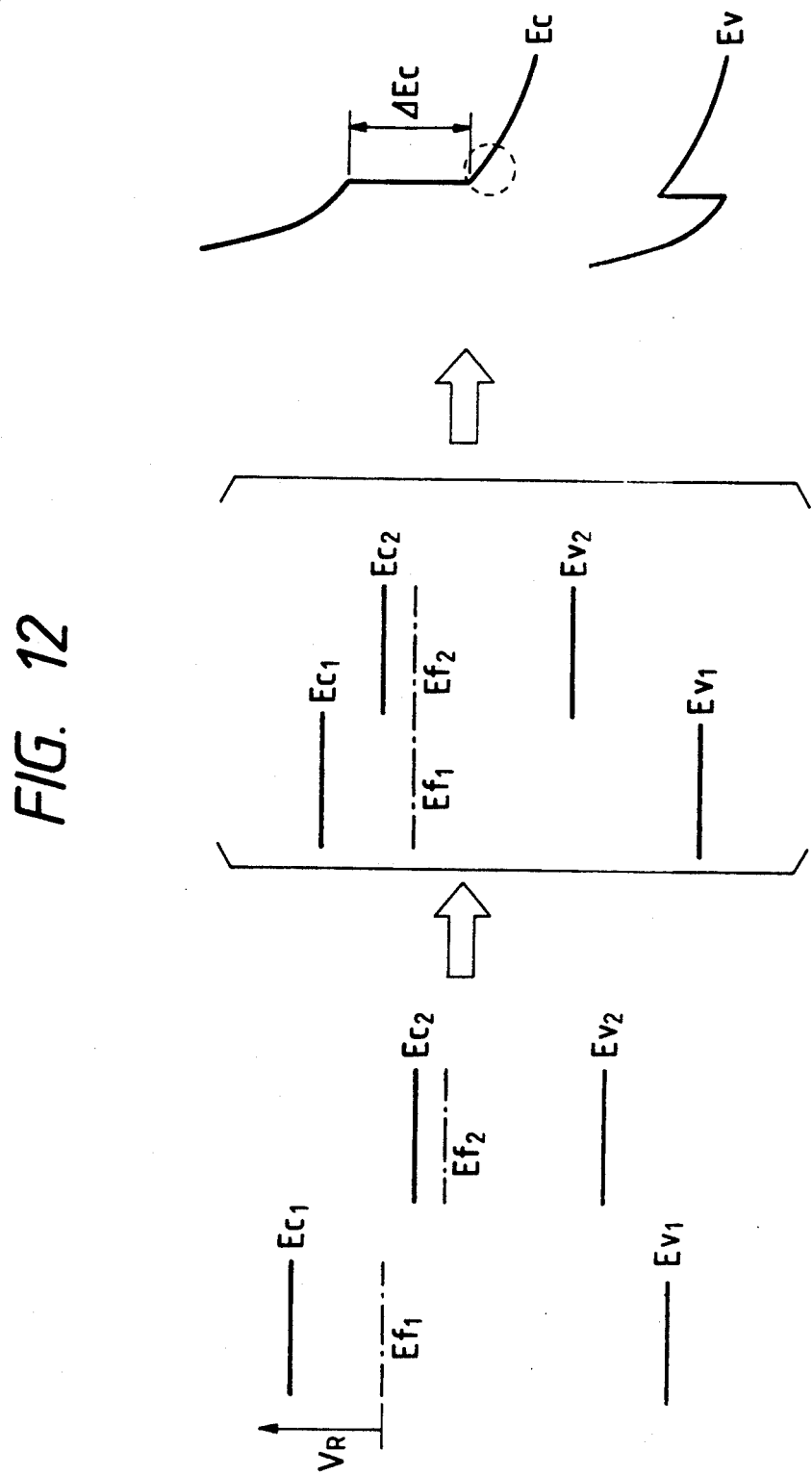
FIG. 12 is a diagram for illustration of the energy state of the multiplying layer.
Figure 13:
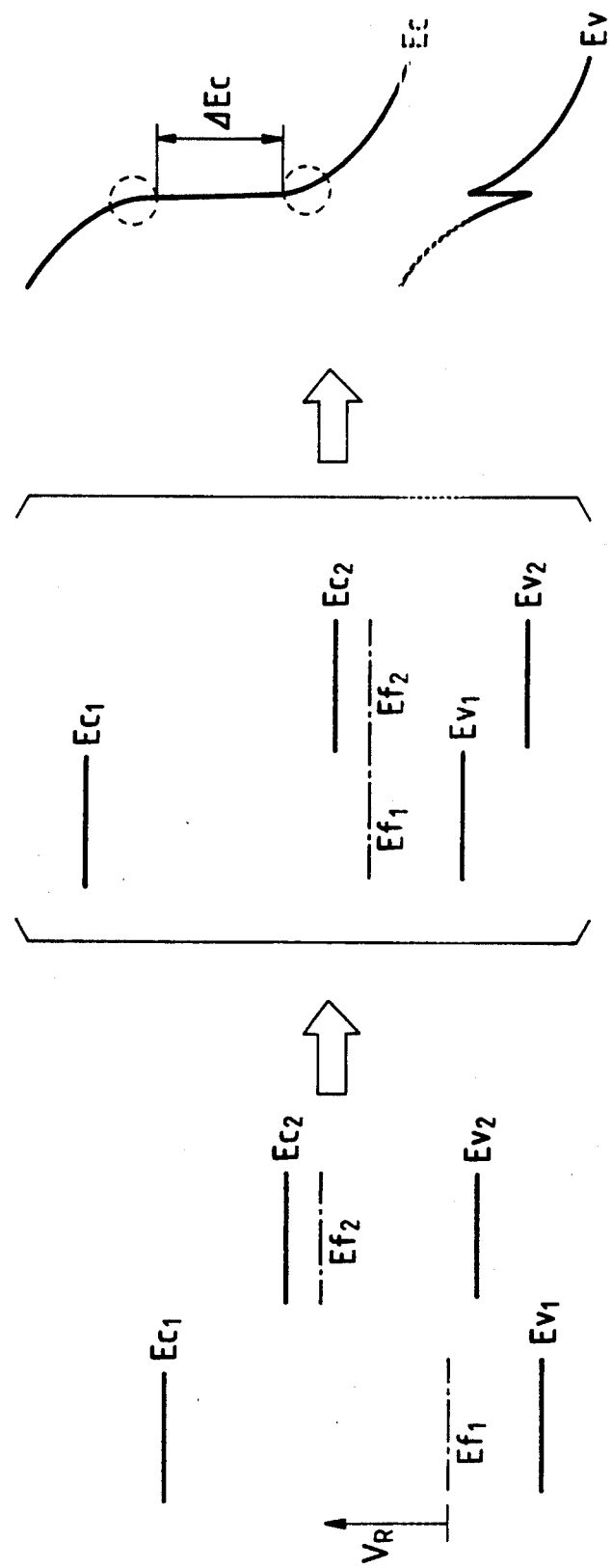
FIG. 13 is a diagram for illustration of the energy state of the multiplying layer having a heterosemiconductor junction.

FIG. 12 and FIG. 13 are drawings for illustrations of the manner when the whole layer was depleted by applying a negative bias $V_R$ on the wide band gap side of the hetero-junction for observing the change in energy band on the electroconductive band side with multiplying of electrons as the premise. Since the energy band is junctioned at the hetero-junction portion so that the Fermi's levels may coincide with each other, a different change in energy band is seen depending on the electroconduction type.

The energy which the carriers (electrons) obtain in the vicinity of the junction becomes the sum of the energy band (conduction band: $\Delta Ec$) at the junction portion and the energy obtained by acceleration of the carriers by the electrical field in the vicinity of the junction portion (in the drawings, the intensity of electrical field is represented by the degree of inclination of the energy band), namely the amount of inclination of the energy band within the distance of the mean free path of the carriers from the junction portion.

As shown by the broken line circular portion in FIG. 12 and FIG. 13, when an impurity is added in the vicinity of the junction portion, the inclination of the energy band is strengthened depending on the impurity concentration, whereby the energy obtained by the carriers in the vicinity of the junction becomes greater to enhance the probability of ionization.

In the case of junction of the same type semiconductors, as shown in FIG. 12, a strong electrical field is generated on the wide gap side, but since the electrical field is strengthened as remote from the junction, the probability of ionization will be enhanced at positions other than the junction.

On other hand, in the case of junction of different types of semiconductors, the electrical field at the junction is most strengthened as shown in FIG. 13 to promote ionization at the junction, whereby fluctuation of the place for ionization can be suppressed. Thus, at the hetero-junction formed by junction of the band gap inclined layers, by forming p/n junction, or p/i junction or i/n junction at the wide gap/narrow gap, the energy insufficient for ionization of carriers can be compensated at the step-back portion to ensure ionization of the carriers. In the case of multiplying holes, the reverse is the case, and n/p junction, i/p junction, or n/i junction is preferred.

Figure 14A:
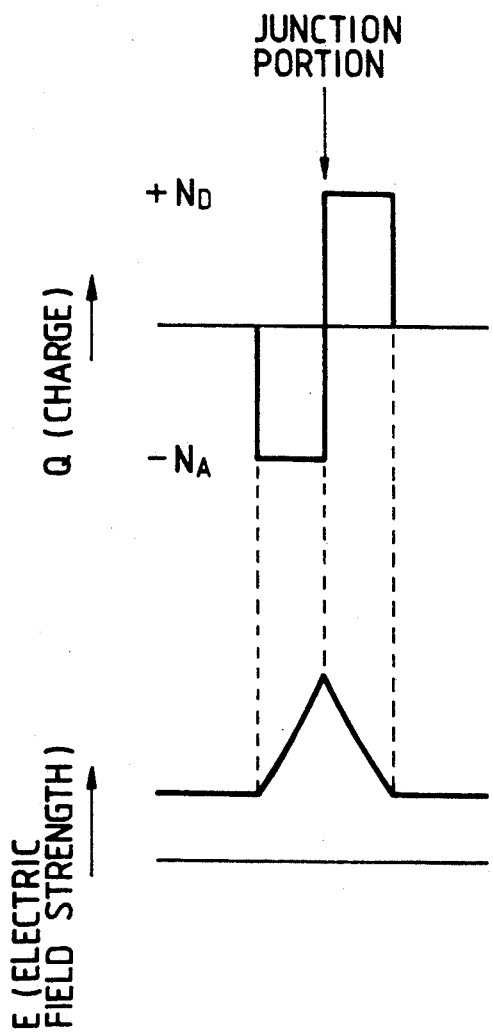
FIGS. 14A and 14B are diagrams for illustration of the junction portion of the multiplying layer and the electrical field intensity distribution when containing an impurity in the vicinity thereof.
Figure 14B:
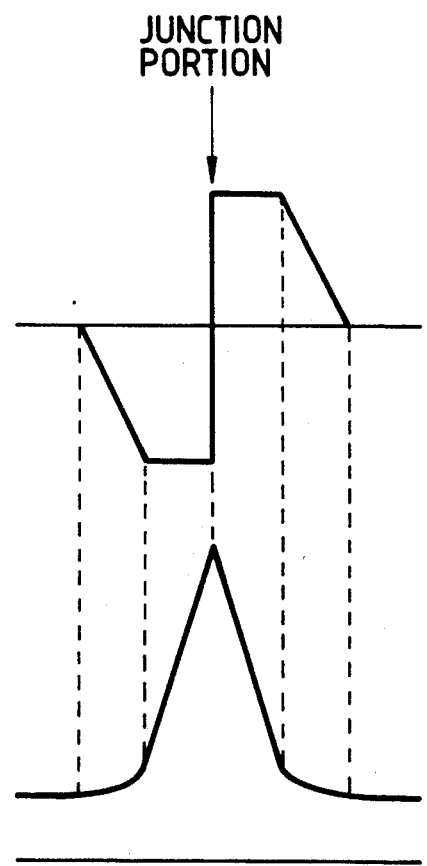
Figure 15:
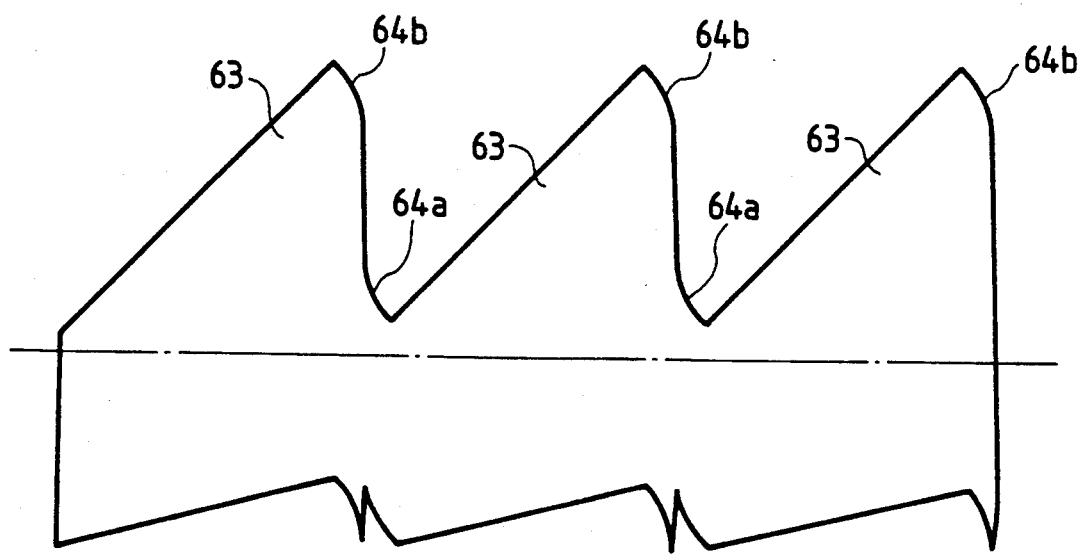
FIG. 15 is a structural illustration of the energy band during no biasing of the multiplying layer containing an impurity.

FIG. 14 is an illustration showing the change in electric field strength at the hetero-junction when the distributions of impurity within the inclined band gap layer are different. Respectively, FIG. 14A shows the electrical field strength in the case of the stepwise change of charge, FIG. 14B continuous (linear functional) change of charge, but when the same electrical field is generated at the junction, as is apparent from the Poisson's equation, the electrical field strength becomes higher in the vicinity of the junction when the impurity concentration changes gently from the junction. More specifically, by varying gently the impurity concentration on the high concentration impurity layer sides $64a$ and $64b$ of the inclined band gap layer 63 shown in FIG. 15, the generation probability of ionization can be enhanced at the junction; and the probability of ionization can be lowered because of small electric field strength at the points remote from the junction, whereby fluctuation of the place for ionization can be suppressed.

Figure 16:
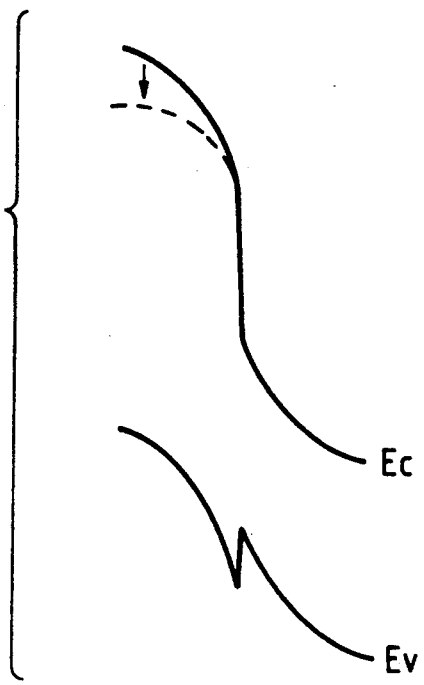
FIG. 16 is a diagram for illustration of the energy state of the multiplying layer.
Figure 17:
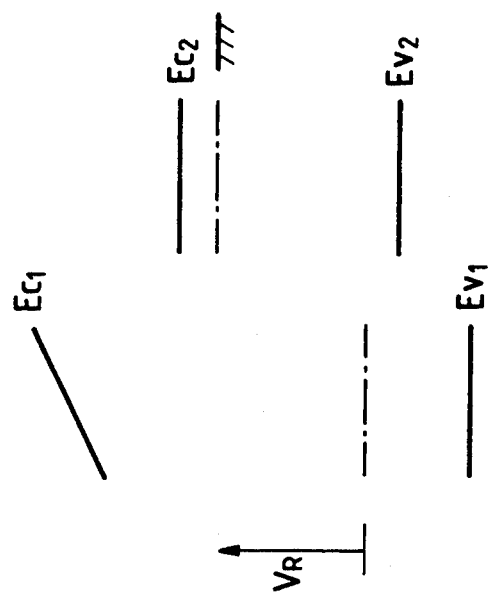
FIG. 17 is a diagram for illustration of the energy state of the multiplying layer.
Figure 18:
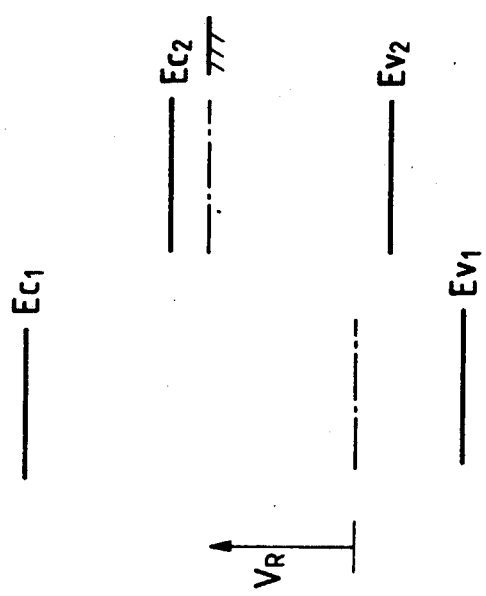
FIG. 18 is a diagram for illustration of the energy state of the multiplying layer.

FIG. 16, FIG. 17 and FIG. 18 show the conceptional views with the inclination of the band gap being considered for the hetero-junction. The solid line in FIG. 16 is the state where the wide gap layer having a uniform impurity concentration shown in FIG. 17 is depleted, and the broken line is the state where the wide gap side of the inclined band gap layer having a uniform impurity concentration shown in FIG. 18 is depleted.

As shown by the broken lines in the Figures, the inclined band is sloped more gently due to reduction of band gap, and lowering and fluctuation of energy may be sometimes brought about in ionization. For this reason, as shown in FIG. 19, by arranging layers 52, 54, 56 with substnatially uniform gap Egd as the high concentration impurity layers 52, 54, 56 at the ends of the sloped band gap layers 51, 53, 55, fluctuation of the place for ionization can be suppressed.

Figure 19:
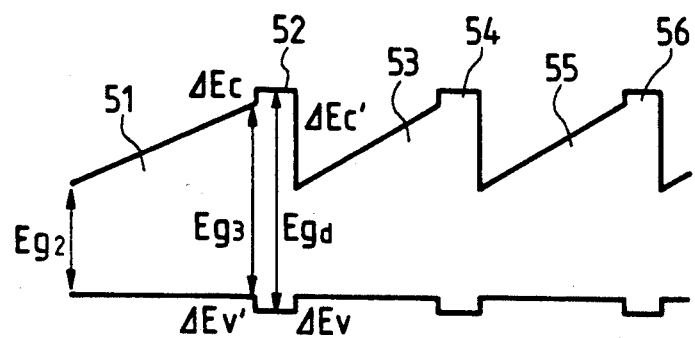
FIG. 19 is a structural illustration of the energy band during no biasing in one embodiment of the multiplying layer.
Figure 20:
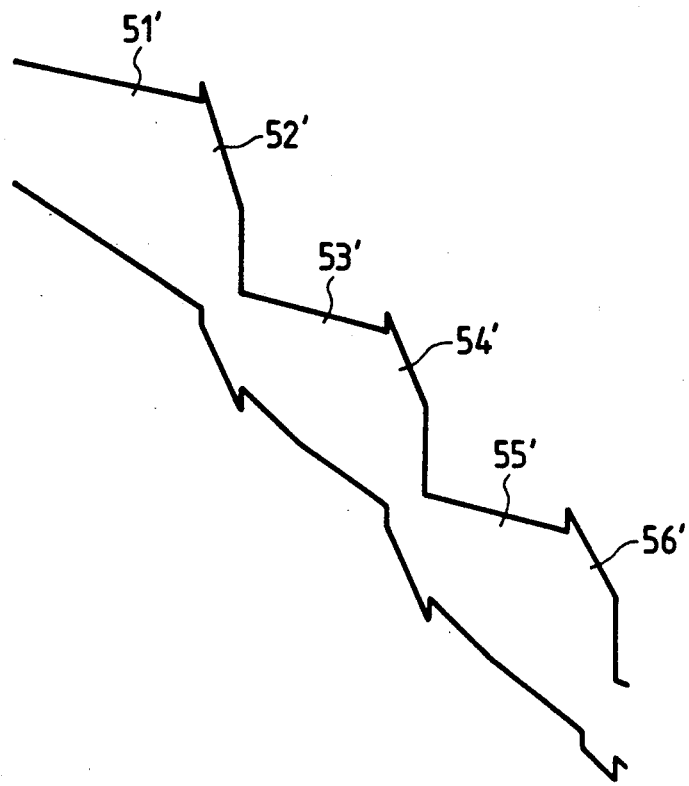
FIG. 20 is a structural illustration of the energy band during biasing in one embodiment of the multiplying layer.

The energy band when a reverse bias is applied on the multiplying layer shown in FIG. 19 is as shown in FIG. 20, and the electrical field strength in the layers 52', 54', 56' with substantially uniform band gap is greater than that of the layers 51', 53', 55' with nonuniform band gaps.

As described above, according to the present invention, the probability of ionization of carriers can be approximated to 1 at the step-back portion, whereby fluctuation of the place for ionization can be suppressed to realize low noise. As the result, for example, an APD of low noise with degree of freedom of choice of materials, and preparation methods can be provided, and also it is possible to provide an APD inhibited in dark current.

ELECTRODE

As the electrode which can be used for the photoelectric transfer device of the present invention, first the electrode material to be arranged on the light incident side should be desirably sufficiently high in transmittance to the light with the wavelength for photoelectric conversion, for example, preferably $In_2O_3$, $SnO_2$, ITO ($In_2O_3+SnO_2$), Si-Pd-O, Pd, etc.

On the light-transmissive electroconductive material as described above, a collector electrode shaped in comb, net, lattice, etc. can be also provided to make electrical resistance lower.

For the electrode provided on the side opposite to the light incident side, a conventional electroconductive material can be used.

CHARGE INJECTION PREVENTING LAYER

The electrode as described above may be also provided with a charge injection preventing layer (blocking layer) having p-type or n-type conductivity which does not become an obstacle in the running direction of the carriers which become the signal to be taken out from the light-absorbing layer or the multiplying layer; can be ohmic junctioned with the electrode; but becomes an obstacle against running of the carriers of the dark current in the opposite direction to the running direction of the carriers which becomes the signal.

By provision of the charge injection preventing layer, injection of unnecessary carriers from the electrode can be impeded, and therefore the noise by dark current can be further reduced.

The charge injection preventing layer can be formed of a material containing impurities capable of controlling conductivity in the same material as the light-absorbing layer or multiplying layer.

The charge injection preventing layer should have a thickness preferably of 50 Å to 2000 Å, more preferably 100 Å to 300 Å.

The impurity contained in the charge injection preventing layer is used for imparting good ohmic junction and impeding function of charge injection to the layer, and its amount should be such that the conductivity of the layer is preferably $10^{-4}$ S/cm or higher, more preferably $10^{-3}$ S/cm or higher.

BIAS VOLTAGE

The bias voltage to be applied during actuation of the photoelectric transfer device of the present invention is to such voltage as to enable depletion of at least the multiplying layer and to give rise to an electric field where drifting of the carriers occurs within the band gap inclined layer (step-back layer) or within the low electric field layer, but no ionization occurs, and it is applied so as to cause ionization to occur selectively in the step-back region where the energy level is abruptly changed within the multiplying layer during bias application.

The present invention is described in detail by referring to Examples.

EXAMPLE 1

The first Example of the present invention is described by referring to FIG. 5, FIG. 8 and FIG. 9.

FIG. 5 is a schematic longitudinal sectional structure view showing the first example of the photoelectric transfer device of the present invention.

The photoelectric transfer device shown in FIG. 5 has a Cr electrode 401, a charge injection preventing layer 402 comprising n-type a-$Si_{1-x}Ge_x$:H with a thickness of about 500 Å for impeding positive holes from said electrode 401, a multiplying region having layers with various compositions of a-Si$_{1-x}$Ge$_x$:H to a-Si$_{1-y}$C$_y$:H laminated for effecting carrier multiplying, a light-shielding layer 404 comprising Cr with a thickness of about 200 Å for impeding penetration of light to the multiplying region, a light-absorbing layer 405 comprising a-Si:H with a thickness of about 1 μm for generation of carriers by absorption of light, a charge injection preventing layer 406 comprising p-type a-Si:H with a thickness of about 100 Å for impeding electron injection from the electrode on the light incident side, a transparent electrode 407 composed mainly of indium oxide.

The Cr electrode 401, the light-shielding layer 404 and the transparent electrode 407 were prepared by EB vapor deposition, while the amorphous layers of the charge injection preventing layer 402, the multiplying layer 403, the light-absorbing layer 405 and the charge injection preventing layer 406 were prepared by the plasma CVD method. For the starting gases during preparation of the amorphous layers, SiH$_4$, GeH$_4$, PH$_3$, H$_2$ were employed for the charge injection preventing layer 402, SiH$_4$, GeH$_4$, CH$_4$, H$_2$ for the multiplying region 403, SiH$_4$, H$_2$ for the light-absorbing layer 405, and SiH$_4$, B$_2$H$_6$, H$_2$ for the charge injection preventing layer 406.

The multiplying region 403 was formed of the three layers of the layers 411, 412, 413 with varied compositions with a thickness of 200 Å in which the gas flow rates of CH$_4$ and GeH$_4$ of the starting gases were continuously varied.

The energy band structure of the photoelectric transfer device in the first Example shown in FIG. 5 is ideally as shown in FIG. 8 and FIG. 9.

FIG. 8 is the energy band chart when the phototransfer device of the first Example is under no bias state, and FIG. 9 the energy band chart under the state applied with a bias for performing carrier multiplying actuation.

FIG. 8 and FIG. 9 show that the band gap of the n-type a-Si$_{1-x}$Ge$_x$:H layer 501 is Eg4, the minimum band gap of the multiplying layer 502 comprising the three layers with varied composition layers 511, 512, 513 of a-Si$_{1-x}$Ge$_x$:H to a-Si$_{1-y}$C$_y$:H is Eg2, the maximum band gap of the multiplying region 502 is Eg3, the band gap of the a-Si:H layer 504 Eg1, the band gap of the p-type a-Si:H layer 505 Eg0. 503 corresponds to the Cr electrode.

In FIG. 8, although there are discontinuous points of energy in both of the conduction band end and the valence band end, there is substantially no barrier due to energy incontinuity in the running direction under the state applied with a bias voltage as can be also seen from FIG. 9, thus not interfering with running performance of the carrier.

Here, the layer giving the maximum band gap Eg3 of the varied composition layers 511, 512, 513 prepared was a-Si$_{1-y}$C$_y$:H having a C composition ratio y of about 0.4, and Eg3 was about 2.3 eV.

The a-Si$_{1-x}$Ge$_x$:H layer 501 had a Ge composition ratio x of about 0.6, and the band gap length Eg4 was about 1.3 eV. The layer giving the minimum band gap Eg2 of the varied composition layers 511, 512, 513 was also about a-Si1−xGex:H layer, and Eg2 was also about 1.3 eV. The band gaps Eg1, Eg0 of the a-Si:H layers of 504, 505 were both about 1.8 eV.

Further, the photoabsorption coefficient of the light-absorbing layer 503 is about $1 \times 10^5$ cm$^{-1}$ to the light with a wavelength of 400 nm, about $5 \times 10^3$ cm$^{-1}$ to the light with a wavelength of 700 nm, whereby absorption of the light at the visible portion could be sufficiently done.

The multiplying ratio of the present device was found to be about 10-fold or more when a bias of 10 V was applied.

There was no change in multiplying ratio even when the wavelength was varied to the visible light with wavelength of 700 nm or shorter.

Further, the leak current during dark was as low as about 1 nA/cm$^2$ or shorter.

Still further, the light response speed was high, being equal to the pin-type photoelectric transfer device without the multiplying layer 502.

EXAMPLE 2

Figure 21:
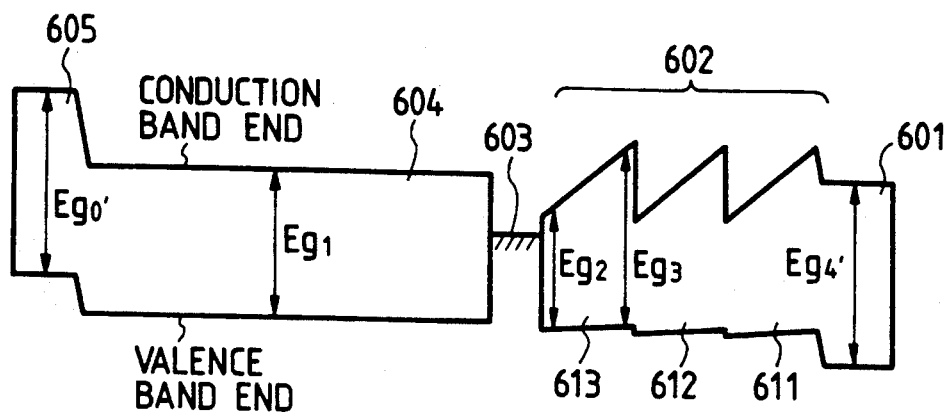
FIG. 21 is a structural illustration of the energy band during no biasing of the photoelectric transfer device of the present invention.
Figure 22:
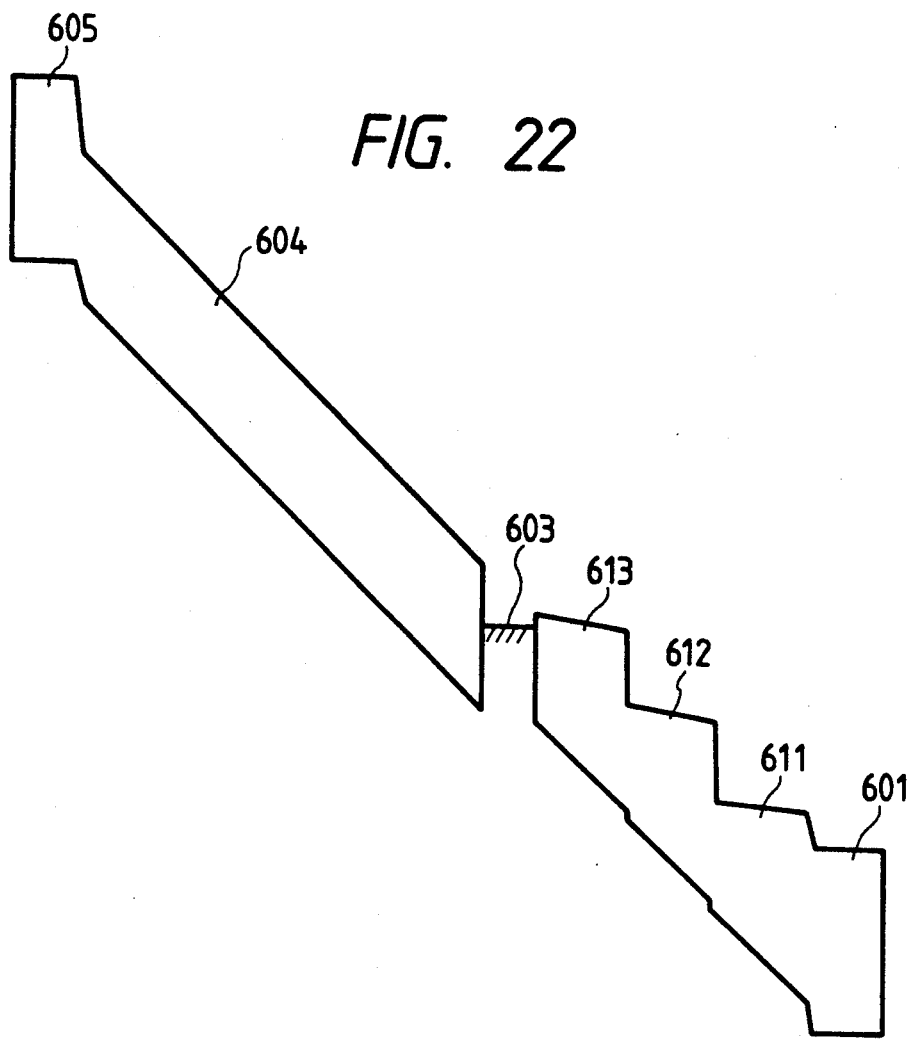
FIG. 22 is a structural illustration of the energy band during biasing of the photoelectric transfer device of the present invention.

By referring to FIG. 21 and FIG. 22, the second Example of the present invention is described.

FIG. 21 and FIG. 22 are energy band structure ideally estimated of the second Example of the present invention.

FIG. 21 is an energy band chart when the photoelectric transfer device of the present invention is under no bias state, FIG. 22 an energy band chart under the state when a bias is applied for performing carrier multiplying actuation.

The photoelectric transfer device shown in FIG. 21 is the same as in FIG. 8 except that the band gap Eg4' is a n-type a-Si$_{1-y}$C$_y$:H layer 601 and the band gap Eg0' is p-type a-Si$_{1-y}$C$_y$:H layer 605. In this Example, it is shown that the multiplying region 602 comprising the three layers of the composition varied layers 611, 612, 613 of a-Si$_{1-x}$Ge$_x$:H to a-Si$_{1-y}$C$_y$:H is Eg2, the maximum band gap Eg3, and the band gap of the a-Si:H layer 604 Eg1.

The multiplying ratio of the present device was found to be about 10-fold or more when a bias of 10 V was applied.

There was no change in multiplying ratio even when the wavelength was varied to the light with wavelength of 700 nm or shorter.

Further, the leak current during dark was as low as about 0.1 nA/cm$^2$ or shorter.

Still further, the light response speed was high, being equal to the pin-type photoelectric transfer device without the multiplying layer 602.

EXAMPLE 3

This Example is an example having the photoelectric transfer device shown in Example 1 laminated on the scanning circuit, the reading circuit already filed in Japanese Laid-open Patent Application No. 63-278269 by the present inventors.

Figure 23:
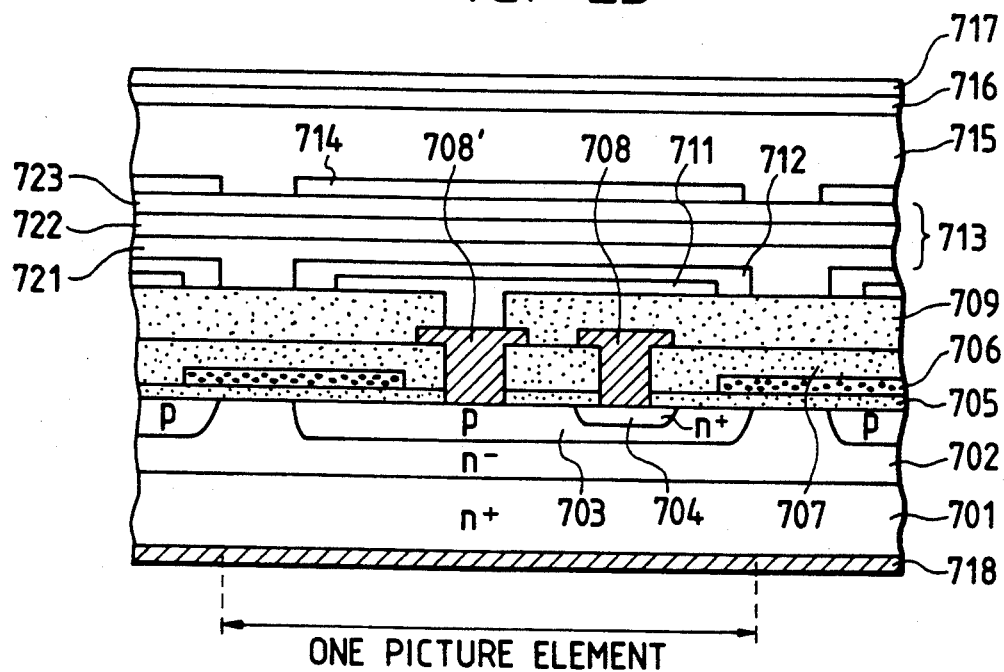
FIG. 23 is a schematic longitudinal sectional view of a photoelectric transfer device having a multiplying layer, a light-shielding layer and a light-absorbing layer on a subbing circuit substrate.
Figure 24:
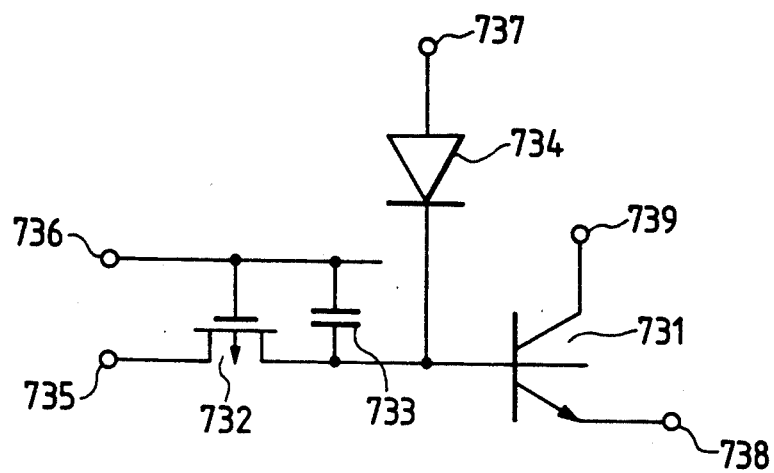
FIG. 24 is an equivalent circuit diagram of the photoelectric transfer device shown in FIG. 23.
Figure 25:
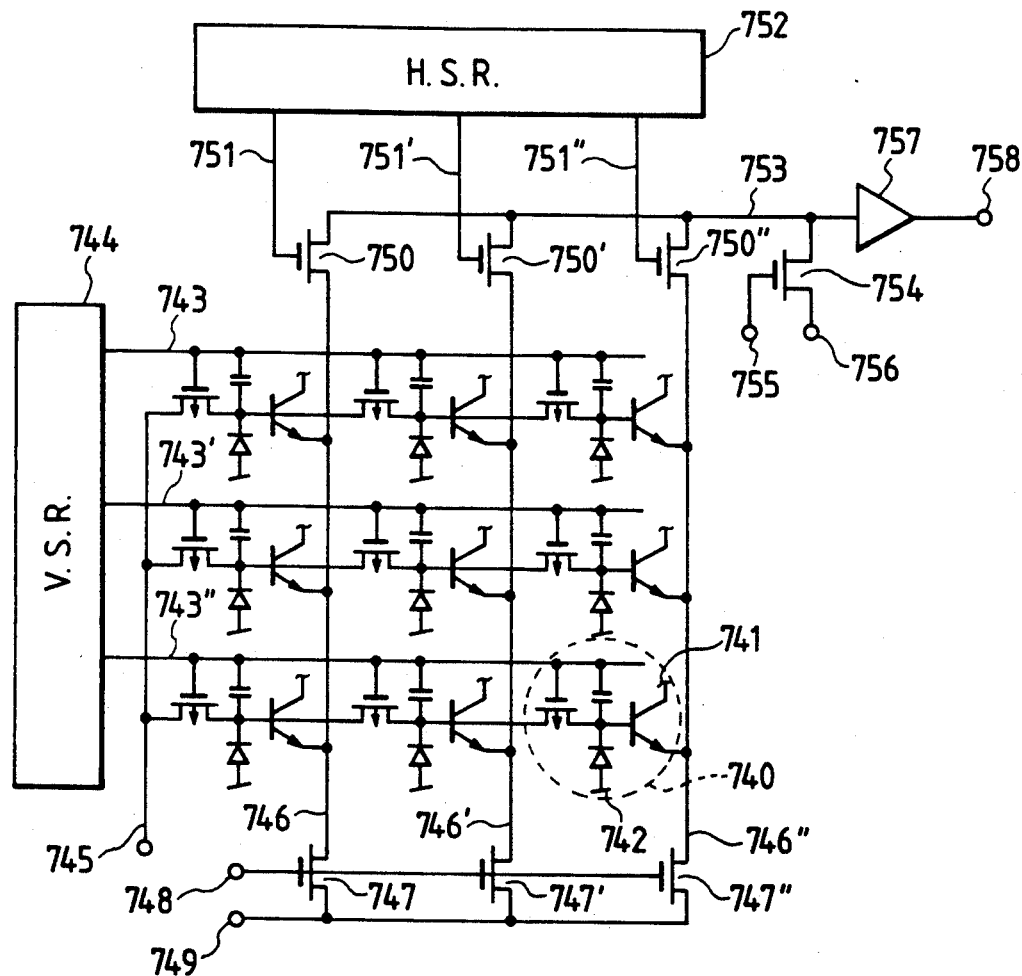
FIG. 25 is an illustration of a photoelectric apparatus having the photoelectric transfer device shown in FIG. 24 as one picture element arranged in a matrix.

FIG. 23 is a schematic sectional view around the light-receiving portion of an example of the present invention, FIG. 24 the equivalent circuit diagram of one picture element, FIG. 25 the equivalent circuit and block circuit diagrams of the whole device.

The device shown in FIG. 23 has an n$^-$ layer 702 which becomes the collector region by epitaxial growth formed on an n-type silicon substrate 701, a p base region 703 and further an n$^+$ emitter region 704 formed therein, to constitute a bipolar transistor.

The p base region 703 is separated from the adjoining picture element, and a gate electrode 706 is formed between that region and the horizontally adjoining p base region with an oxide film 705 sandwiched therebetween. Therefore, p channel MOS transistor is formed with the adjoining p base regions 703 as the respective source-drain regions. The gate electrode 706 also functions as the capacitor for controlling the potential of the p base region 703.

Further, after formation of the insulating layer 707, the emitter electrode 708 and the base electrode 708' were formed.

Then, an insulating layer 709 was formed, subsequently an electrode 711 was formed and separated into picture elements. The electrode 711 is electrically connected to the electrode 708'. Further, an n-type a-Si$_{1-x}$Ge$_x$:H layer 712 was formed and separated into picture elements.

Subsequently, the composition varied layers 721, 722, 723 of a-Si$_{1-x}$Ge$_x$:H to a-Si$_{1-y}$C$_y$:H were formed in the same manner as in Example 1 to constitute a multiplying region 713. Next, a Cr electrode (light-shielding layer) 714 was formed and separated into picture elements. Next, the light-absorbing layer a-Si:H layer 715 was formed, a p-type a-Si:H layer 716 formed and a transparent electrode 717 for applying a bias on a sensor formed.

Also, a collector electrode 718 is ohmic connected to the back of the substrate 701.

Accordingly, the equivalent circuit of one picture element, as shown in FIG. 24, has a p-channel MOS transistor 732, a capacitor 733 and the same photoelectric transfer device 734 as in Example 1 connected to the base of a bipolar transistor 731 constituted of crystalline silicon, and represented by a terminal 735, a terminal 736 for driving a p-channel MOS transistor 732 and a capacitor 733, a sensor electrode 737, an emitter 738, and a collector electrode 739.

FIG. 25 is a circuit constitutional view having the one picture element cells 740 shown in FIG. 23 and FIG. 24 arranged into a two-dimensional matrix of 3×3.

In FIG. 25, the collector electrode 741 of the one picture element cell 740 is provided on each of all the picture elements, and also the sensor electrode 742 on each of all the picture elements. The gate electrode and the capacitor electrode of the PMOS transistor are connected to the driving wires 743, 743', 743" for every line to be connected to the vertical shift resister (V.S.R.) 744. The emitter electrodes are connected to vertical wirings 746, 746', 746" for signal reading for every row. The vertical wirings 746, 746', 746" are respectively connected to the switches 747, 747', 747" for resetting the charges of the vertical wirings and to the reading switches 750, 750', 750". The gate electrodes of the resetting switches 747, 747', 747" are commonly connected to a terminal 748 for applying vertical wiring reset pulses, while the source electrodes commonly connected to a terminal 749 for applying vertical line resetting voltage. The gate electrodes of the reading switches 750, 750', 750" are respectively connected to horizontal shift resistors (H.S.R.) 752 through the wirings 751, 751', 751", while the drain electrodes connected through the horizontal reading wiring 753 to the output amplifier 757. The horizontal reading wiring 753 is connected to the switch 754 for resetting charges of the horizontal reading wiring 753.

The resetting switch 754 is connected to the terminal 755 for applying horizontal wiring resetting pulses and to the terminal 756 for applying horizontal wiring resetting voltage.

Finally, the output of the amplifier 757 is taken out from the terminal 758.

Referring now to FIG. 23, FIG. 24 and FIG. 25, the actuation is briefly described.

The incident light is absorbed in the light-absorbing layer 715 in FIG. 23, and the carriers generated are multiplied in the multiplying region 713 and accumulated in the base region 703.

When the driving pulse output from the vertical shift resister in FIG. 25 appears at the driving wiring 743, the base potential is elevated through the capacitor, and the signal charges corresponding to the doses are taken out for the picture element on the first line to the vertical wirings 746, 746', 746", respectively.

Next, when scanning pulses are successively outputted from the horizontal shift resister 752 to 751, 751', 751", the switches 750, 750', 750" are successively subjected to ON, OFF control, and the signals are taken out through the amplifier 757 to the output terminal 758. During this operation, the resetting switch 754 becomes the ON state when the switches 750, 750', 750" are subjected successively to ON actuation, thereby removing the residual charges of the horizontal wiring 753.

Next, the vertical line resetting switches 747, 747', 747" become ON state, whereby the residual charges of the vertical wirings 746, 746', 746" are removed. When a pulse in the negative direction is applied on the driving wiring 743 from the vertical shift register 744, the PMOS transistors of the respective picture elements on the first line become ON state, whereby the base residual charges of the respective picture elements are removed to be initialized.

Next, the driving pulse output from the vertical shift register 744 appears at the driving wiring 743', and the signal charges of the picture elements on the second line are similarly taken out.

The signal charges of the picture elements on the next third line are also similarly taken out.

By repeating the actuations as described above, the present device is actuated.

In the Example as described above, the circuit example according to the invention by the present inventors was shown, but general photoelectric transfer device may be also employed.

In the following, the case, in which the photoelectric transfer device of the present invention is applied to a photoelectric transfer apparatus of general constitution, is described.

Figure 26:
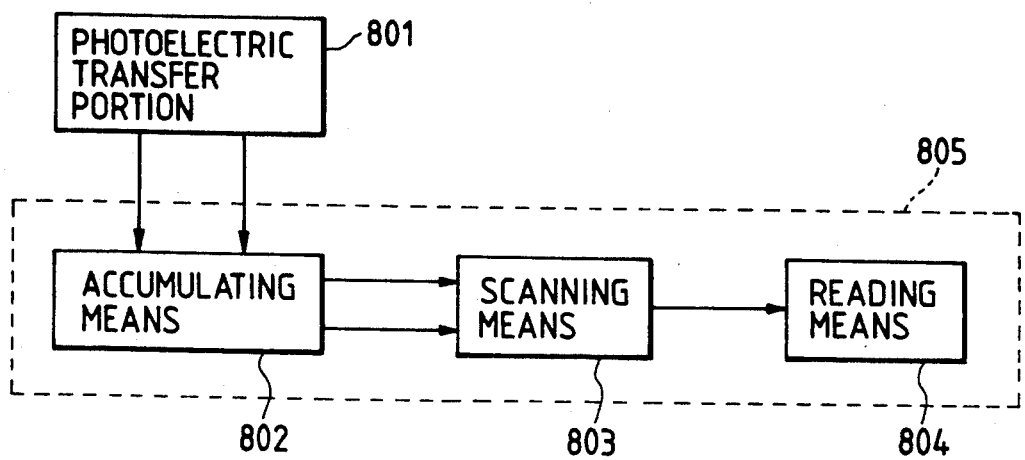
FIG. 26 is a block diagram showing the constitution of the phototransfer device.

FIG. 26 is a block diagram showing the constitution when the present invention is used for a photoelectric transfer apparatus of general constitution.

In the same Figure, 801 is a plurality of photoelectric transfer portions according to the present invention and, for example, the photoelectric transfer devices shown in Example 1, Example 2 are employed The photoelectric transfer portion 801 is connected to the signal output portion 805. In the signal output portion 805, 802 is the accumulation means of the signal charges generated from the photoelectric transfer portion 801, 803 the scanning means for scanning the signal charges as described above, and 804 the reading means comprising the circuits for amplifying, noise compensation, etc. of the signal charges transferred by the scanning means 803. The accumulation means 802 is required when performing accumulation actuation, but may be also omitted.

As described above, according to the photoelectric transfer device of this Example, by laminating a light-absorbing layer which has a band gap of Eg1 and absorbs light, a metal light-shielding layer, a multiplying layer comprising one or a plurality of layers having a step-back structure in which the band gaps of the minimum band gap Eg2, the maximum band gap Eg3 are continuously varied which multiplies the carriers formed by absorption of light successively laminated so as to be sandwiched between charge injection preventing layers, various problems occurring by band mismatching could be cancelled, whereby the same high speed response characteristic as the photodiode having no multiplying layer was obtained, and at the same time, fluctuation in multiplying ratio by light incidence could be avoided, because the metal shielding layer shielded the light incident from the light-absorbing layer side, even if transmitted through the light-absorbing layer, without entering the multiplying layer.

By making the band gap Eg1 of the light-absorbing layer various sizes, it became possible that not only visible portion light, but the lights with various wavelengths could have high sensitivity.

By selection of the layer number of the step-back structure, two or more amplifying ratios could be obtained, and also low noise could be effected.

Further, by constituting the light-absorbing layer, the multiplying layer, the charge injection preventing layer of the photoelectric transfer device of a non-monocrystalline material such as polycrystalline material or amorphous material containing at least Si atoms, it becomes possible to control easily band gap and effect low temperature lamination, whereby various problems caused to occur by lamination can be cancelled.

EXAMPLE 4

The fourth Example of the present invention is described by referring to FIG. 5, FIG. 6 and FIG. 7.

FIG. 5 is a schematic longitudinal sectional structure view showing the fourth example of the photoelectric transfer device of the present invention.

The photoelectric transfer device shown in FIG. 5 has a Cr electrode 401, a charge injection preventing layer 402 comprising n-type a-$Si_{1-x}Ge_x$:H with a thickness of about 500 Å for impeding positive holes, a multiplying region 403 having layers with various compositions of a-$Si_{1-x}Ge_x$:H to a-$Si_{1-y}C_y$:H laminated for effecting carrier multiplying, an n-type a-$Si_{1-x}Ge_x$:H layer 404 for preventing penetration of light into the multiplying region and improving running of carriers by intensifying the internal electrical field of the light-absorbing layer, a light-absorbing layer 405 comprising a-Si:H with a thickness of about 2 μm for generation of carriers by absorption of light, a charge injection preventing layer 406 comprising p-type a-Si:H with a thickness of about 100 Å for impeding electron injection, a transparent electrode 407 composed mainly of indium oxide.

The Cr electrode 401 and the transparent electrode 407 were prepared by EB vapor deposition, while the amorphous layers of the charge injection preventing layer 402, the multiplying layer 403, the n-type a-$Si_{1-x}Ge_x$:H layer 404, the light-absorbing layer 405 and the charge injection preventing layer 406 were prepared by the plasma CVD method. For the starting gases during preparation of the amorphous layers, $SiH_4$, $GeH_4$, $PH_3$, $H_2$ were employed for the charge injection preventing layer 402 and n-type a-$Si_{1-x}Ge_x$:H layer 404, $SiH_4$, $GeH_4$, $CH_4$, $H_2$ for the multiplying region 403, $SiH_4$, $H_2$ for the light-absorbing layer 405, and $SiH_4$, $B_2H_6$, $H_2$ for the charge injection preventing layer 406.

The multiplying region 403 was formed of the three layers of the layers 411, 412, 413 with varied compositions with a thickness of 200 Å in which the gas flow rates of $CH_4$ and $GeH_4$ of the starting gases were continuously varied. The gas flow rate of $PH_3$ in the n-type a-$Si_{1-x}Ge_x$:H layer 404 was made slightly smaller than in the charge injection preventing layer 402.

The energy band structure of the photoelectric transfer device in the fourth Example shown in FIG. 5 is ideally as shown in FIG. 6 and FIG. 7.

FIG. 6 is the energy band chart when the photoconverting device of the fourth Example is under no bias state, and FIG. 7 the energy band chart under the state applied with a bias for performing carrier multiplying actuation.

FIG. 6 and FIG. 7 show that the band gap of the n-type a-$Si_{1-x}Ge_x$:H layer 402 is Eg4, the minimum band gap of the multiplying layer 403 comprising the three layers with varied composition layers 411, 412, 413 of a-$Si_{1-x}Ge_x$:H to a-$Si_{1-y}C_y$:H is Eg2, the maximum band gap of the multiplying region 403 is Eg3, the band gap of the n-type a-$Si_{1-x}Ge_x$:H layer 404 EG5, the band gap of the a-Si:H layer 405 Eg1, the band gap of the p-type a-Si:H layer 406 Eg0.

In FIG. 6, although there are incontinuous points of energy in both of the conduction band end and the valence band end, there is substantially no barrier due to energy incontinuity in the running direction under the state applied with a bias voltage as can be also seen from FIG. 7, thus not interfereing with running performance of the carrier.

Here, the layer giving the maximum band gap Eg3 of the varied composition layers 411, 412, 413 prepared was a-$Si_{1-y}C_y$:H having a C composition ratio y of about 0.4, and Eg3 was about 2.3 eV.

The a-$Si_{1-x}Ge_x$:H layer 402 and the n-type a-$Si_{1-x}Ge_x$:H layer 404 had a Ge composition ratio x of about 0.6, and the band gap length Eg4 was about 1.3 eV. The layer giving the minimum band gap Eg2 of the varied composition layers 411, 412, 413 was also a-$Si_{1-x}Ge_x$:H layer, and Eg2 was also about 1.3 eV. The band gaps Eg1, Eg0 of the a-Si:H layers of 405, 406 were both about 1.8 eV.

Further, the photoabsorption coefficient of the light-absorbing layer (light-shielding layer) 404 is about $1 \times 10^5$ cm$^{-1}$ or more to the light with a wavelength of 400 nm, about $5 \times 10^3$ cm$^{-1}$ or more to the light with a wavelength of 700 nm, whereby absorption of the light at the visible portion could be sufficiently done.

The multiplying ratio of the present device was found to be about 10-fold or more when a bias of 10 V was applied.

There was no change in multiplying ratio even when the wavelength was varied to the visible light with wavelength of 700 nm or shorter.

Further, the leak current during dark was as low as about 1 nA/cm$^2$ or shorter.

Still further, the light response speed was high, being equal to the pin-type photoelectric transfer device without the multiplying layer 403.

EXAMPLE 5

Figure 27:
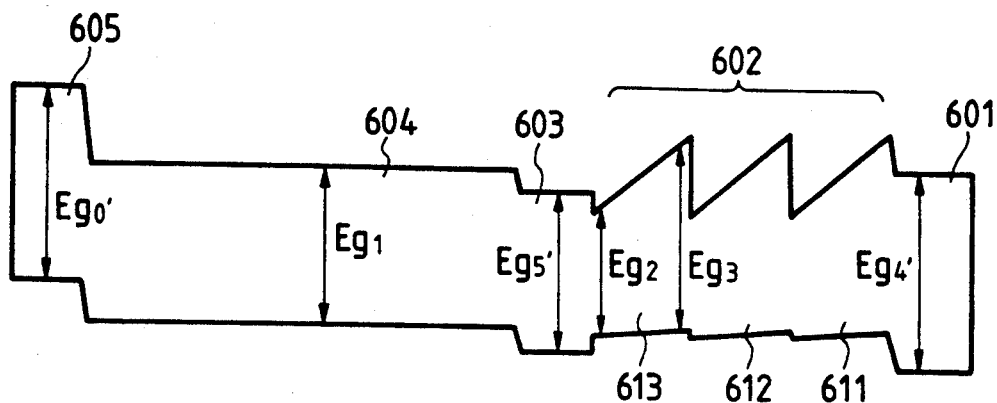
FIG. 27 is a structural illustration of the energy band during no biasing of the photoelectric transfer device of the present invention.
Figure 28:
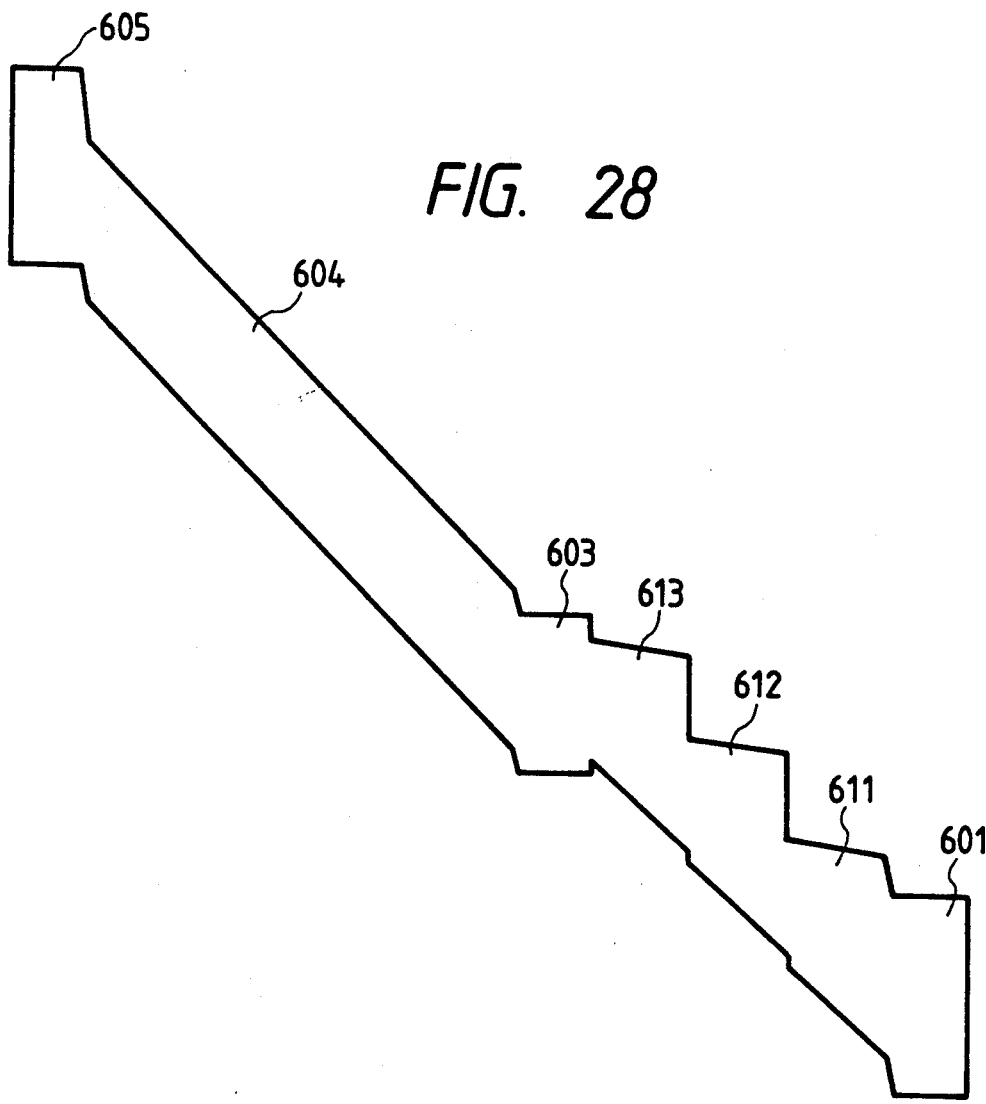
FIG. 28 is a structural illustration of the energy band during bias application of the photoelectric transfer device of the present invention.

By referring to FIG. 27 and FIG. 28, the fifth Example of the present invention is described.

FIG. 27 and FIG. 28 are energy band structure ideally estimated of the fifth Example of the present invention.

FIG. 27 is an energy band chart when the photoelectric transfer device of the fifth example is under no bias state, FIG. 28 an energy band chart under the state when a bias is applied for performing carrier multiplying actuation.

The photoelectric transfer device shown in FIG. 27 is the same as in FIG. 6 except that 601 is a n-type a-Si$_{1-y}$C$_y$:H layer of the band gap Eg4', 605 is p-type a-Si$_{1-y}$C$_y$:H layer of the band gap Eg0' and 603 is an n-type a-Si:H layer of band gap Eg5'. In this Example, it is shown that the multiplying region 602 comprising the three layers of the composition varied layers 611, 612, 613 of a-Si$_{1-x}$Ge$_x$:H to a-Si$_{1-y}$C$_y$:H is Eg2, the maximum band gap Eg3, and the band gap of the a-Si:H layer 604 Eg1.

The multiplying ratio of the present device was found to be about 10-fold or more when a bias of 10 V was applied.

There was no change in multiplying ratio even when the wavelength was varied to the visible light with wavelength of 700 nm or shorter.

Further, the leak current during dark was as low as about 0.1 nA/cm$^2$ or shorter.

Still further, the light response speed was high, being equal to the pin-type photoelectric transfer device without the multiplying layer 602.

EXAMPLE 6

This Example prepared the photoelectric transfer device shown in Example 3 in the same manner except for changing the metal light-shielding layer to an n-type semiconductor layer.

FIG. 23 is a schematic sectional view around the light-receiving portion of an example of the present invention, FIG. 24 the equivalent circuit diagram of one picture element, FIG. 25 the equivalent circuit and block circuit diagrams of the whole device.

First, a subbing circuit substrate having a transistor was formed in the same manner as in Example 3.

Subsequently, the composition varied layers 721, 722, 723 of a-Si$_{1-x}$Ge$_x$:H to a-Si$_{1-y}$C$_y$:H were formed to constitute a multiplying region 713. Next, in place of the metal shielding layer in Example 3, an n-type a-Si$_{1-x}$Ge$_x$:H layer 714 was formed and separated into picture elements to form the light-absorbing layer a-Si:H layer 715, a p-type a-Si:H layer 716 formed and a transparent electrode 717 for applying a bias on a sensor formed.

Also, a collector electrode 718 is ohmic connected to the back of the substrate 701.

Accordingly, the equivalent circuit of one picture element, as shown in FIG. 24, has a p-channel MOS transistor 732, a capacitor 733 and the same photoelectric transfer device 734 as in Example 4 connected to the base of a bipolar transistor 731 constituted of crystalline silicon, and represented by a terminal 735 for applying potential to the base, a terminal 736 for driving a p-channel MOS transistor 732 and a capacitor 733, a sensor electrode 737, an emitter electrode 738, and a collector electrode 739.

FIG. 25 is a circuit constitutional view having the one picture element cells 740 shown in FIG. 23 and FIG. 24 arranged into a two-dimensional matrix of 3×3.

The actuation is the same as in Example 3 and therefore description of the actuation is omitted.

According to the photoelectric transfer device of this Example, by laminating a light-absorbing layer which has a band gap of Eg1 and absorbs light, an n-electroconductive layer with a band gap of Eg5, a multiplying layer comprising a plurality of layers having a step-back structure in which the band gaps of the minimum band gap Eg2, the maximum band gap Eg3 are continuously varied which multiplies the carriers formed by absorption of light successively laminated so as to be sandwiched between charge injection preventing layers, the carriers formed in the light-absorbing layer can be smoothly transported to give high speed response characteristic similar to photodiode, because the n-electroconductive layer placed between the light-absorbing layer and the multiplying layer has the function as the reverse bias layer. Also, by making the band gap of the n-electroconductive layer provided between the light-absorbing layer and the multiplying layer smaller, incidence of light onto the multiplying layer could be reduced, whereby fluctuation in multiplying ratio could be suppressed.

In this Example, by making the band gap Eg1 of the light-absorbing layer the band gap corresponding particularly to the visible portion light, the visible portion light could be endowed with high sensitivity.

Further, by constituting constituent elements such as the light-absorbing layer, n-photoconductive layer, the multiplying layer, the charge injection preventing layer of the photoelectric transfer device of the present invention of a non-monocrystalline material containing at least Si atoms, it becomes possible to control easily band gap and effect low temperature lamination, whereby various problems caused to occur by lamination could be cancelled.

EXAMPLE 7

Figure 29:
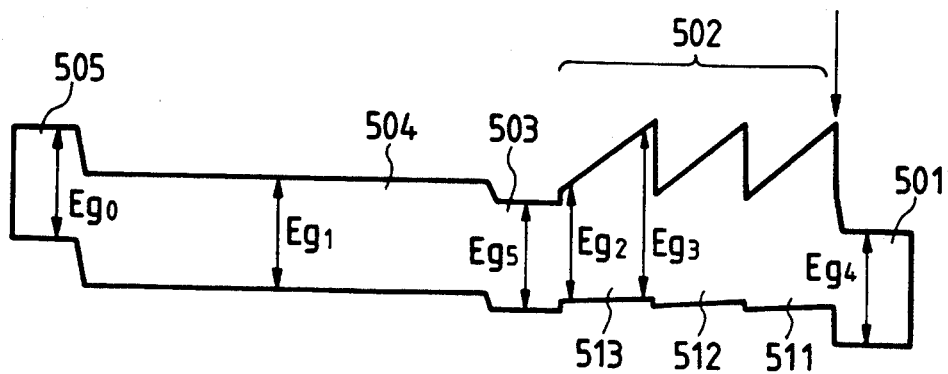
FIG. 29 is a structural illustration of the energy band during no biasing of the photoelectric transfer device of the present invention.
Figure 30:
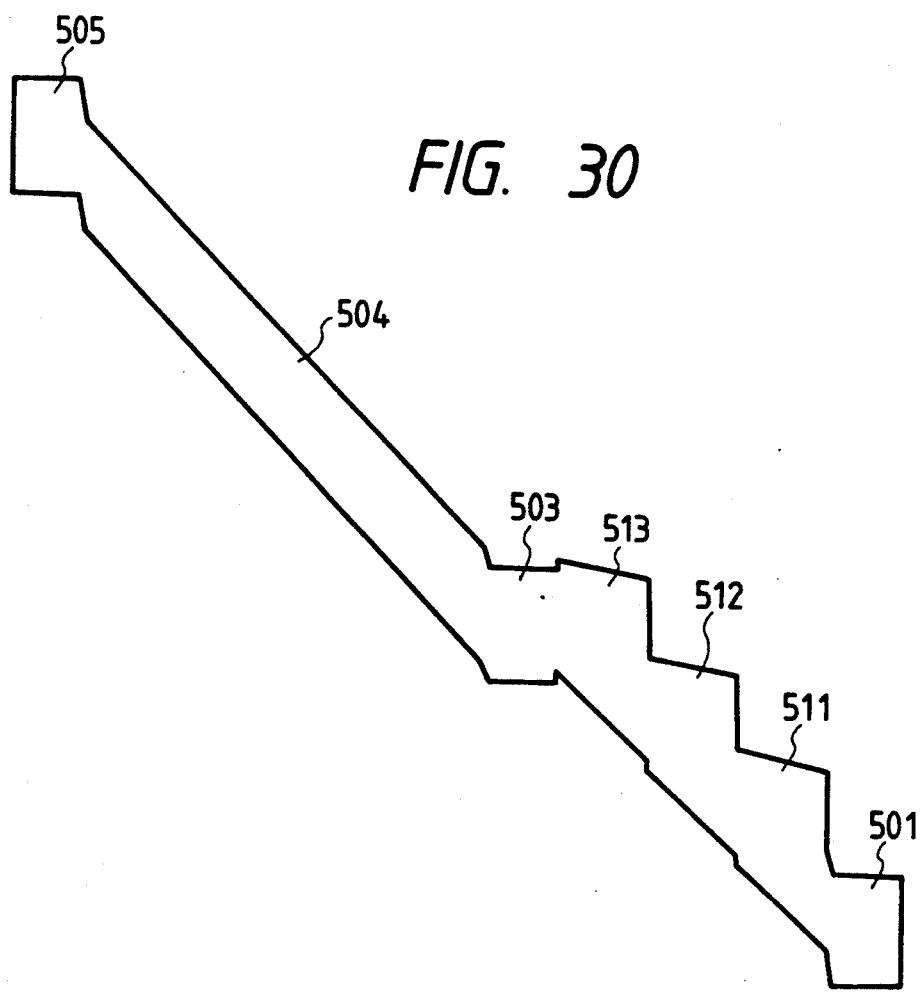
FIG. 30 is a structural illustration of the energy band during bias application of the photoelectric transfer device of the present invention.

The seventh Example of the present invention is described by referring to FIG. 5, FIG. 29 and FIG. 30.

FIG. 5 is a schematic longitudinal sectional structure view showing the seventh example of the photoelectric transfer device of the present invention.

The photoelectric transfer device shown in FIG. 5 and FIG. 12 has a Cr electrode 401, a charge injection preventing layer 402 comprising n-type a-Si$_{1-x}$Ge$_x$:H with a thickness of about 500 Å for impeding positive holes, a multiplying region 403 having layers with various compositions of a-Si$_{1-x}$Ge$_x$:H to a-Si$_{1-y}$C$_y$:H laminated for effecting carrier multiplying, an a-Si$_{1-x}$Ge$_x$:H layer (light-shielding layer) 404 for preventing penetration of light into the multiplying region and improving running of carriers by intensifying the internal electrical field of the light-absorbing layer, a light-absorbing layer 405 comprising a-Si$_{1-x}$Ge$_x$:H with a thickness of about 1 μm for generation of carriers by absorption of light, a charge injection preventing layer 406 comprising p-type a-Si$_{1-x}$Ge$_x$:H with a thickness of about 100 Å for impeding electron injection, a transparent electrode 407 composed mainly of indium oxide.

The Cr electrode 401 and the transparent electrode 407 were prepared by EB vapor deposition, while the amorphous layers of the charge injection preventing layer 402, the multiplying layer 403, the a-Si$_{1-x}$Ge$_x$:H layer 404, the light-absorbing layer 405 and the charge injection preventing layer 406 were prepared by the plasma CVD method. For the starting gases during preparation of the amorphous layers, SiH$_4$, GeH$_4$, PH$_3$, H$_2$ were employed for the charge injection preventing layer 402 and the a-Si$_{1-x}$Ge$_x$:H layer 404, SiH$_4$, GeH$_4$, CH$_4$, H$_2$ for the multiplying region 403, SiH$_4$, GeH$_4$, H$_2$ for the light-absorbing layer 405, and SiH$_4$, GeH$_4$, B$_2$H$_6$, H$_2$ for the charge injection preventing layer 406.

The multiplying region 403 was formed of the three layers of the layers 411, 412, 413 with varied compositions with a thickness of about 200 Å in which the gas flow rates of CH$_4$ and GeH$_4$ of the starting gases were continuously varied. The gas flow rate of $PH_3$ in the a-$Si_{1-x}Ge_x$:H layer (light-shielding layer) 404 was made slightly smaller than in the charge injection preventing layer 402.

The energy band structure of the photoelectric transfer device in the seventh Example shown in FIG. 5 is ideally as shown in FIG. 29 and FIG. 30.

FIG. 29 is the energy band chart when the photoconverting device of the seventh Example is under no bias state, and FIG. 30 the energy band chart under the state applied with a bias for performing carrier multiplying actuation.

FIG. 29 and FIG. 30 show that the band gap of the n-type a-$Si_{1-x}Ge_x$:H layer 501 is Eg4, the minimum band gap of the multiplying layer 502 comprising the three layers with varied composition layers 511, 512, 513 of a-$Si_{1-x}Ge_x$:H to a-$Si_{1-y}C_y$:H is Eg2, the maximum band gap of the multiplying region 502 is Eg3, the band gap of the n-type a-Si1-xGex-H layer 503 Eg5, the band gap of the a-$Si_{1-x}Ge_x$:H layer 504 Eg1, the band gap of the p-type a-$Si_{1-x}Ge_x$:H layer 505 Eg0. Particularly in this Example, Eg1 and Eg5 were made substantially the same value.

In FIG. 29, although there are incontinuous points of energy in both of the conduction band end and the valence band end, there is substantially no barrier due to energy incontinuity in the running direction under the state applied with a bias voltage as can be also seen from FIG. 30, thus not interfering with running performance of the carrier.

Here, the layer giving the maximum band gap Eg3 of the varied composition layers 511, 512, 513 prepared was a-$Si_{1-y}C_y$:H having a C composition ratio y of about 0.4, and Eg3 was about 2.3 eV.

The a-$Si_{1-x}Ge_x$:H layers 501, 503, 504, 505 had a Ge composition ratio x of about 0.6, and the band gaps Eg4, Eg1, Eg0 were all about 1.3 eV. The layer giving the minimum band gap Eg2 of the varied composition layers 511, 512, 513 was also a-$Si_{1-x}Ge_x$:H layer, and Eg2 was also about 1.3 eV.

Further, the photoabsorption coefficient of the light-absorbing layer 503 is about $1 \times 10^5$ cm$^{-1}$ or more to the light with a wavelength of 800 nm, about $2 \times 10^4$ cm$^{-1}$ or more to the light with a wavelength of 1000 nm, whereby absorption of the light at the IR portion could be sufficiently done.

The multiplying ratio of the present device was found to be about 10-fold or more when a bias of 10 V was applied.

There was no change in multiplying ratio even when the wavelength was varied to the visible light with wavelength of 1000 nm or shorter.

Further, the leak current during dark was as low as about 10 nA/cm$^2$ or less during bias application of 10 V.

Still further, the light response speed was high, being equal to the pin-type photoelectric transfer device without the multiplying layer 502.

EXAMPLE 8

Figure 31:
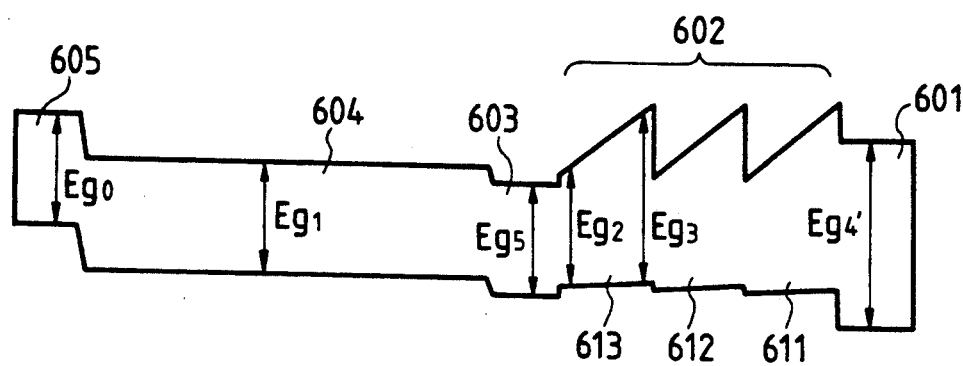
FIG. 31 is a structural illustration of the energy band during no biasing of the photoelectric transfer device of the present invention.
Figure 32:
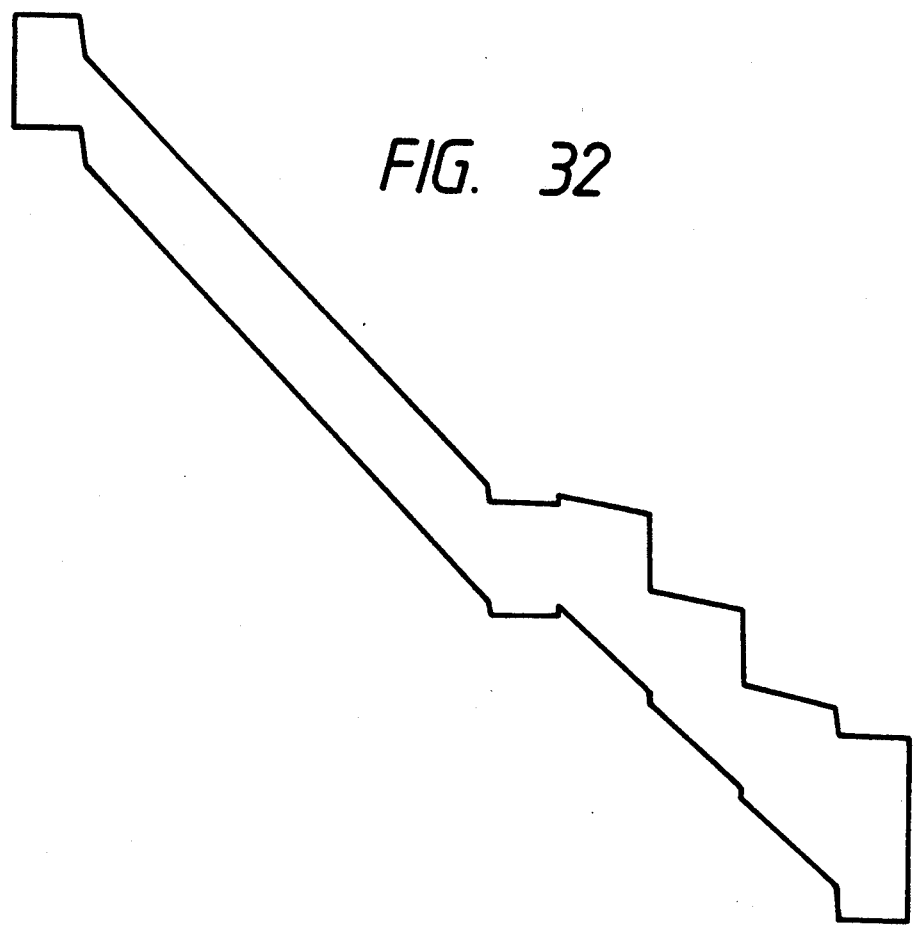
FIG. 32 is a structural illustration of the energy band during bias application of the photoelectric transfer device of the present invention.

By referring to FIG. 31 and FIG. 32, the eighth Example of the present invention is described.

FIG. 31 and FIG. 32 are energy band structure ideally estimated of the eighth Example of the present invention.

FIG. 31 is an energy band chart when the photoelectric transfer device of the eighth example is under no bias state, FIG. 32 an energy band chart under the state when a bias is applied for performing carrier multiplying actuation.

The photoelectric transfer device shown in FIG. 31 is the same as in FIG. 29 except that the charge injection preventing layer is a n-type a-$Si_{1-y}C_y$:H layer of the band gap Eg4' which is a wide gap, and it is shown that the minimum band gap of the multiplying region 602 comprising the three layers of the composition varied layers 611, 612, 613 of a-$Si_{1-x}Ge_x$:H to a-$Si_{1-y}C_y$:H is Eg2, the maximum band gap Eg3, the band gap of the n-type a-$Si_{1-x}Ge_x$:H layer 603 Eg5, the band gap of the a-$Si_{1-x}Ge_x$:H layer 604 Eg1, the p-type a-$Si_{1-x}Ge_x$:H 605 Eg0.

The multiplying ratio of the present device was found to be about 10-fold or more when a bias of 10 V was applied.

There was no change in multiplying ratio due to penetration of the light into the multiplying layer even when the wavelength was varied to the IR portion light with wavelength of 1000 nm or shorter.

Further, the leak current during dark was as low as about 10 nA/cm$^2$ or less when a bias of 10 V was applied.

Still further, the light response speed was high, being equal to the pin-type photoelectric transfer device without the multiplying layer 602.

EXAMPLE 9

This example prepared the photoelectric transfer device shown in Example 6 in the same manner except for changing the light-absorbing layer to the light-absorbing layer in Example 7.

FIG. 23 is a schematic sectional view around the light-receiving portion of an example of the present invention, FIG. 24 the equivalent circuit diagram of one picture element, FIG. 25 the equivalent circuit and block circuit diagrams of the whole device.

First, a subbing circuit substrate having a transistor was formed in the same manner as in Example 3.

Subsequently, the composition varied layers 721, 722, 723 of a-$Si_{1-x}Ge_x$:H to a-$Si_{1-y}C_y$:H were formed to constitute a multiplying region 713. Next, an n-type a-$Si_{1-x}Ge_x$:H layer 714 (light-shielding layer) was formed and separated into picture elements to form the light-absorbing layer a-$Si_{1-x}Ge_x$:H layer 715, a p-type a-$Si_{1-x}Ge_x$:H layer 716 of narrow gap formed in place of the light-absorbing layer in Example 6 and a transparent electrode 717 for applying a bias on a sensor formed.

Also, a collector electrode 718 is ohmic connected to the back of the substrate 701.

Accordingly, the equivalent circuit of one picture element, as shown in FIG. 24, has a p-channel MOS transistor 732, a capacitor 733 and the same photoelectric transfer device 734 as in Example 7 connected to the base of a bipolar transistor 731 constituted of crystalline silicon, and represented by a terminal 735 for applying potential to the base, a terminal 736 for driving a p-channel MOS transistor 732 and a capacitor 733, a sensor electrode 737, an emitter electrode 738, and a collector electrode 739.

FIG. 25 is a circuit constitutional view having the one picture element cells 740 shown in FIG. 23 and FIG. 24 arranged into a two-dimensional matrix of $3 \times 3$.

The actuation is the same as in Example 3 and therefore description of the actuation is omitted.

As described above, according to the photoelectric transfer device of this Example, by constituting a light-absorbing layer which has a narrow band gap of Eg1 and absorbs light, an n-electroconductive layer with a band gap of Eg5, a multiplying layer comprising a plurality of layers having a step-back structure in which the band gaps of the minimum band gap Eg2, the maximum band gap Eg3 are continuously varied which multiplies the carriers formed by absorption of light successively laminated so as to be sandwiched between charge injection preventing layers, the carriers formed in the light-absorbing layer can be smoothly transported to give high speed response characteristic similar to photodiode, because the n-electroconductive layer placed between the light-absorbing layer and the multiplying layer has the function as the reverse bias layer. Further, by making the band gap Eg1 of the above light-absorbing layer and the band gap Eg5 of the above n-electroconductive layer approximately equal, band mismatching of the light-absorbing layer, the multiplying layer and the various problems caused thereby can be cancelled to prevent lowering in high speed response characteristic caused by troubles to running performance of carriers, etc. with the light-absorbing layer due to formation of interface level, etc., whereby high speed response characteristic similar to a photodiode having no multiplying layer could be obtained. At the same time, by making the band gap Eg1 of the light-absorbing layer the band gap corresponding particularly to the IR portion light, the IR portion light could be endowed with high sensitivity. Also, incidence onto the multiplying layer was reduced to reduce fluctuation in multiplying ratio because of light incidence onto the multiplying layer.

Further, by constituting constituent elements such as the light-absorbing layer, n-photoconductive layer, the multiplying layer, the charge injection preventing layer of the photoelectric transfer device of the present invention of a non-monocrystalline material containing at least Si atoms, it becomes possible to control easily band gap and effect low temperature lamination, whereby various problems caused to occur by lamination could be cancelled.

EXAMPLE 10

Figure 33:
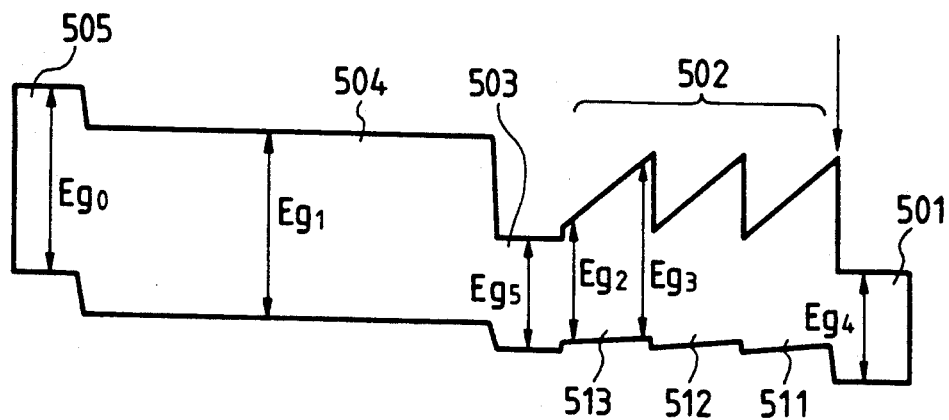
FIG. 33 is a structural illustration of the energy band during no biasing of the photoelectric transfer device of the present invention.
Figure 34:
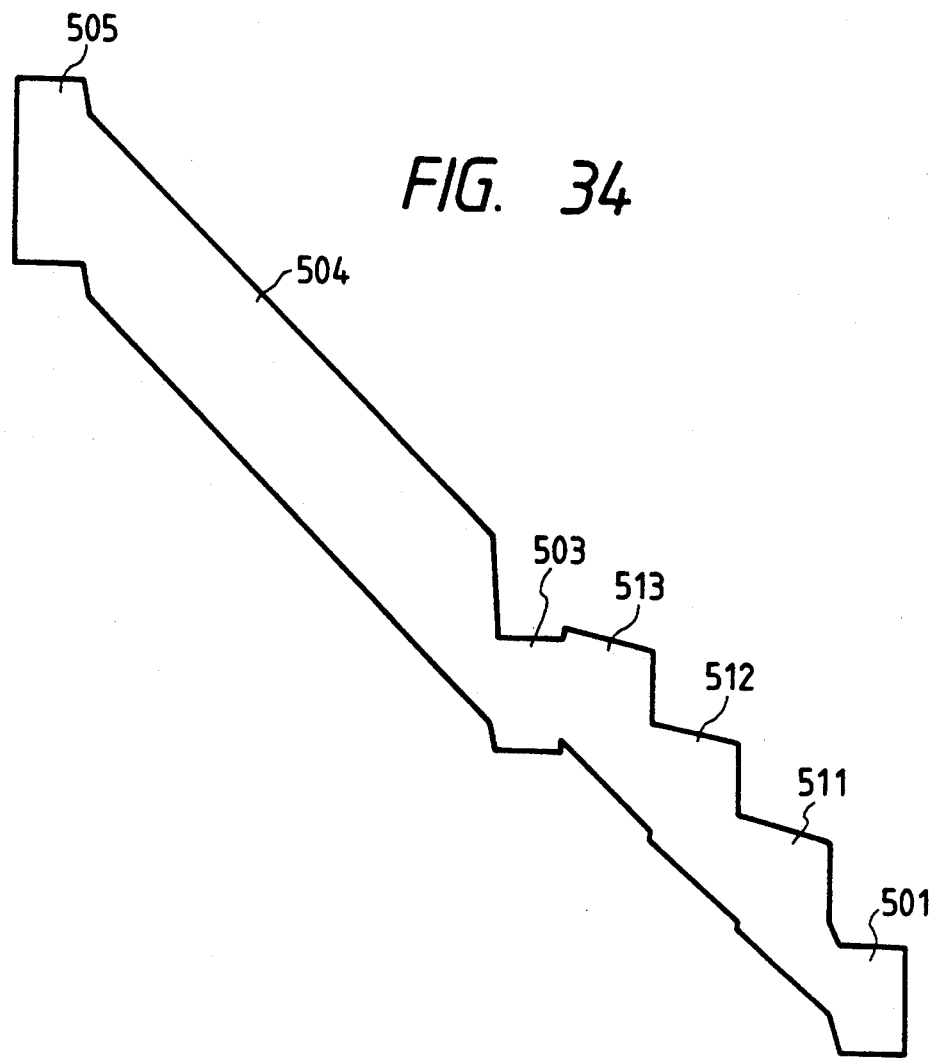
FIG. 34 is a structural illustration of the energy band during bias application of the photoelectric transfer device of the present invention.

The tenth Example of the present invention is described by referring to FIG. 5, FIG. 33 and FIG. 34.

FIG. 5 is a schematic longitudinal sectional structure view showing the tenth example of the photoelectric transfer device of the present invention.

The photoelectric transfer device shown in FIG. 5 has a Cr electrode 401, a charge injection preventing layer 402 comprising n-type a-$Si_{1-x}Ge_x$:H with a thickness of about 500 Å for preventing injection of positive holes, a multiplying region 403 having layers with various compositions of a-$Si_{1-x}Ge_x$:H to a-$Si_{1-y}C_y$:H laminated for effecting carrier multiplying, an n-type a-$Si_{1-x}Ge_x$:H layer (light-shielding layer) 404 for preventing penetration of light into the multiplying region and improving running of carriers by intensifying the internal electrical field of the light-absorbing layer, a light-absorbing layer 405 comprising a-$Si_{1-y}C_y$:H with a thickness of about 1 μm for generation of carriers by absorption of light which is broader in band gap than the above light-shielding layer 404, a charge injection preventing layer 406 comprising p-type a-$Si_{1-y}C_y$:H with a thickness of about 100 Å for preventing electron injection, a transparent electrode 407 composed mainly of indium oxide.

The Cr electrode 401 and the transparent electrode 407 were prepared by EB vapor deposition, while the amorphous layers of the charge injection preventing layer 402, the multiplying layer 403, the n-type a-$Si_{1-x}Ge_x$:H layer 404, the light-absorbing layer 405 and the charge injection preventing layer 406 were prepared by the plasma CVD method. For the starting gases during preparation of the amorphous layers, SiH$_4$, GeH$_4$, PH$_3$, H$_2$ were employed for the charge injection preventing layer 402 and the n-type a-$Si_{1-x}Ge_x$:H layer 404, SiH$_4$, GeH$_4$, CH$_4$, H$_2$ for the multiplying region 403, SiH$_4$, CH$_4$, H$_2$ for the light-absorbing layer 405, and SiH$_4$, CH$_4$, B$_2$H$_6$, H$_2$ for the charge injection preventing layer 406.

The multiplying region 403 was formed of the three layers of the layers 411, 412, 413 with varied compositions with a thickness of 200 Å in which the gas flow rates of CH$_4$ and GeH$_4$ of the starting gases were continuously varied, and the band gap was varied continuously from about 1.3 eV to about 2.3 eV. The gas flow rate of PH$_3$ during formation of the n-type a-$Si_{1-x}Ge_x$:H layer 404 was made slightly smaller than in the charge injection preventing layer 402.

The energy band structure of the photoelectric converting device in the tenth Example shown in FIG. 5 is ideally as shown in FIG. 33 and FIG. 34.

FIG. 33 is the energy band chart when the photoconverting device of the tenth Example is under no bias state, and FIG. 34 the energy band chart under the state applied with a bias for performing carrier multiplying actuation.

FIG. 33 and FIG. 34 show that the band gap of the n-type a-$Si_{1-x}Ge_x$:H layer 501 is Eg4, the minimum band gap of the multiplying layer 502 comprising the three layers with varied composition layers 511, 512, 513 of a-$Si_{1-x}Ge_x$:H with a band gap of about 1.3 eV to a-$Si_{1-y}C_y$:H with a band gap of about 2.4 V is Eg2, the maximum band gap of the multiplying region 502 is Eg3, the band gap of the n-type a-$Si_{1-x}Ge_x$:H layer 503 Eg5, the band gap of the a-$Si_{1-y}C_y$:H layer 504 Eg1, the band gap of the p-type a-$Si_{1-y}C_y$:H layer 505 Eg0.

In FIG. 33, although there are incontinuous points of energy in both of the conduction band end and the valence band end, there is substantially no barrier due to energy incontinuity in the running direction under the state applied with a bias voltage as can be also seen from FIG. 34, thus not interfering with running performance of the carrier.

Here, the C composition ratio y of the a-$Si_{1-y}C_y$:H layers 504, 503 prepared was about 0.4, and the band gaps Eg1, Eg0 were both about 2.3 eV. The layer giving the maximum band gap Eg3 of the varied composition layers 511, 512, 513 prepared was also a-$Si_{1-y}C_y$:H, and Eg3 was about 2.3 eV.

The a-$Si_{1-x}Ge_x$:H layers 501 and 503 had a Ge composition ratio x of about 0.6, and the band gap Eg4 was about 1.3 eV. The layer giving the minimum band gap Eg2 of the varied composition layers 511, 512, 513 was also a-$Si_{1-x}Ge_x$:H layer, and Eg2 was also about 1.3 eV.

Further, the photoabsorption coefficient of the light-absorbing layer 503 is about $4 \times 10^3$ cm$^{-1}$ to the light with a wavelength of 540 nm, about $3 \times 10^4$ cm$^{-1}$ or more to the light with a wavelength of 350 nm, whereby absorption of the light at the UV portion could be sufficiently done.

The multiplying ratio of the present device was found to be about 10-fold or more when a bias of 10 V was applied.

There was no change in multiplying ratio even when the wavelength was varied to the visible light with wavelength of 400 nm or shorter.

Further, the leak current during dark was as low as about 1 nA/cm$^2$ or less during bias application of 10 V.

Still further, the light response speed was high, being equal to the pin-type photoelectric transfer device without the multiplying layer 502.

EXAMPLE 11

Figure 35:
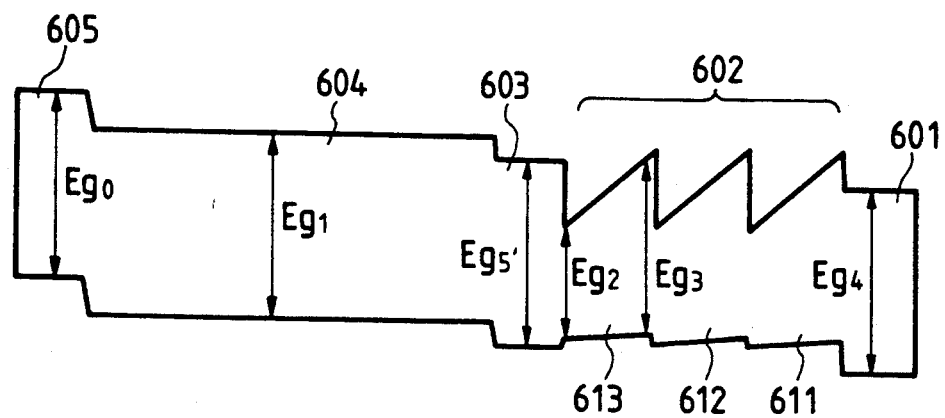
FIG. 35 is a structural illustration of the energy band during no biasing of the photoelectric transfer device of the present invention.
Figure 36:
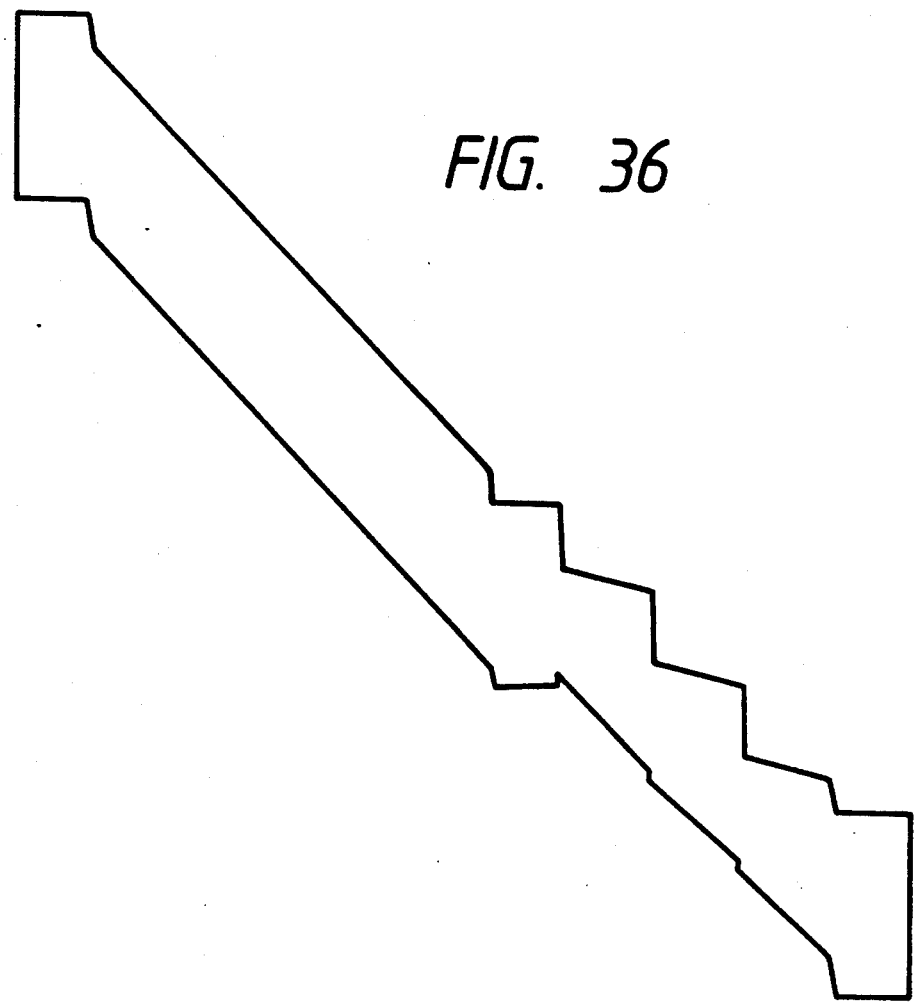
FIG. 36 is a structural illustration of the energy band during bias application of the photoelectric transfer device of the present invention.

By referring to FIG. 35 and FIG. 36, the eleventh Example of the present invention is described.

FIG. 35 and FIG. 36 are energy band structure ideally estimated of the eleventh Example of the present invention.

FIG. 35 is an energy band chart when the photoelectric transfer device of the eleventh example is under no bias state, FIG. 36 an energy band chart under the state when a bias is applied for performing carrier multiplying actuation.

The photoelectric transfer device shown in FIG. 35 is the same as in FIG. 33 except for having an n-type a-Si$_{1-y}$C$_y$:H layer 601 with a wide gap of band gap Eg4' and having an n-type a-Si$_{1-y}$C$_y$:H layer 603 with a wide gap of band gap Eg5', and it is shown that the minimum band gap of the multiplying region 602 comprising the three layers of the composition varied layers 611, 612, 613 of a-Si$_{1-x}$Ge$_x$:H to a-Si$_{1-y}$C$_y$:H is Eg2, the maximum band gap Eg3, the band gap of the a-Si$_{1-y}$C$_y$:H layer 604 Eg1, the p-type a-Si$_{1-y}$C$_y$:H 605 Eg0.

The multiplying ratio of the present device was found to be about 10-fold or more when a bias of 10 V was applied.

There was no change in multiplying ratio even when the wavelength was varied to the UV portion light with wavelength of 400 nm or shorter.

Further, the leak current during dark was as low as about 0.1 nA/cm$^2$ or less when a bias of 10 V was applied.

Still further, the light response speed was high, being equal to the pin-type photoelectric transfer device without the multiplying layer 602.

EXAMPLE 12

This Example is an example in which the light-absorbing layer of the photoelectric transfer device was laminated on the scanning circuit, the reading circuit in the same manner as in Example 6 except for making the band gap of the light absorbing layer larger than that of the light shielding layer.

FIG. 23 is a schematic sectional view around the light-receiving portion of an example of the present invention, FIG. 24 the equivalent circuit diagram of one picture element, FIG. 25 the equivalent circuit and block circuit diagrams of the whole device.

First, a subbing circuit substrate having a transistor was formed in the same manner as in Example 3.

Subsequently, the composition varied layers 721, 722, 723 of a-Si$_{1-x}$Ge$_x$: H to a-Si$_{1-y}$C$_y$: H were formed to constitute a multiplying region 713. Next, an n-type a-Si$_{1-x}$Ge$_x$: H layer 714 was formed and separated into picture elements to form the light-absorbing layer a-Si$_{1-y}$C$_y$: H layer 715, a p-type a-Si$_{1-y}$C$_y$: H layer 716 formed and a transparent electrode 717 for applying a bias on a sensor formed.

Also, a collector electrode 718 is ohmic connected to the back of the substrate 701.

Accordingly, the equivalent circuit of one picture element, as shown in FIG. 24, has a p-channel MOS transistor 732, a capacitor 733 and the same photoelectric transfer device 734 as in Example 10 connected to the base of a bipolar transistor constituted of crystalline silicon, and represented by a terminal 735 for applying potential to the base, a terminal 736 for driving a p-channel MOS transistor 732 and a capacitor 733, a sensor electrode 737, an emitter electrode 738, and a collector electrode 739.

FIG. 25 is a circuit constitutional view having the one picture element cell 740 shown in FIG. 23 and FIG. 24 arranged into a two-dimensional matrix of 3×3.

The actuation is the same as in Example 3 and therefore description of the actuation is omitted.

According to the photoelectric transfer device of this Example, by constituting a light-absorbing layer which has a band gap of Eg1 and absorbs light, an n-electroconductive layer (light-shielding layer) with a band gap of Eg5, a multiplying layer comprising one or a plurality of layers having a step-back structure in which the band gaps of the minimum band gap Eg2, the maximum band gap Eg3 are continuously varied which multiplies the carriers formed by absorption of light successively laminated so as to be sandwiched between charge injection preventing layers, the carriers formed in the light-absorbing layer can be smoothly transported to give high speed response characteristic similar to photodiode, because the n-electroconductive layer placed between the light-absorbing layer and the multiplying layer has the function as the reverse bias layer. Further, by making the band gap Eg1 of the above light-absorbing layer so as to surpass the band gap Eg5 of the above n-electroconductive layer, band mismatching of the light-absorbing layer, the multiplying layer and the various problems caused thereby can be cancelled to prevent lowering in high speed response characteristic caused by troubles to running performance of carriers, etc. with the light-absorbing layer due to formation of interface level, etc., whereby high speed response characteristic similar to a photodiode having no multiplying layer could be obtained. At the same time, by making the band gap Eg1 of the light-absorbing layer the band gap corresponding particularly to the UV portion light, the UV portion light could be endowed with high sensitivity.

Also, when the band gap Eg5 of the n-electroconductive layer has a narrow band gap, incidence onto the multiplying layer is reduced, and therefore fluctuation in multiplying ratio can be reduced.

Also, by selection of the layer number of the step-back structure, 2 or more amplification ratios can be obtained, and also low noise can be obtained.

Further, by constituting constituent elements such as the light-absorbing layer, n-photoconductive layer, the multiplying layer, the charge injection preventing layer of the photoelectric transfer device of the present invention of a non-monocrystalline material containing at least Si atoms, it becomes possible to control easily band gap and effect low temperature lamination, whereby various problems caused to occur by lamination could be cancelled.

EXAMPLE 13

Figure 37:
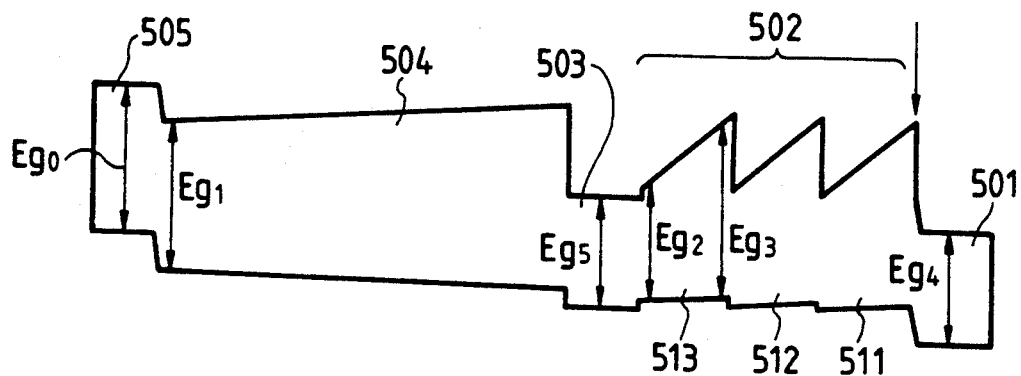
FIG. 37 is a structural illustration of the energy band during no biasing of the photoelectric transfer device of the present invention.
Figure 38:
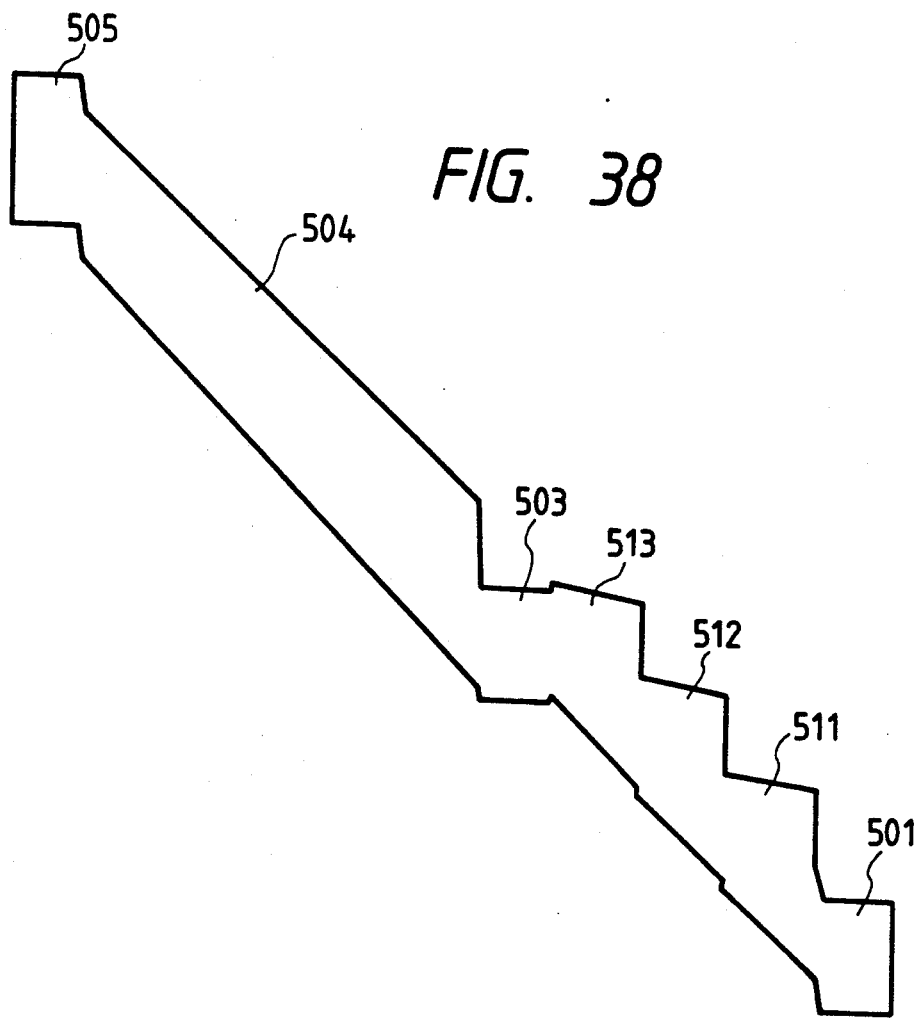
FIG. 38 is a structural illustration of the energy band during bias application of the photoelectric transfer device of the present invention.

The 13th Example of the present invention is described by referring to FIG. 5, FIG. 37 and FIG. 38.

FIG. 5 is a schematic longitudinal sectional structure view showing the 13th example of the photoelectric transfer device of the present invention.

The photoelectric transfer device shown in FIG. 5 has a Cr electrode 401, a charge injection preventing layer 402 comprising n-type a-$Si_{1-x}Ge_x$:H with a thickness of about 500 Å for preventing injection of positive holes, a multiplying region 403 having layers with various compositions of a-$Si_{1-x}Ge_x$:H to a-$Si_{1-y}C_y$:H for effecting carrier multiplying, an n-type a-$Si_{1-x}Ge_x$:H layer (light-shielding layer) 404 for preventing penetration of light into the multiplying region and improving running of carriers by intensifying the internal electrical field of the light-absorbing layer, a light-absorbing layer 405 with varied compositions of a-Si:H to a-$Si_{1-y}C_y$:H with a thickness of about 2 μm for generation of carriers by absorption of light, a charge injection preventing layer 406 comprising p-type a-Si:H with a thickness of about 100 Å for preventing electron injection, a transparent electrode 407 composed mainly of indium oxide.

The Cr electrode 401 and the transparent electrode 407 were prepared by EB vapor deposition, while the amorphous layers of the charge injection preventing layer 402, the multiplying layer 403, the n-type a-$Si_{1-x}Ge_x$:H layer 404, the light-absorbing layer 405 and the charge injection preventing layer 406 were prepared by the plasma CVD method. For the starting gases during preparation of the amorphous layers, $SiH_4$, $GeH_4$, $PH_3$, $H_2$ were employed for the charge injection preventing layer 402 and the n-type a-$Si_{1-x}Ge_x$:H layer 404, $SiH_4$, $GeH_4$, $CH_4$, $H_2$ for the multiplying region 403, $SiH_4$, $CH_4$, $H_2$ for the light-absorbing layer 405, and $SiH_4$, $B_2H_6$, $H_2$ for the charge injection preventing layer 406.

The multiplying region 403 was formed of the three layers of the layers 411, 412, 413 with varied compositions with a thickness of 200 Å in which the gas flow rates of $CH_4$ and $GeH_4$ of the starting gases were continuously varied. The gas flow rate of $PH_3$ during formation of the n-type a-$Si_{1-x}Ge_x$:H layer 404 was made slightly smaller than in the charge injection preventing layer 402. The light-absorbing layer 405 is formed by varying continuously the gas flow rate of $CH_4$ of the starting gases.

The energy band structure of the photoelectric converting device in the 13th Example shown in FIG. 5 is ideally as shown in FIG. 37 and FIG. 38.

FIG. 37 is the energy band chart when the photoconverting device of the 13th Example is under no bias state, and FIG. 38 the energy band chart under the state applied with a bias for performing carrier multiplying actuation.

FIG. 37 and FIG. 38 show that the band gap of the n-type a-$Si_{1-x}Ge_x$:H layer 501 is Eg4, the minimum band gap of the multiplying layer 502 comprising the three layers with varied composition layers 511, 512, 513 of a-$Si_{1-x}Ge_x$:H to a-$Si_{1-y}C_y$:H is Eg2, the maximum band gap of the multiplying region 502 is Eg3, the band gap of the n-type a-$Si_{1-x}Ge_x$:H layer 503 Eg5, the minimum band gap of the layer 504 with varied compositions of a-Si:H to a-$Si_{1-y}C_y$:H Eg1, the band gap of the p-type a-Si:H layer 505 Eg0.

In FIG. 37, although there are incontinuous points of energy in both of the conduction band end and the valence band end, there is substantially no barrier due to energy incontinuity in the running direction under the state applied with a bias voltage as can be also seen from FIG. 38, thus not interfering with running performance of the carrier.

Here, the layer giving the maximum band gap Eg3 of the varied composition layers 511, 512, 513 prepared was a-$Si_{1-y}C_y$:H with a C composition ratio y of about 0.4, and Eg3 was about 2.3 eV. The layer which gives the maximum band gap of the layer 504 with varied compositions of a-Si:H to a-$Si_{1-y}C_y$:H was also a-$Si_{1-y}C_y$:H.

The a-$Si_{1-x}Ge_x$:H layers 501 and 503 had a Ge composition ratio x of about 0.6, and the band gap Eg4 was about 1.3 eV. The layer giving the minimum band gap Eg2 of the varied composition layers 511, 512, 513 was also a-$Si_{1-x}Ge_x$:H layer, and Eg2 was also about 1.3 eV. The layer giving the minimum band gap Eg1 of the layer 504 with varied compositions of a-Si:H to a-$Si_{1-y}C_y$:H was a-Si:H, and Eg1 was about 1.8 eV. The band gap width Eg0 of the p-type a-Si:H layer 505 was also about 1.8.

Further, the photoabsorption coefficient of the light-absorbing layer 504 is about $6 \times 10^3$ cm$^{-1}$ to the light with a wavelength of 700 nm, about $3 \times 10^4$ cm$^{-1}$ or more to the light with a wavelength of 350 nm, whereby absorption of the light at the visible portion could be sufficiently done.

The multiplying ratio of the present device was found to be about 10-fold or more when a bias of 10 V was applied.

There was no change in multiplying ratio even when the wavelength was varied from the visible light to the UV portion with wavelength of 700 nm or shorter.

Further, the leak current during dark was as low as about 1 nA/cm$^2$ or less during bias application of 10 V.

Still further, the light response speed was high, being equal to the pin-type photoelectric transfer device without the multiplying layer 502.

EXAMPLE 14

Figure 39:
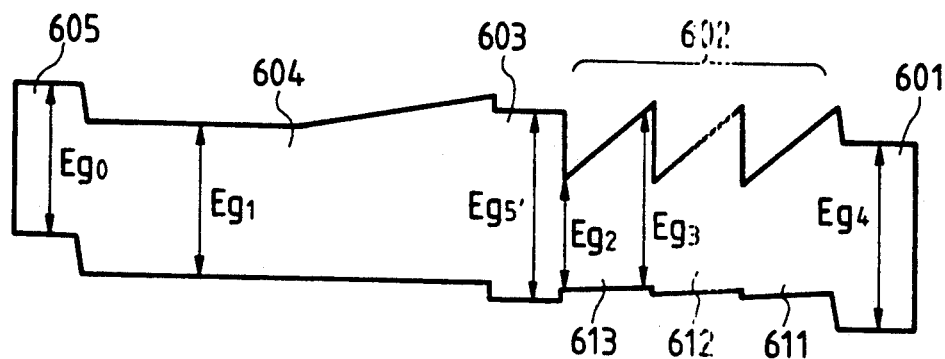
FIG. 39 is a structural illustration of the energy band during no biasing of the photoelectric transfer device of the present invention.
Figure 40:
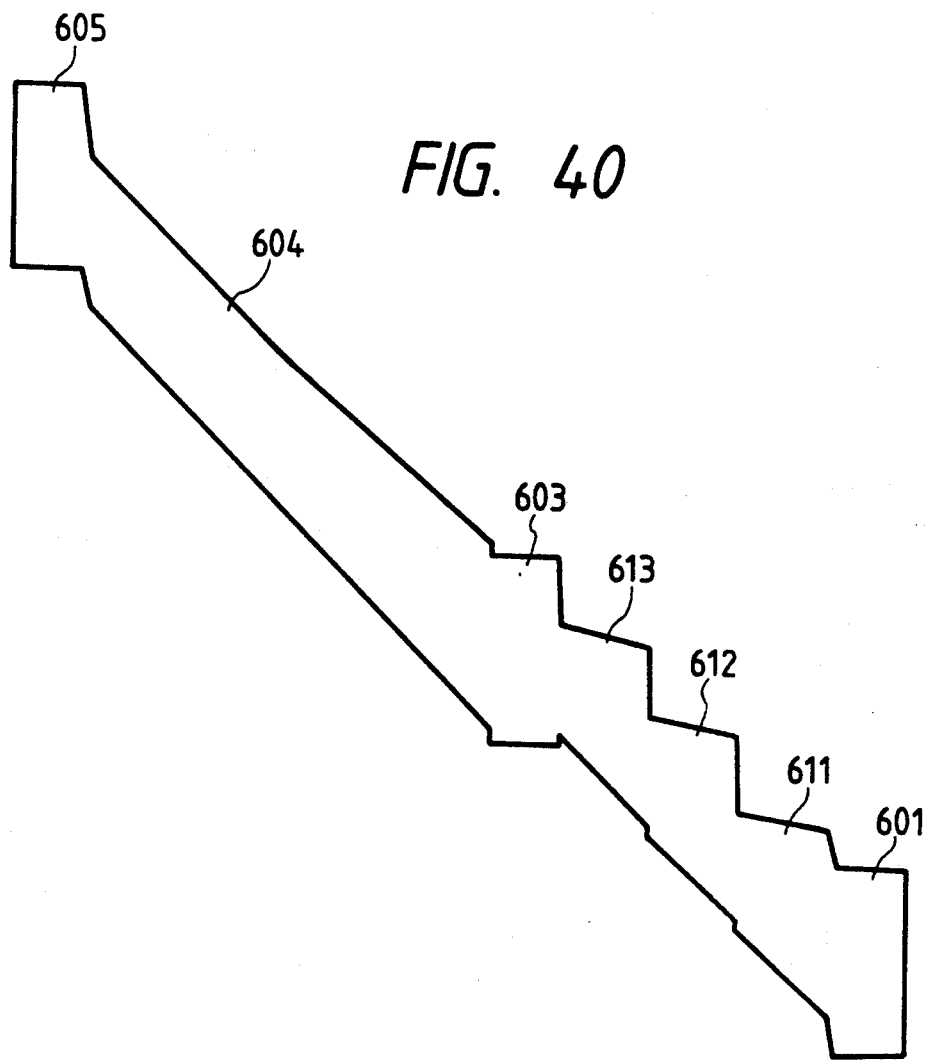
FIG. 40 is a structural illustration of the energy band during bias application of the photoelectric transfer device of the present invention.

By referring to FIG. 39 and FIG. 40, the 14th Example of the present invention is described.

FIG. 39 and FIG. 40 are energy band structure ideally estimated of the 14th Example of the present invention.

FIG. 39 is an energy band chart when the photoelectric transfer device of the 14th example is under no bias state, FIG. 40 an energy band chart under the state when a bias is applied for performing carrier multiplying actuation.

The photoelectric transfer device shown in FIG. 39 is the same as the photoelectric transfer device in Example 13 except for having an n-type a-$Si_{1-y}C_y$:H layer 601 with band gap Eg4', having broader region with the a-Si:H composition of the light-absorbing layer 604 than in FIG. 37, and having an n-type a-$Si_{1-y}C_y$:H layer (light-shielding layer) 603 with band gap Eg5', and it is shown that the minimum band gap of the multiplying region 602 comprising the three layers of the composition varied layers 611, 612, 613 of a-$Si_{1-x}Ge_x$:H to a-$Si_{1-y}C_y$:H is Eg2, the maximum band gap Eg3, the minimum band gap of the a-Si:H to a-$Si_{1-y}C_y$:H layer 604 Eg1, the p-type a-Si:H 605 Eg0.

The multiplying ratio of the present device was found to be about 10-fold or more when a bias of 10 V was applied.

There was no change in multiplying ratio even when the wavelength was varied from the visible portion to the UV portion light with wavelength of 700 nm or shorter.

Further, the leak current during dark was as low as about 1 nA/cm$^2$ or less when a bias of 10 V was applied.

Still further, the light response speed was high, being equal to the pin-type photoelectric transfer device without the multiplying layer 602.

EXAMPLE 15

This Example is an example in which the photoelectric transfer device shown in Example 13 was laminated on the scanning circuit, the reading circuit in the same manner as in Example 3.

FIG. 23 is a schematic sectional view around the light-receiving portion of an example of the present invention, FIG. 24 the equivalent circuit diagram of one picture element, FIG. 25 the equivalent circuit and block circuit diagrams of the whole device.

First, a subbing circuit substrate having a transistor was formed in the same manner as in Example 3.

Subsequently, the composition varied layers 721, 722, 723 of a-$Si_{1-x}Ge_x$:H to a-$Si_{1-y}C_y$:H were formed to constitute a multiplying region 713. Next, an n-type a-$Si_{1-x}Ge_x$:H layer 714 was formed and separated into picture elements to form the light-absorbing layer with varied compositions of a-Si:H to a-$Si_{1-y}C_y$:H 715, a p-type a-Si:H layer 716 formed and a transparent electrode 717 for applying a bias on a sensor formed.

Also, a collector electrode 718 is ohmic connected to the back of the substrate 701.

Accordingly, the equivalent circuit of one picture element, as shown in FIG. 24, has a p-channel MOS transistor 732, a capacitor 733 and the same photoelectric transfer device 734 as in Example 13 connected to the base of a bipolar transistor 731 connstituted of crystalline silicon, and represented by a terminal 735 for applying potential to the base, a terminal 736 for driving a p-channel MOS transistor 732 and a capacitor 733, a sensor electrode 737, an emitter electrode 738, and a collector electrode 739.

FIG. 25 is a circuit constitutional view having the one picture element cell 740 shown in FIG. 23 and FIG. 24 arranged into a two-dimensional matrix of 3×3.

The actuation is the same as in Example 3 and therefore description of the actuation is omitted.

According to the photoelectric transfer device of this Example, by constituting a light-absorbing layer which has a band gap of Eg1 and absorbs light, an n-electroconductive layer with a band gap of Eg5, a multiplying layer comprising one or a plurality of layers having a step-back structure in which the band gaps of the minimum band gap Eg2, the maximum band gap Eg3 are continuously varied which multiplies the carriers formed by absorption of light successively laminated so as to be sandwiched between charge injection preventing layers, the carriers formed in the light-absorbing layer can be smoothly transported to give high speed response characteristic similar to photodiode, and further the above band gap Eg1 of the light-absorbing layer changes so as to become continuously greater from one charge injection preventing layer side, because the n-electroconductive layer placed between the light-absorbing layer and the multiplying layer has the function as the reverse bias layer. Consequently, by making the band gap Eg1 of the light-absorbing layer nearby the n-electroconductive layer larger tan the band gap Eg5 of the n-electroconductive layer, band mismatching of the light-absorbing layer, the multiplying layer and the various problems caused thereby can be cancelled to prevent lowering in high speed response characteristic caused by troubles to running performance of carriers, etc. with the light-absorbing layer due to formation of interface level, etc., whereby high speed response characteristic similar to a photodiode having no multiplying layer could be obtained. At the same time, by making the band gap Eg1 of the light-absorbing layer the band gap corresponding particularly to the UV portion light, the UV portion light could be endowed with high sensitivity.

Also, when the band gap Eg5 of the n-electroconductive layer has a narrow band gap, incidence onto the multiplying layer is reduced, and therefore fluctuation in multiplying ratio can be reduced.

Also, by selection of the layer number of the step-back structure, 2 or more amplification ratios can be obtained, and also low noise can be obtained.

Further, by constituting constituent elements such as the light-absorbing layer, n-photoconductive layer, the multiplying layer, the charge injection preventing layer of the photoelectric transfer device of the present invention of a non-monocrystalline material containing at least Si atoms, it becomes possible to control easily band gap and effect low temperature lamination, whereby various problems caused to occur by lamination could be cancelled.

EXAMPLE 16

Figure 41:
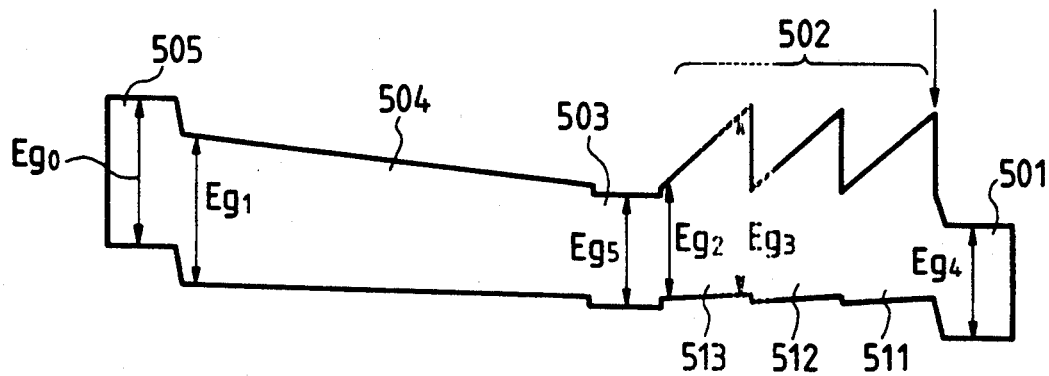
FIG. 41 is a structural illustration of the energy band during no biasing of the photoelectric transfer device of the present invention.
Figure 42:
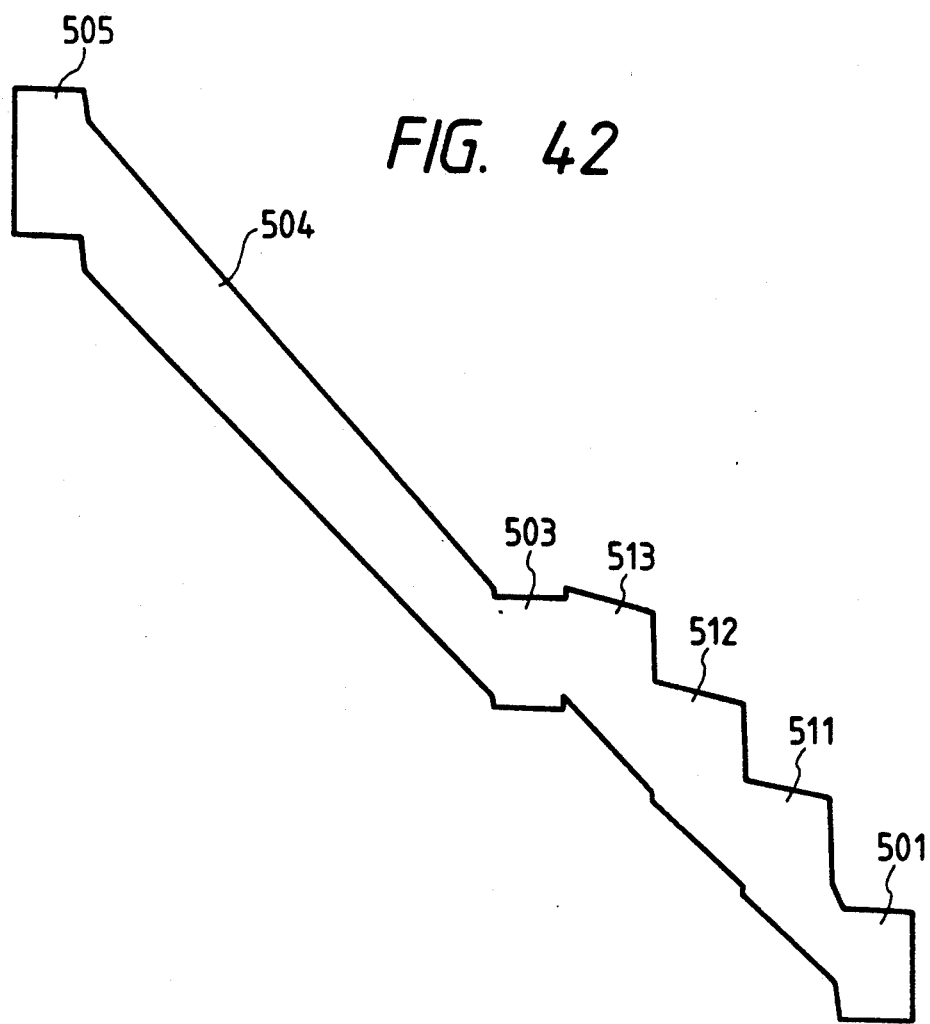
FIG. 42 is a structural illustration of the energy band during bias application of the photoelectric transfer device of the present invention.

The 16th Example of the present invention is described by referring to FIG. 5, FIG. 41 and FIG. 42.

FIG. 5 is a schematic longitudinal sectional structure view showing the 16th example of the photoelectric transfer device of the present invention.

The photoelectric transfer device shown in FIG. 5 has a Cr electrode 401, a charge injection preventing layer 402 comprising n-type a-$Si_{1-x}Ge_x$:H with a thickness of about 500 Å for preventing injection of positive holes, a multiplying region 403 with various compositions of a-$Si_{1-x}Ge_x$:H to a-$Si_{1-y}C_y$:H for effecting carrier multiplying, an n-type a-$Si_{1-x}Ge_x$:H layer (light-shielding layer) 404 for preventing penetration of light into the multiplying region and improving running of carriers by intensifying the internal electrical field of the light-absorbing layer, a light-absorbing layer 405 with varied compositions of a-Si:H to a-$Si_{1-x}Cx$:H with a thickness of about 1 μm for generation of carriers by absorption of light, a charge injection preventing layer 406 comprising p-type a-Si:H with a thickness of about 100 Å for preventing electron injection, a transparent electrode 407 composed mainly of indium oxide.

The Cr electrode 401 and the transparent electrode 407 were prepared by EB vapor deposition, while the amorphous layers of the charge injection preventing layer 402, the multiplying layer 403, the n-type a-$Si_{1-x}Ge_x$:H layer 404, the light-absorbing layer 405 and the charge injection preventing layer 406 were prepared by the plasma CVD method. For the starting gases during preparation of the amorphous layers, $SiH_4$, $GeH_4$, $PH_3$, $H_2$ were employed for the charge injection preventing layer 402 and the n-type a-$Si_{1-x}Ge_x$:H layer 404, $SiH_4$, $GeH_4$, $CH_4$, $H_2$ for the multiplying region 403, $SiH_4$, $GeH_4$, $H_2$ for the light-absorbing layer 405, and $SiH_4$, $B_2H_6$, $H_2$ for the charge injection preventing layer 406.

The multiplying region 403 was formed of the three layers of the layers 411, 412, 413 with varied compositions with a thickness of 200 Å in which the gas flow rates of $CH_4$ and $GeH_4$ of the starting gases were continuously varied. The gas flow rate of $PH_3$ during formation of the n-type a-$Si_{1-x}Ge_x$:H layer 404 .as made slightly smaller than in the charge injection preventing layer 402. The light-absorbing layer 405 is formed by varying continuously the gas flow rate of GeH$_4$ of the starting gases.

The energy band structure of the photoelectric transfer device in the 16th Example shown in FIG. 5 is ideally as shown in FIG. 41 and FIG. 42.

FIG. 41 is the energy band chart when the photoconverting device of the 16th Example is under no bias state, and FIG. 42 the energy band chart under the state applied with a bias for performing carrier multiplying actuation.

FIG. 41 and FIG. 42 show that the band gap of the n-type a-Si$_{1-x}$Ge$_x$:H layer 501 is Eg4, the minimum band gap of the multiplying layer 502 comprising the three layers with varied composition layers 511, 512, 513 of a-Si$_{1-x}$Ge$_x$:H to a-Si$_{1-y}$C$_y$:H is Eg2, the maximum band gap of the multiplying region 502 Eg3, the band gap of the n-type a-Si$_{1-x}$Ge$_x$:H layer 503 Eg5, the maximum band gap of the a-Si:H to a-Si$_{1-x}$C$_x$:H layer 504 Eg1, the band gap of the p-type a-Si:H layer 505 Eg0.

In FIG. 41, although there are incontinuous points of energy in both of the conduction band end and the valence band end, there is substantially no barrier due to energy incontinuity in the running direction under the state applied with a bias voltage as can be also seen from FIG. 42, thus not interfering with running performance of the carrier.

Here, the layer giving the maximum band gap Eg3 of the varied composition layers 511, 512, 513 prepared was a-Si$_{1-y}$C$_y$:H with a C composition ratio y of about 0.4, and Eg3 was about 2.3 eV.

The Ge composition ratio x of the a-Si$_{1-x}$Ge$_x$:H layers 501 and 503 was about 0.6, and the band gap Eg4 was about 1.3 eV. The layer giving the minimum band gap Eg2 of the varied composition layers 511, 512, 513 was also a-Si$_{1-x}$Ge$_x$:H layer, and Eg2 was also about 1.3 eV. The layer giving the minimum band gap of the layer 504 was also a-Si$_{1-x}$Ge$_x$:H. The layer giving the maximum band gap Eg1 of the layer 504 was a-Si:H and Eg1 was about 1.8 eV. The band gap width Eg0 of the layer 505 was also about 1.8 eV.

Further, the photoabsorption coefficient of the light-absorbing layer 504 is about $1 \times 10^5$ cm$^{-1}$ or more to the light with a wavelength of 400 nm, about $2 \times 10^4$ cm$^{-1}$ or more to the light with a wavelength of 1000 nm, whereby absorption of the light at IR portion, the visible portion, the UV portion could be sufficiently done.

The multiplying ratio of the present device was found to be about 10-fold or more when a bias of 10 V was applied.

There was no change in multiplying ratio even when the wavelength was varied from the visible light to the UV portion with wavelength of 1000 nm or shorter.

Further, the leak current during dark was as low as about 1 nA/cm$^2$ or less during bias application of 10 V.

Still further, the light response speed was high, being equal to the pin-type photoelectric transfer device without the multiplying layer 502.

EXAMPLE 17

Figure 43:
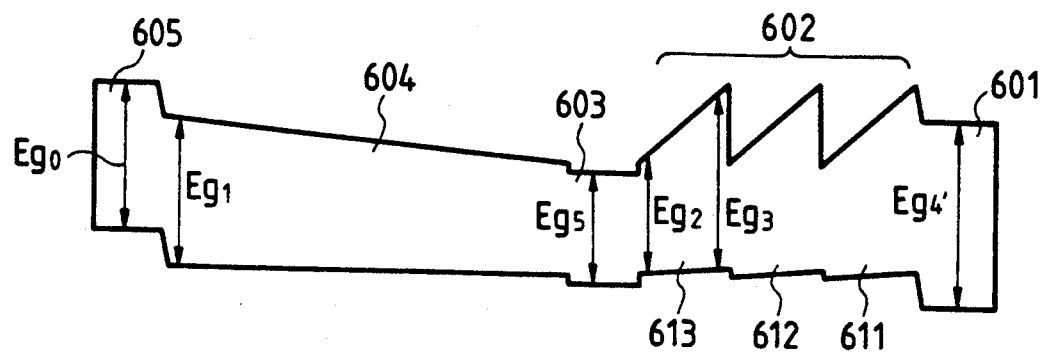
FIG. 43 is a structural illustration of the energy band during no biasing of the photoelectric transfer device of the present invention.
Figure 44:
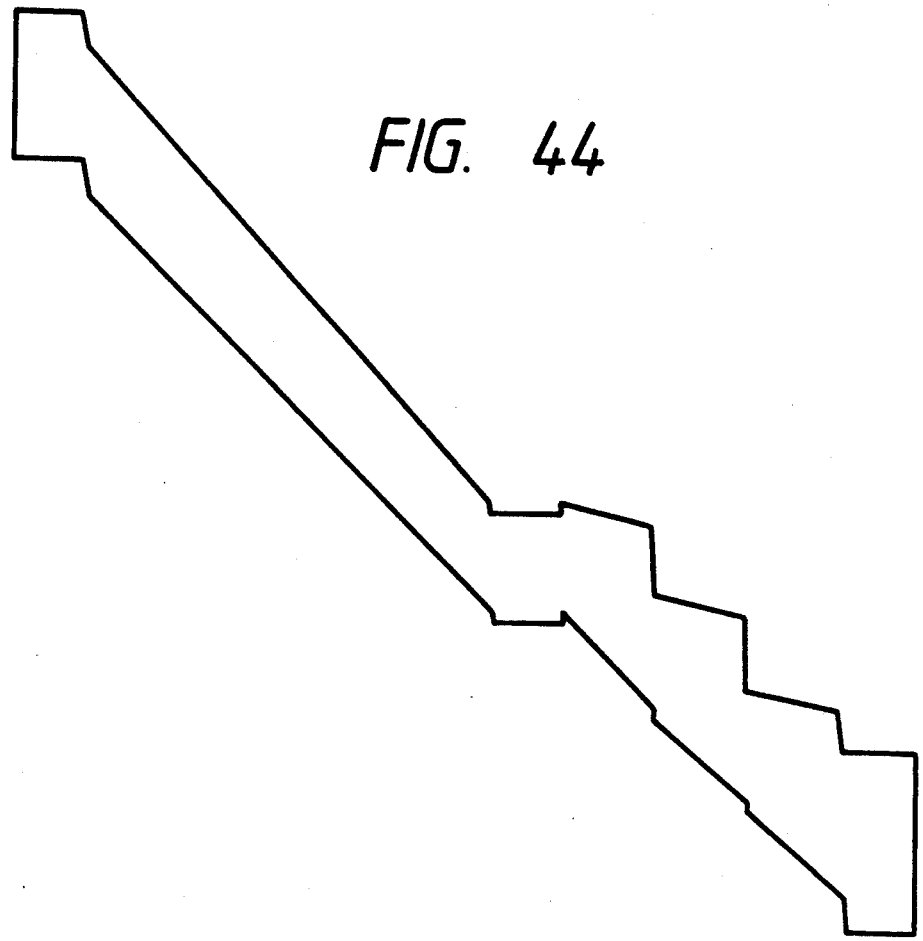
FIG. 44 is a structural illustration of the energy band during bias application of the photoelectric transfer device of the present invention.

By referring to FIG. 43 and FIG. 44, the 17th Example of the present invention is described.

FIG. 43 and FIG. 44 are energy band structure ideally estimated of the 17th Example of the present invention.

FIG. 43 is an energy band chart when the photoelectric transfer device of the 17th example is under no bias state, FIG. 44 an energy band chart under the state when a bias is applied for performing carrier multiplying actuation.

The photoelectric transfer device shown in FIG. 43 is the same as the photoelectric transfer device in FIG. 41 except for having an n-type a-Si$_{1-y}$C$_y$:H layer 601 with band gap Eg4' of a wide gap, having broader region with the a-Si:H composition of the light-absorbing layer 604 than in FIG. 41. The band gaps of the respective layers are shown to be the minimum band gap of the multiplying region 602 comprising the three layers of the composition varied layers 611, 612, 613 of a-Si$_{1-x}$Ge$_x$:H to a-Si$_{1-y}$C$_y$:H of Eg2, the maximum band gap Eg3, the band gap of the n-type a-Si$_{1-x}$Ge$_x$:H layer 603 Eg5, the maximum band gap of the a-Si:H to a-Si$_{1-x}$Ge$_x$:H layer 604 Eg1, the band gap of p-type a-Si:H 605 Eg0.

The multiplying ratio of the present device was found to be about 10-fold or more when a bias of 10 V was applied.

There was no change in multiplying ratio even when the wavelength was varied from the visible portion to the UV portion light with wavelength of 1000 nm or shorter.

Further, the leak current during dark was as low as about 1 nA/cm$^2$ or less when a bias of 10 V was applied.

Still further, the light response speed was high, being equal to the pin-type photoelectric transfer device without the multiplying layer 602.

EXAMPLE 18

This Example is an example in which the photoelectric transfer device shown in Example 16 was laminated on the scanning circuit, the reading circuit in the same manner as in Example 3.

FIG. 23 is a schematic sectional view around the light-receiving portion of an example of the present invention, FIG. 24 the equivalent circuit diagram of one picture element, FIG. 25 the equivalent circuit and block circuit diagrams of the whole device.

First, a subbing circuit substrate having a transistor was formed in the same manner as in Example 3.

Subsequently, the composition varied layers 721, 722, 723 of a-Si$_{1-x}$Ge$_x$:H to a-Si$_{1-y}$C$_y$:H were formed to constitute a multiplying region 713. Next, an n-type a-Si$_{1-x}$Ge$_x$:H layer 714 was formed and separated into picture elements to form the light-absorbing layer with varied compositions of a-Si:H to a-Si$_{1-x}$C$_x$:H 715, a p-type a-Si:H layer 716 formed and a transparent electrode 717 for applying a bias on a sensor formed.

Also, a collector electrode 718 is ohmic connected to the back of the substrate 701.

Accordingly, the equivalent circuit of one picture element, as shown in FIG. 24, has a p-channel MOS transistor 732, a capacitor 733 and the same photoelectric transfer device 734 as in Example 13 connected to the base of a bipolar transistor 731 constituted of crystalline silicon, and represented by a terminal 735 for giving a potential to the base, a terminal 736 for driving a p-channel MOS transistor 732 and a capacitor 733, a sensor electrode 737, an emitter electrode 738, and a collector electrode 739.

FIG. 25 is a circuit constitutional view having the one picture element cell 740 shown in FIG. 23 and FIG. 24 arranged into a two-dimensional matrix of $3 \times 3$.

The actuation is the same as in Example 3 and therefore description of the actuation is omitted.

According to the photoelectric transfer device of this Example, by constituting a light-absorbing layer which has a band gap of Eg1 and absorbs light, an n-electroconductive layer with a band gap of Eg5, a multiplying layer comprising one or a plurality of layers having a step-back structure in which the band gaps of the minimum band gap Eg2, the maximum band gap Eg3 are continuously varied which multiplies the carriers formed by absorption of light successively laminated so as to be sandwiched between charge injection preventing layers, the carriers formed in the light-absorbing layer can be smoothly transported to give high speed response characteristic similar to photodiode, and further the above band gap Eg1 of the light-absorbing layer changes so as to become continuously smaller from one charge injection preventing layer side, because the n-electroconductive layer (light-shielding layer) placed between the light-absorbing layer and the multiplying layer has the function as the reverse bias layer. Consequently, by making the band gap Eg1 of the light-absorbing layer nearby the n-electroconductive layer approximately equal to the band gap Eg5 of the n-electroconductive layer, band mismatching of the light-absorbing layer, the multiplying layer and the various problems caused thereby can be cancelled to prevent lowering in high speed response characteristic caused by troubles to running performance of carriers, etc. with the light-absorbing layer due to formation of interface level, etc., whereby high speed response characteristic similar to a photodiode having no multiplying layer could be obtained. At the same time, by making the band gap Eg1 of the light-absorbing layer the band gap corresponding particularly to from the IR portion light to the UV portion light, the light from the IR portion to the UV portion could be endowed with high sensitivity.

Also, since an n-electroconductive layer (light-shielding layer) was provided between the light-absorbing layer and the multiplying layer, fluctuation in multiplying ratio can be reduced.

Further, by constituting constituent elements such as the light-absorbing layer, n-photoconductive layer, the multiplying layer, the charge injection preventing layer of the photoelectric transfer device of the present invention of a non-monocrystalline material containing at least Si atoms, it becomes possible to control easily band gap and effect low temperature lamination, whereby various problems caused to occur by lamination could be cancelled.

EXAMPLE 19

A photoelectric transfer device with a light-shielding layer formed of graphite was formed.

The photoelectric transfer device in this Example, as shown in the schematic longitudinal sectional structural view in FIG. 5, has a Cr-Ag alloy electrode 401, a charge injection preventing layer 402 comprising an n-type a-$Si_{0.55}Ge_{0.45}$:H with a thickness of about 500 Å for preventing injection of positive holes from said electrode, a multiplying region 403 with varied compositions of a-$Si_{1-x}Ge_x$:H to a-$Si_{1-y}C_y$:H for multiplying carriers, a light-shielding layer 404 consisting of graphite for preventing penetration of light into said multiplying region, an a-Si:H light absorbing layer 405 for generation of carriers, a charge injection preventing layer 406 comprising a p-type a-Si:H with a thickness of about 100 Å, a transparent electrode 407 comprising indium oxide and tin oxide.

On a subbing material of quartz glass is formed a Cr-Ag alloy electrode 401 according to conventional EB vapor deposition method to a thickness of about 1.1 μm, on which a charge injection preventing layer 402 with a thickness of about 500 Å was formed according to conventional plasma CVD method by use of $SiH_4$, $GeH_4$, $PH_3$, $H_2$ as the starting gases.

Subsequently, a multiplying region 403 was formed by use of the plasma CVD method by varying continuously the gas flow rates of $CH_4$ and $GeH_4$ of the starting gases ($SiH_4$, $CH_4$, $GeH_4$, $H_2$) of the three layers 411, 412, 413 each having a layer thickness of 190 Å with varied compositions comprising an a-$Si_{1-y}C_y$:H with the maximum band gap of 2.8 eV and an a-$Si_{1-x}Ge_x$:H with the minimum band gap of 1.4 eV.

On the multiplying region 403 thus formed was formed a light-shielding layer 404 comprising a polycrystalline graphite with a layer thickness of about 500 Å by use of the sputtering method.

Subsequently, on said light-shielding layer were formed according to the plasma CVD method a light-absorbing layer 405 with a layer thickness of about 1 μm by use of $SiH_4$ and $H_2$ as the starting gases and a charge injection preventing layer 406 with a layer thickness of about 100 Å by use of $SiH_4$, $B_2H_6$ and $H_2$ as the starting gases, respectively.

On said charge injection preventing layer 406 was formed a transparent electrode 407 comprising $In_2O_3$ and $SnO_2$ by the EB vapor deposition method.

The photoelectric transfer device of this Example thus formed had a multiplying ratio of about 11-fold during bias application of 12 V and a high sensitivity without change of the multiplying ratio over the whole region of visible light.

The leak current during dark was low as about 1.1 nA/$cm^2$ or less during bias application of 12 V.

Further, the light response speed was equal to that of the pin-type photoelectric transfer device without multiplying layer, enabling high speed actuation of the device.

What is claimed is:

1. A photoelectric transfer device comprising a light-absorbing region which absorbs incident light to generate carriers and a multiplying layer region which multiplies said carriers, characterized in that a light-shielding layer is provided between said light-absorbing region and said multiplying layer region, so as to prevent the incident light from impinging on the surface of said multiplying layer region.

2. The device according to claim 1, wherein said multiply layer is a layer having a step-back structure in which band gap is varied continuously from the minimum band gap Eg2 to the maximum band gap Eg3 or a laminate of a plurality of the layers.

3. The device according to claim 1, wherein said multiplying layer is formed by laminating a layer with a higher dielectric constant and a layer with a lower dielectric constant alternately.

4. The device according to claim 1, wherein said photoabsorbing layer consists of a non-monocrystalline material.

5. The device according to claim 1, wherein said multiplying layer consists of a non-monocrystalline material.

6. The device according to claim 1, further comprising a charge injection preventing layer for preventing injection of unnecessary carriers from outside into said photoelectric transfer device.

7. The device according to claim 1, wherein said light-shielding layer is a metallic material.

8. The device according to claim 1, wherein said light-shielding layer is a semiconductor material containing impurities at a high concentration.

9. The device according to claim 1, wherein said light-shielding layer is an electroconductive ceramic material.

10. The device according to claim 4, wherein the band gap Eg1 of said light-absorbing layer is substantially uniform in the layer thickness direction.

11. The device according to claim 4, wherein the band gap Eg1 of said light-absorbing layer is nonuniform in the layer thickness direction.

12. A photoelectric transfer device comprising a light-absorbing region which absorbs incident light to generate carriers and a multiplying layer region which multiplies said carriers, characterized by having:
   a first electrode;
   a first charge injection preventing layer for preventing injection of unnecessary carriers from said first electrode into the photoelectric transfer device;
   said multiplying layer region;
   a light-shielding layer for preventing the incident light from impinging the surface of said multiplying layer region;
   said light-absorbing region;
   a second charge injection preventing impeding layer for preventing injection of unnecessary carriers from a second electrode into the photoelectric transfer device; and
   said second electrode which is light-transmissive in the order mentioned.

13. The device according to claim 12, wherein said multiply layer is a layer having a step-back structure in which band gap is varied continuously from the minimum band gap Eg2 to the maximum band gap Eg3 or a laminate of a plurality of the layers.

14. The device according to claim 12, wherein said multiplying layer is formed by laminating a layer with a higher dielectric constant and a layer with a lower dielectric constant.

15. The device according to claim 12, wherein said photoabsorbing layer consists of a non-monocrystalline material.

16. The device according to claim 12, wherein said multiplying layer consists of a non-single crystalline material.

17. The device according to claim 12, wherein said light-shielding layer is a metallic material.

18. The device according to claim 12, wherein said light-shielding layer is a semiconductor material containing impurities at a high concentration.

19. The device according to claim 12, wherein said light-shielding layer is an electroconductive ceramic material.

20. The device according to claim 15, wherein the band gap Eg1 of said light-absorbing layer is substantially uniform in the layer thickness direction.

21. The device according to any one of claims 12 to 19, wherein the band gap Eg1 of said light-absorbing layer is nonuniform in the layer thickness direction.

22. A photoelectric device for outputting an electrical signal generated at a plurality of photoelectric transfer portions, comprising:
   a plurality of photoelectric transfer portions, each having a light-shielding layer between a light-absorbing region which absorbs incident light to generate carriers and a multiplying layer region which multiplies said carriers, said light-shielding layer preventing the incident light from impinging on the surface of the multiplying layer region;
   a signal output portion having at least one means selected from accumulation means for accumulating an electrical signal generated at said plurality of photoelectric transfer portions, scanning means for scanning an electrical signal generated at said plurality of photoelectric transfer portions and reading means for reading an electrical signal generated at said plurality of photoelectric transfer portions;
   wherein said plurality of photoelectric transfer portions are electrically connected to said signal output portion.

23. The device according to claim 22, wherein said multiplying layer is a layers having a step-back structure in which band gap is varied continuously from the minimum band gap Eg2 to the maximum band gap Eg3 or a laminate of a plurality of the layers.

24. The device according to claim 22, wherein said multiplying layer is formed by laminating a layer a layer with a higher dielectric constant and a layer with a lower dielectric constant alternately.

25. The device according to claim 22, wherein said photoabsorbing layer consists of a non-monocrystalline material.

26. The device according to claim 22, wherein said multiplying layer consists of a non-monocrystalline material.

27. The device according to claim 22, further comprising a charge injection preventing layer for preventing injection of unnecessary carriers from outside into said photoelectric transfer device.

28. The device according to claim 22, wherein said light-shielding layer is a metallic material.

29. The device according to claim 22, wherein said light-shielding layer is a semiconductor material containing impurities at a high concentration.

30. The device according to claim 25, wherein the band gap Eg1 of said light-absorbing layer is substantially uniform in the layer thickness direction.

31. The device according to claim 25, wherein the band gap Eg1 of said light-absorbing layer is nonuniform in the layer thickness direction.

* * * * *

UNITED STATES PATENT AND TRADEMARK OFFICE
CERTIFICATE OF CORRECTION

PATENT NO. : 5,155,351
DATED : October 13, 1992
INVENTOR(S) : MASATO YAMANOBE, ET AL.

It is certified that error appears in the above-identified patent and that said Letters Patent is hereby corrected as shown below:

COLUMN 1

Line 46, "$p^+$" should read --$p^+$-type--.

COLUMN 2

Line 11, "assay" should read --essay--.
Line 43, "tipilication" should read --tiplication--.
Line 49, "tipilication" should read --tiplication--.
Line 53, "tipilication" should read --tiplication--.

COLUMN 3

Line 30, "reaverse" should read --reverse--.
Line 47, "multiplification" should read --multiplication--.
Line 59, "light hv" should read --light h$\nu$--.

COLUMN 4

Line 33, "while," should read --while--.

COLUMN 7

Line 42, "multiplying" should read --multiplying layer--.
Line 44, "is" (second occurrence) should be deleted.

COLUMN 8

Line 47, "structual" should read --structural--.
Line 53, "structual" should read --structural--.

UNITED STATES PATENT AND TRADEMARK OFFICE
CERTIFICATE OF CORRECTION

PATENT NO. : 5,155,351
DATED : October 13, 1992
INVENTOR(S) : MASATO YAMANOBE, ET AL.

It is certified that error appears in the above-identified patent and that said Letters Patent is hereby corrected as shown below:

COLUMN 13

Line 47, "tansmission" should read --transmission--.
Line 64, "light absorb-" should read --light-absorb- --.

COLUMN 14

Line 31, "light absorbing" should read --light-absorbing--.

COLUMN 15

Line 3, "so called" should read --so-called--.

COLUMN 16

Line 12, "bang" should read --band--.

COLUMN 17

Line 4, "layers" should read --layers 42 and 44--.
Line 42, "have" should read --has--.

COLUMN 18

Line 24, "carries" should read --carriers--.
Line 40, "exempified" should read --exemplified--.
Line 46, "In.Ga.As.Sb" should be deleted.

COLUMN 19

Line 17, "wide," should read --side,--.
Line 27, "gently," should read --gentle,--.

UNITED STATES PATENT AND TRADEMARK OFFICE
CERTIFICATE OF CORRECTION

PATENT NO. : 5,155,351            Page 3 of 7
DATED : October 13, 1992
INVENTOR(S) : MASATO YAMANOBE, ET AL.

It is certified that error appears in the above-identified patent and that said Letters Patent is hereby corrected as shown below:

COLUMN 21

Line 12, "$(|\chi_1/-|\chi_2)$" should read --$(|\chi_1-|\chi_2)$--.
Line 53, "$8.0 \times 10_{18}$," should read --$8.0 \times 10^{18}$,--.

COLUMN 22

Line 2, "a" should read --an--.
Line 6, "layer" should read --layers--.
Line 36, "depeleted" should read --depleted--.

COLUMN 23

Line 46, "substnatially" should read --substantially--.

COLUMN 25

Line 50, "incontinuity" should read --discontinuity--.
Line 62, "a-Si1-xGex:H" should read --$a\text{-}Si_{1-x}Ge_x:H$--.

COLUMN 26

Line 28, "a" should read --an--.

COLUMN 28

Line 42, "case," should read --case--.
Line 44, "constitution," should read --constitution--.

UNITED STATES PATENT AND TRADEMARK OFFICE
CERTIFICATE OF CORRECTION

PATENT NO. : 5,155,351                                    Page 4 of 7
DATED      : October 13, 1992
INVENTOR(S): MASATO YAMANOBE, ET AL.

It is certified that error appears in the above-identified patent and that said Letters Patent is hereby corrected as shown below:

COLUMN 30

Line 26, "incontinuity" should read --discontinuity--.
Line 28, "interfereing" should read --interfering--.

COLUMN 31

Line 4, "a" should read --an--.

COLUMN 32

Line 37, "a-$Si_{1-x}$Gex:H" should read --a-$Si_{1-x}Ge_x$:H--.
Line 61, "SiH4, GeH4," should read --$SiH_4$, $GeH_4$,--.
Line 62, "CH4, H2" should read --$CH_4$, $H_2$--.

COLUMN 33

Line 19, "a-Si1-xGex-H" should read --a-$Si_{1-x}Ge_x$:H--.
Line 24, "incontinuous" should read --discontinuous--.
Line 27, "incontinuity" should read --discontinuity--.

COLUMN 34

Line 13, "605 EgO." should read --layer 605 EgO.--.

COLUMN 36

Line 40, "incontinuous" should read --discontinuous--.
Line 43, "incontinuity" should read --discontinuity--.

UNITED STATES PATENT AND TRADEMARK OFFICE
CERTIFICATE OF CORRECTION

PATENT NO. : 5,155,351
DATED : October 13, 1992
INVENTOR(S) : MASATO YAMANOBE, ET AL.

It is certified that error appears in the above-identified patent and that said Letters Patent is hereby corrected as shown below:

COLUMN 37

Line 30, "p-type $a\text{-}Si_{1-y}C_y$:H 605 Eg0" should read --p-type $a\text{-}Si_{1-y}C_y$:H layer 605 Eg0--.

COLUMN 39

Line 62, "incontinuous" should read --discontinuous--.
Line 65, "incontinuity" should read --discontinuity--.

COLUMN 40

Line 16, "Eg0" should read --Eg0--.
Line 17, "1.8." should read --1.8 eV.--.
Line 56, "$a\text{-}Si_{1-x}$Gex:H" should read --$a\text{-}Si_{1-x}Ge_x$:H--.
Line 57, "$a\text{-}Si_{1-y}$Cy:H" should read --$a\text{-}Si_{1-y}C_y$:H--.
Line 59, "p-type a-Si:H 605" should read --p-type a-Si:H layer 605--.

COLUMN 41

Line 62, "tan" should read --than--.

COLUMN 42

Line 42, "$a\text{-}Si_{1-x}$Cx:H" should read --$a\text{-}Si_{1-x}C_x$:H--.
Line 66, ".as" should read --was--.

COLUMN 43

Line 21, "incontinuous" should read --discontinuous--.
Line 24, "incontinuity" should read --discontinuity--.

UNITED STATES PATENT AND TRADEMARK OFFICE
CERTIFICATE OF CORRECTION

PATENT NO. : 5,155,351
DATED : October 13, 1992
INVENTOR(S) : MASATO YAMANOBE, ET AL.

It is certified that error appears in the above-identified patent and that said Letters Patent is hereby corrected as shown below:

COLUMN 44

Line 15, "p-type a-Si:H 605" should read
--p-type a-Si:H layer 605--.

COLUMN 45

Line 62, "light absorbing" should read --light-absorbing--.

COLUMN 46

Line 21, "SiH4 and H2" should read --$SiH_4$ and $H_2$--.
Line 49, "multiply" should read --multiplying--.

COLUMN 47

Line 28, "impeding" should be deleted.
Line 32, "light-transmissive" should read
--light-transmissive,--.
Line 35, "multiply" should read --multiplying--.

COLUMN 48

Line 4, "any one of claims 12 to" should read
--claim 15,--.
Line 5, "19," should be deleted.
Line 16, "region;" should read --region; and--.

UNITED STATES PATENT AND TRADEMARK OFFICE
CERTIFICATE OF CORRECTION

PATENT NO. : 5,155,351

DATED : October 13, 1992

INVENTOR(S) : MASATO YAMANOBE, ET AL.

It is certified that error appears in the above-identified patent and that said Letters Patent is hereby corrected as shown below:

<u>COLUMN 48</u>

Line 28, "layers" should read --layer--.
Line 34, "a layer a layer" should read --a layer--.

Signed and Sealed this

Twenty-second Day of March, 1994

*Attest:*

BRUCE LEHMAN

*Attesting Officer*  *Commissioner of Patents and Trademarks*